US012666974B2

(12) United States Patent
Yang et al.

(10) Patent No.: US 12,666,974 B2
(45) Date of Patent: Jun. 23, 2026

(54) SILVER SINTERED MOLYBDENUM (SSM) PACKAGING FOR POWER SEMICONDUCTOR DEVICES

(71) Applicant: McMaster University, Hamilton (CA)

(72) Inventors: Yuhang Yang, Hamilton (CA); Ali Emadi, Burlington (CA)

(73) Assignee: McMaster University, Hamilton (CA)

( * ) Notice: Subject to any disclaimer, the term of this patent is extended or adjusted under 35 U.S.C. 154(b) by 437 days.

(21) Appl. No.: 18/142,357

(22) Filed: May 2, 2023

(65) Prior Publication Data

US 2023/0352372 A1 Nov. 2, 2023

Related U.S. Application Data

(60) Provisional application No. 63/337,357, filed on May 2, 2022.

(51) Int. Cl.
H10W 70/40 (2026.01)
H10W 40/25 (2026.01)
(Continued)

(52) U.S. Cl.
CPC ....... H10W 70/417 (2026.01); H10W 40/258 (2026.01); H10W 70/04 (2026.01);
(Continued)

(58) Field of Classification Search
CPC ....... H01L 21/4821; H01L 2224/29139; H01L 2224/32245; H01L 2224/40245;
(Continued)

(56) References Cited

U.S. PATENT DOCUMENTS 6,396,125 B1 5/2002 Soyano
7,842,545 B2 11/2010 Lee
(Continued)

FOREIGN PATENT DOCUMENTS

CN 207165543 U * 3/2018
CN 111477683 A 4/2020
(Continued)

OTHER PUBLICATIONS

"Reliability Assessment of Sintered Nano-Silver Die Attachment for Power Semiconductors", Matthias Knoerr et al., Fraunhofer Institute for Integrated Systems and Device Technology, May 2, 2022, p. 56-61.
(Continued)

*Primary Examiner* — Telly D Green
(74) *Attorney, Agent, or Firm* — Smart & Biggar LP

(57) ABSTRACT

The present disclosure generally relates to a silver sintered molybdenum (SSM) packaging for power semiconductor devices and a method of manufacturing thereof. The SSM packaging comprises a substrate; a MOSFET die comprising a first side and a second side, wherein the first side is bonded to the substrate using nano silver sintering; and at least two leads connected, at a respective first end, to the substrate and, at a respective second end, to the second side of the MOSFET die, wherein nano silver sintering is used to bond the first and second ends of the at least two leads, and wherein each of the substrate and at least two leads is formed of pure molybdenum.

6 Claims, 56 Drawing Sheets

(51) Int. Cl.

| | | |
|---|---|---|
| *H10W 70/04* | (2026.01) | |
| *H10W 72/00* | (2026.01) | |
| *H10W 72/30* | (2026.01) | |
| *H10W 72/90* | (2026.01) | |
| *H10W 90/00* | (2026.01) | |

(52) U.S. Cl.

CPC .................. *H10W 72/07331* (2026.01); *H10W 72/07631* (2026.01); *H10W 72/352* (2026.01); *H10W 72/886* (2026.01); *H10W 72/952* (2026.01); *H10W 90/736* (2026.01); *H10W 90/766* (2026.01)

(58) Field of Classification Search

CPC . H01L 2224/73263; H01L 2224/83439; H01L 2224/83476; H01L 2224/8384; H01L 2224/8484; H01L 23/3736; H01L 23/49513; H01L 24/29; H01L 24/32; H01L 24/40; H01L 24/73; H01L 24/83; H01L 24/84; H01L 23/145; H01L 23/3735; H01L 23/49866; H01L 24/41

See application file for complete search history.

(56) References Cited

U.S. PATENT DOCUMENTS

| | | | |
|---|---|---|---|
| 9,123,639 B2 | 9/2015 | Kimijima et al. | |
| 9,551,082 B2 | 1/2017 | Shashkov et al. | |
| 10,212,838 B2 | 2/2019 | McPherson et al. | |
| 2007/0257351 A1 | 11/2007 | Lee et al. | |
| 2012/0286292 A1 | 11/2012 | Nakayama et al. | |
| 2014/0312360 A1* | 10/2014 | Otremba | H01L 21/50 257/77 |
| 2014/0353808 A1* | 12/2014 | Hosseini | H01L 23/3107 257/676 |
| 2015/0077941 A1* | 3/2015 | Hosseini | H01L 23/3736 156/60 |
| 2015/0115452 A1* | 4/2015 | Yoon | H01L 24/29 228/256 |
| 2016/0358838 A1* | 12/2016 | Basler | H01L 23/3737 |
| 2022/0108975 A1* | 4/2022 | Manola | H01L 24/32 |
| 2022/0130773 A1* | 4/2022 | Pun | H01L 23/3114 |
| 2023/0215833 A1* | 7/2023 | Namishia | H01L 24/29 257/224 |

FOREIGN PATENT DOCUMENTS

| | | | | |
|---|---|---|---|---|
| JP | 2021114537 A | * | 8/2021 | |
| WO | WO-2015086184 A1 | * | 6/2015 | ............. H01L 24/40 |
| WO | WO-2016125419 A1 | * | 8/2016 | ........ H01L 23/49541 |
| WO | 2019071742 A1 | | 4/2019 | |

OTHER PUBLICATIONS

"High Temperature LTCC based SiC Double-Sided Cooling Power Electronic Module", Hao Zhang, University of Arkansas, Fayetteville, May 2014.

"Die Attach of Power Devices Using Silver Sintering-Bonding Process Optimization and Characterization", Cyril Buttay et al., HiTEN 2011, Jul. 2011, Oxford, United Kingdom, pp. 1-7, hal-00672619.

"Applying Anand model to low-temperature sintered nanoscale silver paste chip attachment", Dun-ji Yu, et al., Materials and Design 30 (2009), 4574-4579.

"Tensile Behaviors and Ratcheting Effects of Partially Sintered Chip-Attachment Films of a Nanoscale Silver Paste", Xu Chen et al., Journal of Electronic Materials, vol. 37, No. 10, 2008, pp. 1574-1579.

"Modeling and Analysis of Silver-Sintered Molybdenum Packaging for SiC Power Modules With Improved Lifetime and Temperature Range", Yuhang Yang et al., IEEE Transactions on Components, Packaging and Manufacturing Technology., vol. 11, No. 12, Dec. 2021, pp. 2102-2113.

"Thermal-Electrical Modeling and Co-Optimization of a Half-Bridge Power Module with Silver-Sintered Molybdenum Packaging", Yuhang Yang et al., IEEE Transactions on Power Electronics, pp. 1-12, published May 30, 2023.

* cited by examiner

300b

300a

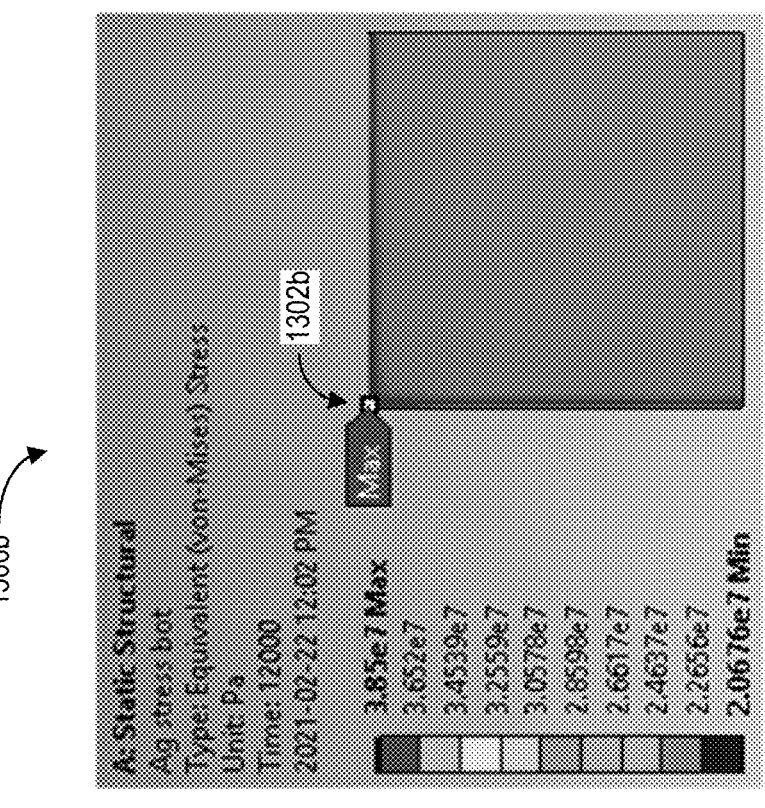
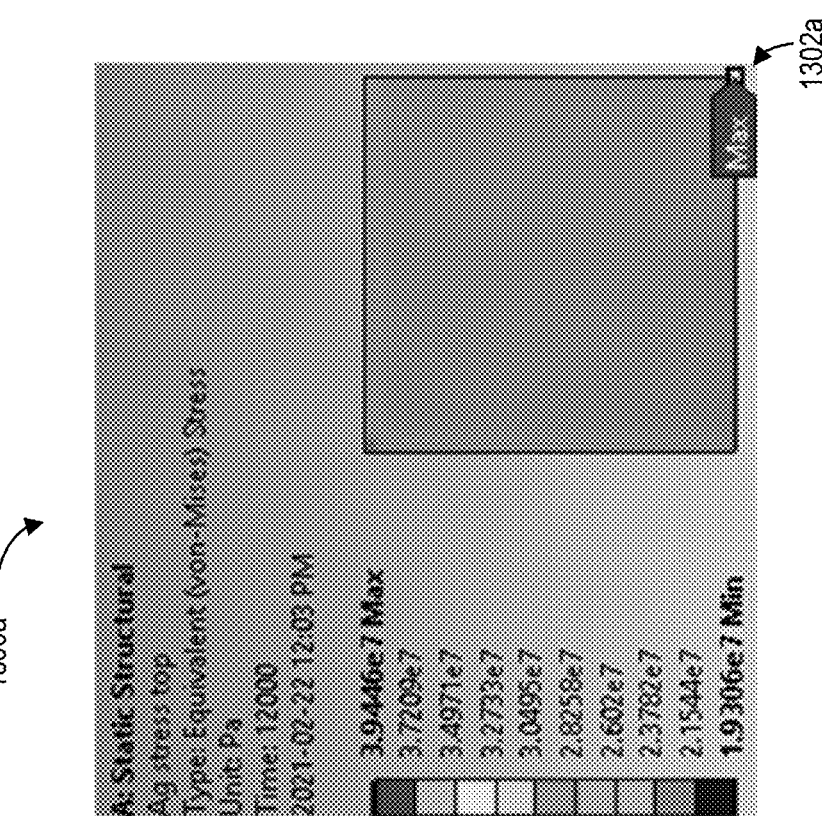
FIG. 13

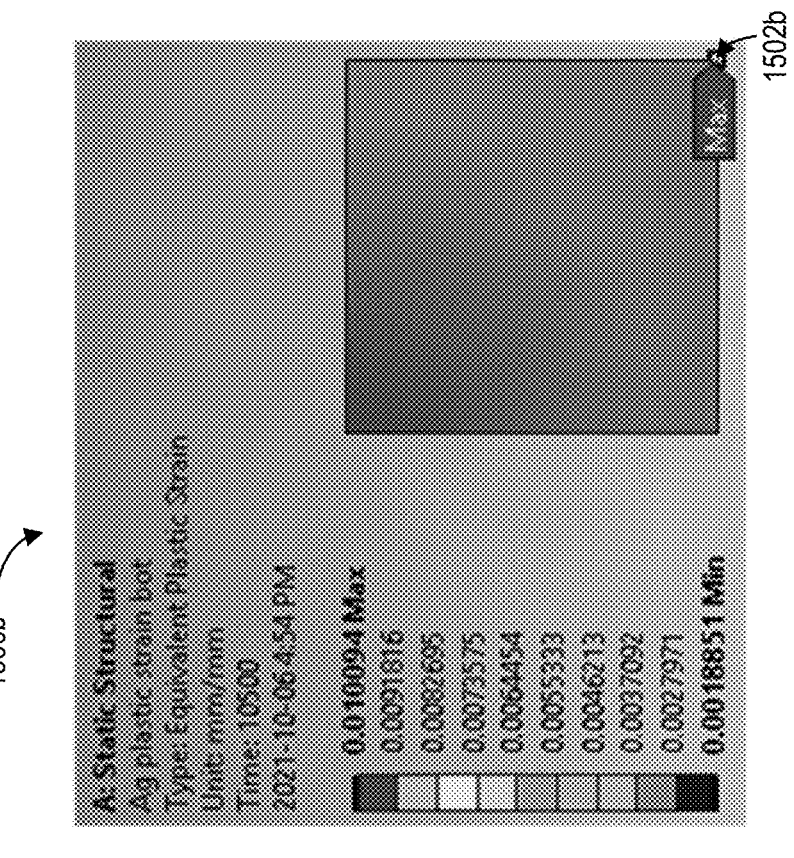
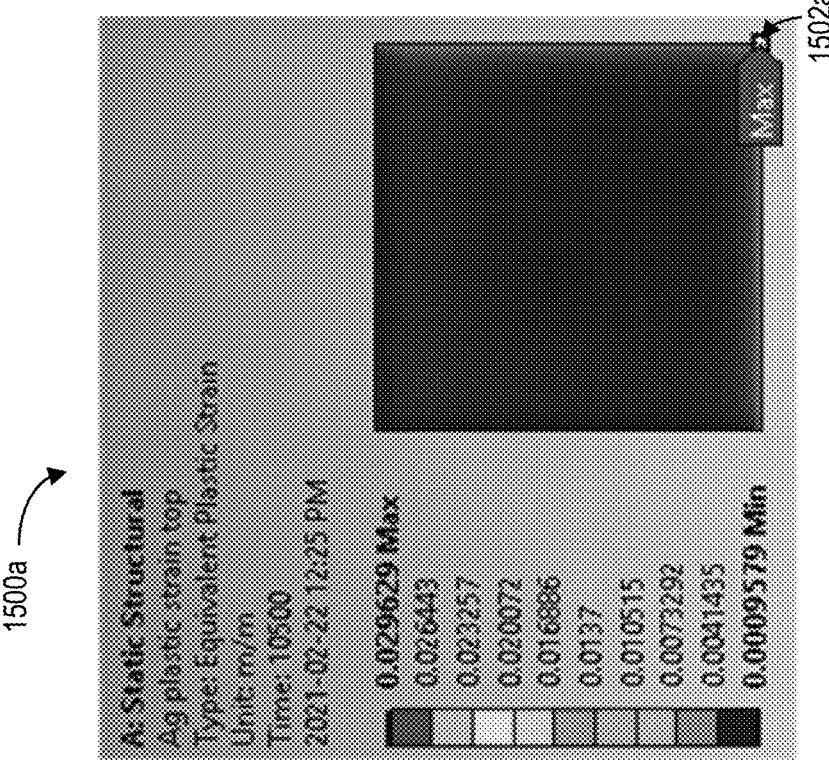
FIG. 15

Figure 18:
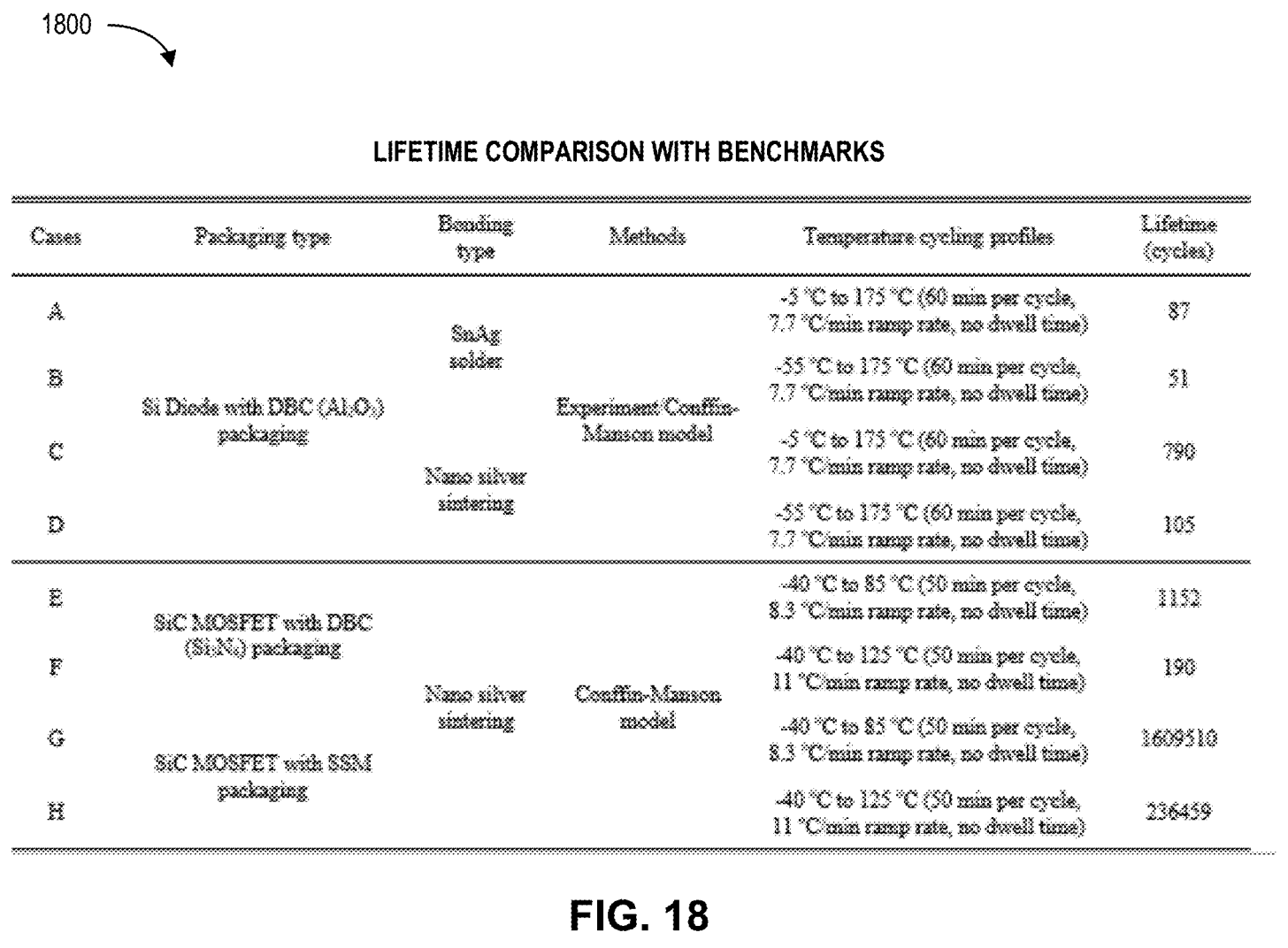

LIFETIME COMPARISON WITH BENCHMARKS

1800

| Cases | Packaging type | Bonding type | Methods | Temperature cycling profiles | Lifetime (cycles) |
|---|---|---|---|---|---|
| A | Si Diode with DBC ($Al_2O_3$) packaging | SnAg solder | Experiment/Coffin-Manson model | -5 °C to 175 °C (60 min per cycle, 7.7 °C/min ramp rate, no dwell time) | 87 |
| B | | | | -55 °C to 175 °C (60 min per cycle, 7.7 °C/min ramp rate, no dwell time) | 51 |
| C | | Nano silver sintering | | -5 °C to 175 °C (60 min per cycle, 7.7 °C/min ramp rate, no dwell time) | 790 |
| D | | | | -55 °C to 175 °C (60 min per cycle, 7.7 °C/min ramp rate, no dwell time) | 105 |
| E | SiC MOSFET with DBC ($Si_3N_4$) packaging | Nano silver sintering | Coffin-Manson model | -40 °C to 85 °C (50 min per cycle, 8.3 °C/min ramp rate, no dwell time) | 1112 |
| F | | | | -40 °C to 125 °C (50 min per cycle, 11 °C/min ramp rate, no dwell time) | 190 |
| G | SiC MOSFET with SSM packaging | | | -40 °C to 85 °C (50 min per cycle, 8.3 °C/min ramp rate, no dwell time) | 1609810 |
| H | | | | -40 °C to 125 °C (50 min per cycle, 11 °C/min ramp rate, no dwell time) | 236459 |

Samples

Fixture

Bottom heating plate

2100a

Mo substrate

SiC die

5mm

15mm

2100b

Unbonded SiC die

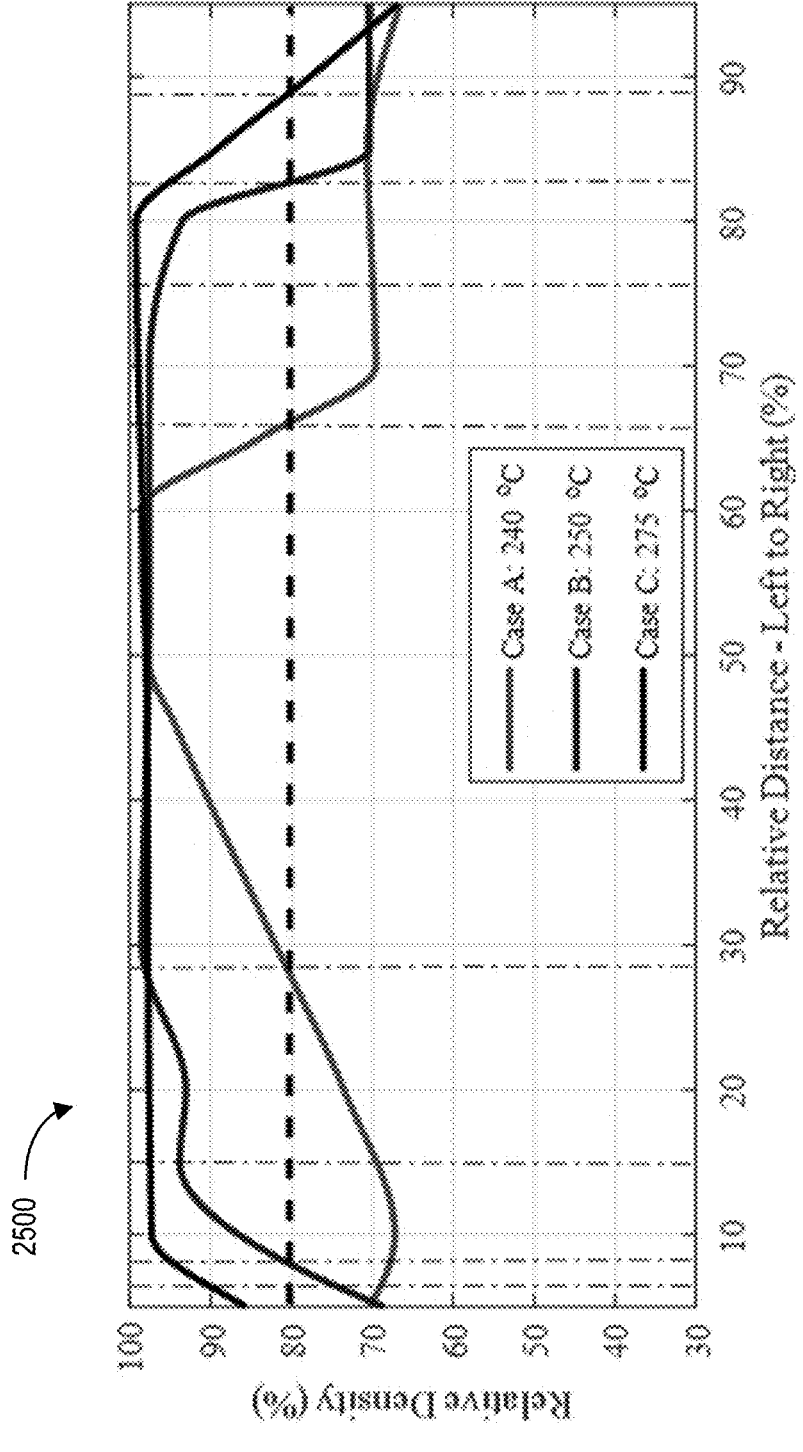
FIG. 25
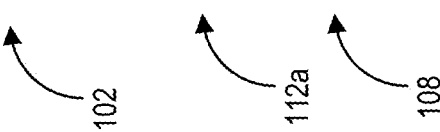

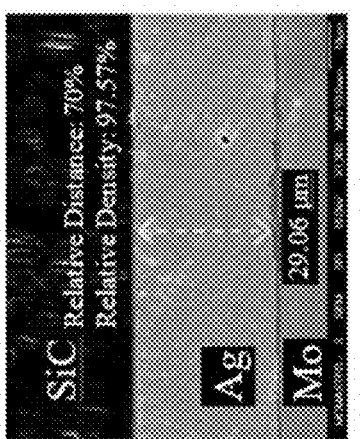
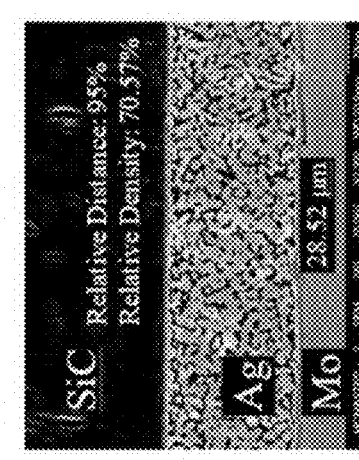
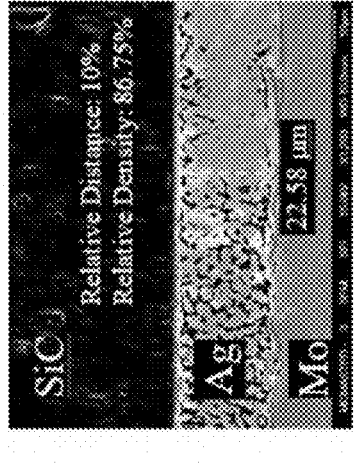
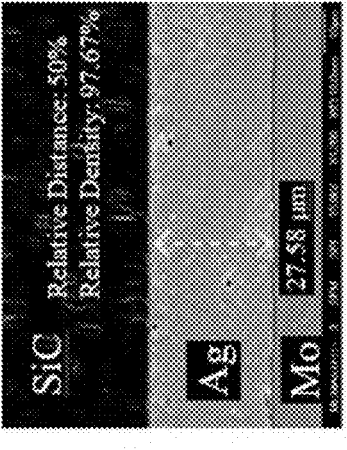
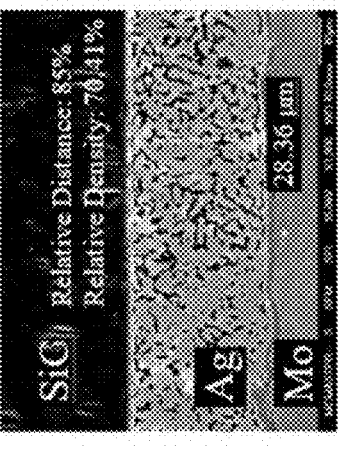
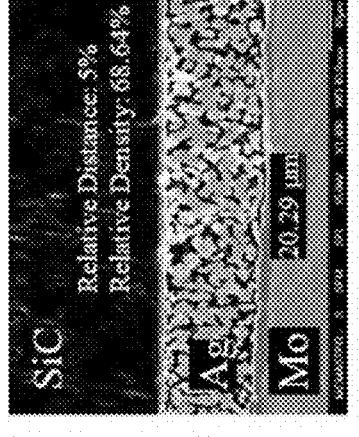
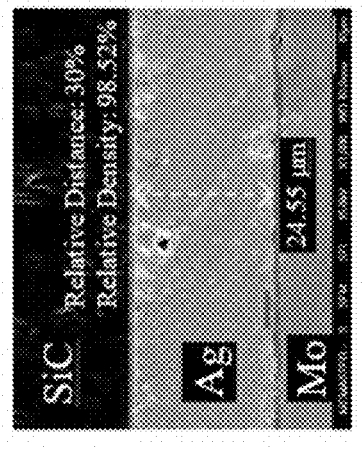
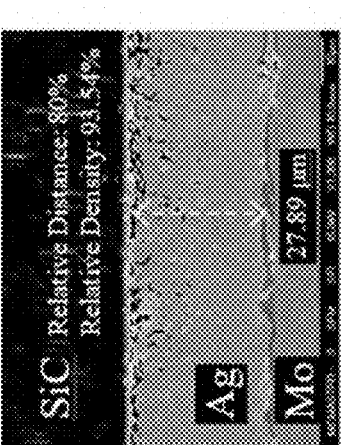
FIG. 27

$$\frac{\partial^2 \theta}{\partial x^2} + \frac{\partial^2 \theta}{\partial y^2} + \frac{\partial^2 \theta}{\partial z^2} = 0 \qquad (1)$$

On top of layer 1:

$$\begin{cases} \frac{\partial \theta}{\partial z}\Big|_{z=0} = -\frac{p}{k_1 l w} & \text{(Inside die areas)} \\ \frac{\partial \theta}{\partial z}\Big|_{z=0} = 0 & \text{(Outside of die areas)} \end{cases} \qquad (2)$$

At interfaces between layers:

$$\begin{cases} k_i \frac{\partial \theta_i}{\partial z}\Big|_{z=z_i} = k_{i+1} \frac{\partial \theta_{i+1}}{\partial z}\Big|_{z=z_i} \\ \theta_i(x, y, z_i) = \theta_{i+1}(x, y, z_i) \end{cases} \qquad (3)$$

At the bottom of layer 3:

$$k_3 \frac{\partial \theta_3}{\partial z}\Big|_{z=z_3} = -h \cdot \theta_3\Big|_{z=z_3} \qquad (4)$$

FIG. 35

$$\theta(x, y, z) = A_{i0} + B_{i0}z + \sum_{m=1}^{\infty} \cos(a_m x) [A_{im} \cosh(a_m z)$$

$$+ B_{im} \sinh(a_m z)]$$

$$+ \sum_{n=1}^{\infty} \cos(b_n y) [A_{in} \cosh(b_n z)$$

$$+ B_{in} \sinh(b_n z)]$$

$$+ \sum_{m=1}^{\infty} \sum_{n=1}^{\infty} \cos(a_m x) \cos(b_n y) [A_{imn} \cosh(c_{mn} z)$$

$$+ B_{imn} \sinh(c_{mn} z)] \qquad (5)$$

FIG. 36

$$B_{10} = -\frac{P}{k_1 LW} \tag{6}$$

$$A_{10} = \frac{P}{LW}\left[\frac{d_1}{k_1} + \frac{d_2}{k_2} + \frac{d_3}{k_3} + \frac{1}{h}\right] \tag{7}$$

$$B_{1m} = \frac{-4P\cos(a_m X_D)\sin(a_m l/2)}{LW l k_1 a_m^2} \tag{8}$$

$$B_{1n} = \frac{-4P\cos(b_n Y_D)\sin(b_n w/2)}{LW l k_1 b_n^2} \tag{9}$$

$$B_{1mn} = \frac{B_{1m} B_{1n} a_m b_n LW k_1}{c_{mn}} \tag{10}$$

$$A_{1m} = -\frac{B_{1m}}{V_{1m}} \tag{11}$$

$$A_{1n} = -\frac{B_{1n}}{V_{1n}} \tag{12}$$

$$A_{1mn} = -\frac{B_{1mn}}{V_{1mn}} \tag{13}$$

FIG. 37

$$V_{1p}(p = m, n, mn) = \frac{\left(\frac{V_{3p}U_{2p} - I_{2p}}{V_{3p}I_{2p} - O_{2p}}\right)U_{1p} - I_{1p}}{\left(\frac{V_{3p}U_{2p} - I_{2p}}{V_{3p}I_{2p} - O_{2p}}\right)I_{1p} - O_{1p}} \quad (14)$$

$$V_{3p} = \frac{\delta \sinh(\delta z_3) + \frac{h\cosh(\delta z_3)}{k_3}}{\delta \cosh(\delta z_3) + \frac{h\sinh(\delta z_3)}{k_3}} \quad (15)$$

$$U_{ip} = \cosh^2\left(\delta \sum_{j=1}^{i} d_j\right) - \frac{k_i}{k_{i+1}}\sinh^2\left(\delta \sum_{j=1}^{i} d_j\right) \quad (16)$$

$$I_{ip} = \sinh\left(\delta \sum_{j=1}^{i} d_j\right)\cosh\left(\delta \sum_{j=1}^{i} d_j\right)\left(1 - \frac{k_i}{k_{i+1}}\right) \quad (17)$$

$$O_{ip} = \sinh^2\left(\delta \sum_{j=1}^{i} d_j\right) - \frac{k_i}{k_{i+1}}\cosh^2\left(\delta \sum_{j=1}^{i} d_j\right) \quad (18)$$

$$T_j = \theta(X_D, Y_D, 0) + \frac{Pd_{Ag}}{lwk_{Ag}} + \frac{Pd_{die}}{lwk_{die}} + T_{coolant} \quad (19)$$

FIG. 38

$$-(h/k_2)A_{20} = B_{20}\left(1 + \frac{h(d_1 + d_2)}{k_2}\right) \qquad (20)$$

$$k_1 B_{10} = k_2 B_{20} \qquad (21)$$

$$A_{10} + B_{10}d_1 = A_{20} + B_{20}d_1 \qquad (22)$$

$$B_{20} = -\frac{P}{k_2 LW} \qquad (23)$$

$$A_{10} = \frac{P}{LW}\left(\frac{d_1}{k_1} + \frac{d_2}{k_2} + \frac{1}{h}\right) \qquad (24)$$

$$V_{1p}(p = n, m, mn) = -\frac{B_{1m}}{A_{1m}} = \frac{V_{2p}U_{1p} - I_{1p}}{V_{2p}I_{1p} - O_{1p}} \qquad (25)$$

$$V_{2p}(p = n, m, mn) = -\frac{B_{2m}}{A_{2m}} = \frac{V_{3p}U_{2p} - I_{2p}}{V_{3p}I_{2p} - O_{2p}} \qquad (26)$$

FIG. 39

$$L_S = L_{4208} + L_{4216} + L_{4214} + L_{4218} + L_{4222} + L_{4224} \quad (27)$$

$$L_w = \frac{\mu_0 l}{8\pi} + \frac{\mu_0}{2\pi}(l \ln \frac{\sqrt{r^2 + l^2} + l}{r} - \sqrt{r^2 + l^2} + r) \quad (28)$$

$$M_{w-ij} = \frac{\mu_0}{2\pi}(l \ln \frac{\sqrt{(d_{ij} + 2r)^2 + l^2} + l}{d_{ij} + 2r}$$
$$- \sqrt{(d_{ij} + 2r)^2 + l^2} + (d_{ij} + 2r)) \quad (29)$$

$$\begin{bmatrix} V \\ \cdots \\ V \end{bmatrix} = jw \begin{bmatrix} L_w & \cdots & M_{w-1n} \\ \cdots & \cdots & \cdots \\ M_{w-n1} & \cdots & L_w \end{bmatrix} \cdot \begin{bmatrix} I_1 \\ \cdots \\ I_n \end{bmatrix} \quad (30)$$

$$\begin{bmatrix} I_1 \\ \cdots \\ I_n \end{bmatrix} = \frac{1}{jw} \begin{bmatrix} L_w & \cdots & M_{w-1n} \\ \cdots & \cdots & \cdots \\ M_{w-n1} & \cdots & L_w \end{bmatrix}^T \cdot \begin{bmatrix} V \\ \cdots \\ V \end{bmatrix} \quad (31)$$

$$I = I_1 + \cdots + I_n = \frac{1}{jw} \times sum(\begin{bmatrix} L_w & \cdots & M_{w-1n} \\ \cdots & \cdots & \cdots \\ M_{w-n1} & \cdots & L_w \end{bmatrix}^T) \times V \quad (32)$$

$$L_s = (sum(\begin{bmatrix} L_w & \cdots & M_{w-1n} \\ \cdots & \cdots & \cdots \\ M_{w-n1} & \cdots & L_w \end{bmatrix}^T))^{-1} \quad (33)$$

FIG. 44

$$Constrians - 1 : max(T_{j1}, T_{j2}) < 200^oC \qquad (34)$$

$$Constrians - 2 : |T_{j1} - T_{j2}| < 5^oC \qquad (35)$$

$$CostFunction : F = po_1 \times \frac{V_e}{V_{e-ref}} + po_2 \times \frac{L_s}{L_{s-ref}} \qquad (36)$$

$$v_i(it + 1) = we \times v_i(it) + c_1 r_1 (x_{ibest}(it) - x_i(it)) \\ + c_2 r_2 (x_{gbest}(it) - x_i(it)) \qquad (37)$$

$$x_i(t + 1) = x_i(t) + v_i(t + 1) \qquad (38)$$

FIG. 48

$$f_o = \frac{1}{2 \times \pi \times \sqrt{C_{oss} \times L_{s-loop}}} \qquad (39)$$

$$R_{th(j-c)} = \frac{T_j - T_b}{P_{die}} \qquad (40)$$

$$T_j = -348.2042 \times V_D + 974.1909 \qquad (41)$$

FIG. 56

SILVER SINTERED MOLYBDENUM (SSM) PACKAGING FOR POWER SEMICONDUCTOR DEVICES

This application claims priority to and the benefit of U.S. Provisional Application Ser. No. 63/337,357, entitled "SILVER SINTERED MOLYBDENUM (SSM) PACKAGING FOR POWER SEMICONDUCTOR DEVICES AND A METHOD OF MANUFACTURING THEREOF", filed May 2, 2022, of which is hereby incorporated by reference in their entirety.

FIELD

The present disclosure generally relates to packaging for power semiconductor devices, and in particular, to a silver sintered molybdenum packaging for power semiconductor devices and a method of manufacturing thereof.

INTRODUCTION

The following is not an admission that anything discussed below is part of the prior art or part of the common general knowledge of a person skilled in the art.

Semiconductor power modules are key components in power electronics systems, and often determine power system cost and performance. In recent years, owing to the mass implementation of power electronics in a wide range of applications (e.g., electrified vehicles and renewable energies), the semiconductor power module industry has seen a corresponding rapid expansion. To this end, it has been recognized that the next generation of power semiconductor devices is desired to have improved reliability, smaller size, higher temperature durability, simpler structure, among other desired requirements. Achieving these goals, in turn, necessitates significant improvements to power module design and fabrication.

SUMMARY

The following introduction is provided to introduce the reader to the more detailed discussion to follow. The introduction is not intended to limit or define any claimed or as yet unclaimed invention. One or more inventions may reside in any combination or sub-combination of the elements or process steps disclosed in any part of this document including its claims and figures.

In one broad aspect, there is provided a packaging module comprising: a substrate; a MOSFET die comprising a first side and a second side, wherein the first side is bonded to the substrate using nano silver sintering; and at least two leads connected, at a respective first end, to the substrate and, at a respective second end, to the second side of the MOSFET die, wherein nano silver sintering is used to bond the first and second ends of the at least two leads, and wherein each of the substrate and at least two leads is formed of pure molybdenum.

In at least some embodiments, the MOSFET die comprises a silicon carbide (SiC) die.

In at least some embodiments, the packaging module further comprises a heat sink stacked below the substrate, and the heat sink is also formed of pure molybdenum.

In at least some embodiments, the packaging module further comprises an insulator layer stacked between the heat sink and the substrate.

In at least some embodiments, the insulator layer is formed of bismaleimide triazine resin.

In at least some embodiments, the substrate includes a first substrate side and a second substrate side, and the first substrate side is coated with ruthenium (Ru)/silver (Ag).

In another broad aspect, there is provided a method for assembling a packaging module, comprising: coating a first side of a substrate with ruthenium (Ru)/silver (Ag) to produce a coated surface; sintering nano silver paste over the coated surface of the substrate; bonding a first end of at least two leads, and a first side of a MOSFET die, to the coated surface, via the nano silver paste; sintering nano silver paste over a second side of the MOSFET die; and bonding a second end of the at least two leads, to the second side of the MOSFET die, via the nano silver paste.

In at least some embodiments, sintering the nano silver paste comprises: pre-heating the nano silver paste which is applied to a packaging sample; increasing the temperature to achieve sintering and densification; and free cooling the packaging sample.

In at least some embodiments, at the sintering stage, pressure is applied to packaging sample.

In at least some embodiments, the applied pressure is approximately 5 to 20 Mpa.

In at least some embodiments, the applied pressure is approximately 10 Mpa.

In at least some embodiments, the pre-heating involves pre-heating the packaging sample at 50° C., and then at 125° C.

In at least some embodiments, at the sintering stage, the temperature is increased to range of 250° C.-280° C.

In at least some embodiments, the temperature is increased to approximately 275° C.

In at least some embodiments, the packaging sample is free-cooled to room temperature.

In one aspect, a method of sintering MOSFET dies on Mo substrates is provided herein. The method can comprise the steps of: applying a silver paste to a surface of the Mo substrate; pre-heating the silver paste and Mo substrate to evaporate organic constituents present in the silver paste; increasing the temperature of the Mo substrate and silver paste to perform sintering and achieve densification; and free cooling the Mo substrate and sintered silver paste to room temperature. In one embodiment, the sintering is achieved without applying external pressure.

In one embodiment, the silver paste comprises nanoscale silver particles. In one embodiment, the pre-heating step is conducted at 50° C.; and wherein the temperature is increased in a range of 250° C. to 280° C., and over a time span of 7 to 15 minutes. In one embodiment, the Mo substrate is coated with ruthenium (Ru)/silver (Ag) to produce a coated substrate.

In another aspect, a method of constructing a half-bridge module comprising at least two MOSFET dies forming a half-bridge circuit is provided herein. In this aspect, the method may comprise: depositing an SiO2 layer on the top of the at least two dies; fabricating openings on areas above gate and source pads located on the MOSFET dies; metalizing Ni/Au pads on the openings; bonding segments of a substrate layer to a heatsink layer through vacuum curing of a resin layer; and sintering the at least two dies to the substrate by nano-silver sintering. In one embodiment, the sintering is achieved without applying external pressure.

Other features and advantages of the present application will become apparent from the following detailed description. It should be understood, however, that the detailed description and the specific examples, while indicating embodiments of the application, are given by way of illustration only and the scope of the claims should not be limited by these embodiments, but should be given the broadest interpretation consistent with the description as a whole.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which:

FIG. 13 are images showing stress profiles for top and bottom silver layers in an example packaging module;

FIG. 15 are images showing strain profiles for top and bottom silver layers for an example SSM packaging module;

FIG. 18 is a table showing lifetime comparison of an example SSM packaging module with a DBC module;

FIG. 25 provides a chart of the relative densities of cases A, B and C from table 5.

FIG. 27 shows SEM microstructures of the bond-line at different relative distances;

FIG. 35 provides equations that can be used for modelling the half-bridge module;

FIG. 36 provides equations that can be used for modelling the half-bridge module;

FIG. 37 provides equations that can be used for modelling the half-bridge module;

FIG. 38 provides equations that can be used for modelling the half-bridge module;

FIG. 39 provides equations that can be used for modelling the half-bridge module;

FIG. 44 provides equations that can be used for modelling the half-bridge module;

FIG. 48 provides equations that can be used for modelling the half-bridge module;

FIG. 56 provides equations that can be used for modelling the half-bridge module.

Figure 1:
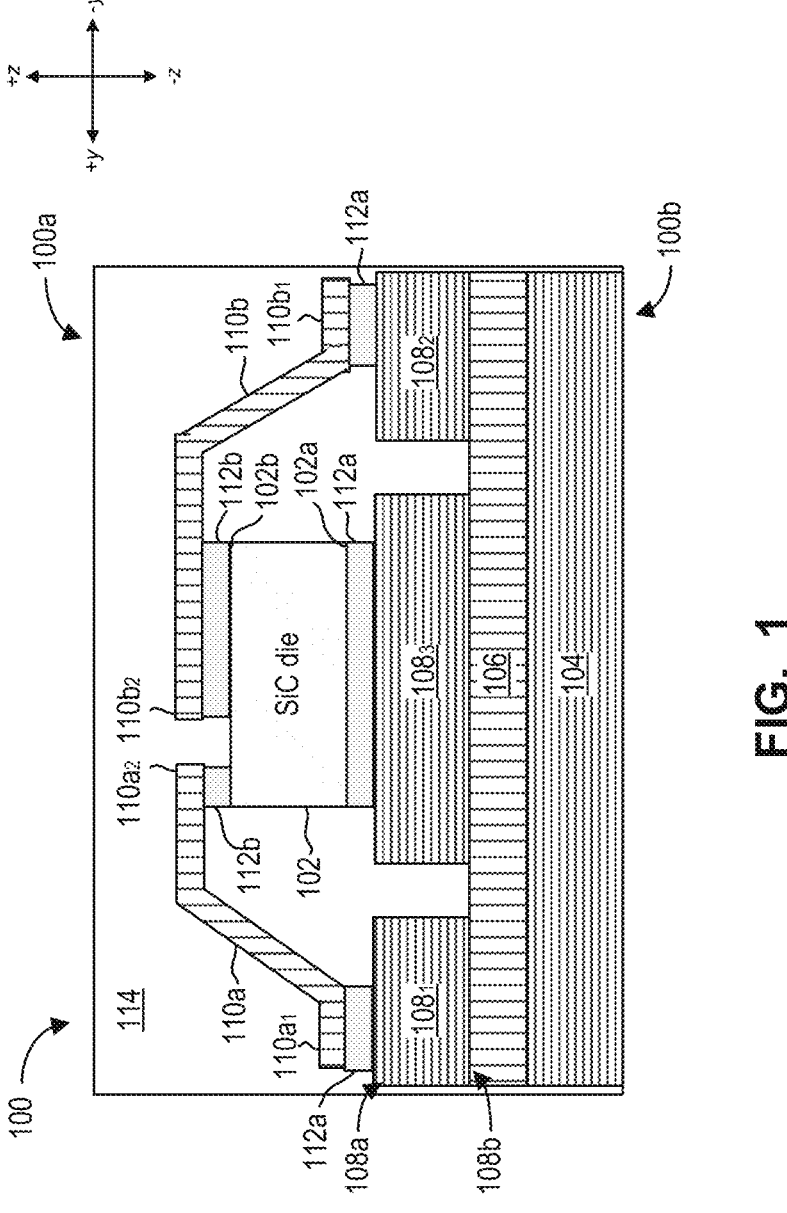
FIG. 1 illustrates an example layer stack-up for an example packaging module.

Further aspects and features of the example embodiments described herein will appear from the following description taken together with the accompanying drawings.

DETAILED DESCRIPTION

Numerous embodiments are described in this application, and are presented for illustrative purposes only. The described embodiments are not intended to be limiting in any sense. The invention is widely applicable to numerous embodiments, as is readily apparent from the disclosure herein. Those skilled in the art will recognize that the present invention may be practiced with modification and alteration without departing from the teachings disclosed herein. Although particular features of the present invention may be described with reference to one or more particular embodiments or figures, it should be understood that such features are not limited to usage in the one or more particular embodiments or figures with reference to which they are described.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more parts are said to be "coupled", "connected", "attached", "joined", "affixed", or "fastened" where the parts are joined or operate together either directly or indirectly (i.e., through one or more intermediate parts), so long as a link occurs. As used herein and in the claims, two or more parts are said to be "directly coupled", "directly connected", "directly attached", "directly joined", "directly affixed", or "directly fastened" where the parts are connected in physical contact with each other. As used herein, two or more parts are said to be "rigidly coupled", "rigidly connected", "rigidly attached", "rigidly joined", "rigidly affixed", or "rigidly fastened" where the parts are coupled so as to move as one while maintaining a constant orientation relative to each other. None of the terms "coupled", "connected", "attached", "joined", "affixed", and "fastened" distinguish the manner in which two or more parts are joined together.

Further, although method steps may be described (in the disclosure and/or in the claims) in a sequential order, such methods may be configured to work in alternate orders. In other words, any sequence or order of steps that may be described does not necessarily indicate a requirement that the steps be performed in that order. The steps of methods described herein may be performed in any order that is practical. Further, some steps may be performed simultaneously.

As used herein and in the claims, a group of elements are said to 'collectively' perform an act where that act is performed by any one of the elements in the group, or performed cooperatively by two or more (or all) elements in the group.

As used herein and in the claims, a first element is said to be "received" in a second element where at least a portion of the first element is received in the second element unless specifically stated otherwise.

Some elements herein may be identified by a part number, which is composed of a base number followed by an alphabetical or subscript-numerical suffix (e.g. 112*a*, or $112_1$). Multiple elements herein may be identified by part numbers that share a base number in common and that differ by their suffixes (e.g. $112_1$, $112_2$, and $112_3$). All elements with a common base number may be referred to collectively or generically using the base number without a suffix (e.g. 112).

Conventional packaging technology for semi-conductors is based on direct-bonded-copper (DBC) substrates and bond-wires. This technology is applied in most existing packaging modules, and is the most prevalent option in the current market.

Traditional DBC-based packaging, however, suffers from a number of important drawbacks related to growing performance requirements. More particularly, large variations in the coefficient of thermal expansion (CTE) inside the packaging, as between the semiconductor, copper, and ceramic material, causes significant thermal stress at high temperatures. In turn, this limits the maximum operating temperature and lifetime of these packaging modules. Additionally, bond-wires used in DBC packaging introduce larger stray inductance to the electronic circuit. This stray inductance can lead to a voltage spike, which limits the operating voltage of the module. DBC substrates are also relatively expensive to manufacture.

Over the years, there has been an increased perception that wide bandgap (WBG) semiconductors devices are the future of power electronics. Silicon carbide (SiC) MOSFETs (metal-oxide-semiconductor field-effect transistors) are an example of typical WBG devices which are suitable for the next generation of traction applications. This is in large-part due to their superior dielectric breakdown field intensity and temperature range.

However, the application of SiC MOSFETs, introduces difficulties to the packaging design. For example, compared to conventional silicon (Si) based IGBTs and diodes—SiC MOSFETs of the same rating can be three times smaller in size. In turn, this increases concerns of temperature and stress concentration. SiC MOSFETs can also handle high temperatures over 200° C., while conventional DBC-based packaging can barely match this range due to thermal stress concerns caused by using conventional DBC substrates. Additionally, SiC devices are more sensitive to stray inductance due to their faster switching speed. Accordingly, bond-wires may not be suitable, and need to be replaced by low-inductance interconnections, e.g., planar leads.

In view of the foregoing, there is a desire for novel packaging technologies that accommodate the higher temperature range of SiC devices, and improve the thermal-mechanical reliability of the associated packaging.

Embodiments herein provide for a novel silver-sintered molybdenum (SSM) packaging concept, which can be used for SiC power modules. As provided herein, the proposed SSM packaging is believed to significantly improve the power module's lifetime and increase maximum operating temperature.

In more detail, the disclosed packaging module uses CTE (coefficient of thermal expansion) matched material, including pure molybdenum (Mo) and bismaleimide triazine (BT) resin. The SiC MOSFET die is attached to a Mo substrate using nano-silver sintering technology, which has improved strength compared with regular soldering technologies. Further, interconnections are achieved by low-inductance planar leads using Mo.

As further explained herein, the selection of pure Mo for the packaging metal layers was based on steady-state thermal-mechanical FEA (finite element analysis) simulations. In particular, these simulations analyzed different molybdenum-copper (Mo—Cu) alloys with different copper ratios, and confirmed that pure Mo resulted in the lowest thermal stress due to its low CTE, and is therefore a suitable material for the packaging metal layers. The simulations also preliminarily verified the advantage of the proposed SSM module against the conventional DBC based module. Compared with the conventional DBC modules, the steady-state thermal-mechanical simulations validated that the proposed SSM module has approximately 53% less total stress and 62% less stress at the bonding layers.

A Coffin-Manson model, using transient temperature cycling FEA, was also applied to perform lifetime and temperature range analysis. Compared with the conventional DBC module, the disclosed SSM module exhibited over 1000× longer lifetime under various temperature cycling conditions. On the other hand, the proposed module achieved 300° C. $T_{max}$ while maintaining the same lifetime expectation as the DBC module with 85° C. $T_{max}$. As used herein, $T_{max}$ refers to the maximum junction temperature of the SiC die during temperature cycling.

Finally, the manufacturability of the proposed SSM packaging was evaluated, which included evaluating the key process of sintering SiC dies on the Mo substrates. A feasible sintering profile is disclosed, and SEM imaging shows that a high-quality bonding is achieved on a Ru/Ag coated Mo substrates. The manufacturing process is believed to be simpler and cheaper due to the reduction of layers and the elimination of the DBC substrate.

I. Example of Silver-Sintered Molybdenum (SSM) Packaging Module

Reference is now made to FIG. 1, which illustrates an example layer stack-up for an example SSM packaging module 100. As provided herein, packaging 100 uses CTE-matched materials to achieve improved lifetime performance, and to simplify the manufacturing process.

As shown, packaging 100 encapsulates a silicon carbide (SiC) MOSFET 102. In other cases, however, the packaging 100 can be used to encapsulate any other type of MOSFET die 102.

The packaging 100 extends between a first packaging end 100a and a second packaging end 100b. In an upright position, the first packaging end 100a is disposed on top of (i.e., over) the second packaging end 100b (i.e., along a z-axis). However, it will be understood that the packaging 100 is not limited to any particular orientational disposition.

As further shown, packaging 100 includes a base heatsink layer 104 and an insulator layer 106 stacked over (and in direct contact with) the heatsink layer 104. A substrate layer 108 is further stacked over (and in direct contact with) the insulator layer 106. To this end, the insulator 106 achieves insulation between the heatsink 104 and the substrate 108. This allows use of the packaging module 100 in high voltage applications, as well as design of large scale modules.

Substrate layer 108 generally extends between a first substrate end 108a and a second substrate end 108b. In the upright position, the first end 108a is disposed over the second end 108b. The second substrate end 108b is stacked over the insulator 106. Substrate layer 108 further includes a first and second substrate layer portion $108_1$ (e.g., a gate substrate portion), $108_2$ (e.g., a source substrate portion), and a central substrate layer portion $108_3$ (e.g., a drain substrate portion).

Two leads 110a, 110b are attached between the SiC 102 and the substrate layer portions $108_1$, $108_2$ and form electrical connections. The leads 110a, 110b can include a gate lead 110a and a source lead 110b. For example, gate lead 110a may be attached at a first end $110a_1$ to the gate substrate portion $108_1$ and source lead 110b can be attached at a first end $110b_1$ to the source substrate portion $108_2$. The second end of each lead $110a_2$, $110b_2$ can be attached to the SiC die 102. In at least one example, the leads 110a, 110b are designed to be low-inductance planar leads. The leads typically have lower inductance compared, e.g., with bond-wires, because the bond-wires are geometrically wider. For a conductor with same length and thickness, normally a larger width will reduce the inductance. In some example cases, thin planar leads are used, e.g., having a thickness along the z-axis of 0.1 millimeters to 0.3 millimeters.

Nano silver sintering bonds 112a-112b are used to couple the substrate 108, MOSFET die 102 and leads 110. As shown, the SiC die 102 is directly bonded, at a first (bottom) end 102a, to the substrate 108 (i.e., $108_3$) via the nano-silver sintering bonds 112a. The same bonding layer 112a is used to couple the first ends of the leads $110a_1$, $110b_2$ to the respective substrate portions $108_1$, $108_2$. A second nano-silver sintering bonding layer 112b is used to couple an opposed second (top) end 102b of the SiC die 102 to the second ends $110a_2$, $110b_2$ of each lead 110a, 110b. The first and seconds ends 102a, 102b of the SiC die 102 are defined along a vertical z-axis, although as noted above, the packaging 100 is not limited to any particular orientational disposition.

In some example cases, the packaging module 100 is further encapsulated in silicone gel 114. Silicon gel 114 may protect the module against the environment. In particular, silicone gel 114 is a soft material whose modulus is $10^5$ to $10^6$ times smaller than other materials.

In the packaging module 100, a metallic substrate 108 is used which has a CTE close to that of SiC. In some example cases, the same metallic material is used for all metal layers, including the substrate 108, heatsink 104 and the lead interconnections 110a, 110b. This ensures that packaging module, as a whole, is CTE matched to the SiC die 102.

The insulator 106 may also be formed of a resin bonding layer which has a similar CTE to other materials in the packaging module 100. Accordingly, the major constituents in the module have a small variation in CTE.

More particularly, it has been appreciated that material selection for the metallic substrate is important for the packaging module 100 to exhibit desired thermal-mechanical benefits. The CTE matched metal has the greatest impact on the module's structural performance since it is used in all metal layers (e.g., the substrate 108, the heatsink 104, and leads 110) and occupies the majority of the volume of the packaging module 100. The matched metal is also directly contacted with the weakest points, i.e., the bonding layers.

In the disclosed embodiments, the metal material is selected as pure Mo. As provided herein, pure Mo may refer to a material with greater than 99% Mo composition, and in some example cases, greater than 99.5% Mo composition. As provided herein, the selection of Mo is based on steady-state thermal-mechanical FEA (finite element analysis) simulations which confirm that pure Mo results in the lowest thermal stress due to its low CTE. Further, in at least some example cases, Mo is selected uniformly for all metal layers (e.g., heat sink 104, substrate 108 and thin leads 110) to optimize performance across the entire packaging. That is, the use of Mo for all metal layers in the packaging module 100 maximizes the advantage of Mo's low thermal expansion coefficient to improve packaging reliability.

To this end, Table 1 (below) shows several metallic materials which are suitable candidates for power electronics thermal management and packaging. These metallic material typically have a much smaller CTE than copper and aluminum. In Table 1, γ denotes the electrical conductivity, and k represents the thermal conductivity of each material.

As shown, pure Mo and Mo—Cu materials demonstrate low CTE, good thermal conductivity, and relatively low mass density. In contrast, other materials have unbalanced properties. For example, Kovar alloy has low CTE and mass density, but its thermal conductivity is too low compared with other materials. Tungsten (W) and W—Cu alloys have slightly higher thermal conductivity than pure Mo and Mo—Cu alloys, however, they have higher CTE and doubled mass density. In addition, the W material series are extremely hard to be manufactured.

TABLE 1

| | | | | |
|---|---|---|---|---|
| Metallic Materials For Power Electronics Packaging and Thermal Management | | | | |
| Material | Density (g/cm³) | γ (% IACS) | k (W/m-K) | CTE (1 × 10⁻⁶/K) |
| SiC | 3.1 | — | 120 | 4.0 |
| Pure Mo | 10.2 | 0.32 | 140 | 5.3 |
| Mo—Cu Alloy (15%-60% Cu) | 9.4-10 | 0.37-0.65 | 170-290 | 6.8-11.5 |
| Pure W | 19.27 | 0.31 | 170 | 4.6 |
| W—Cu Alloy (10%-50% Cu) | 11.7-16.75 | 0.27-0.56 | >170 | 7.4-13 |
| Kovar Alloy | 8.3 | — | 17 | 5.9 |

Figure 2B:
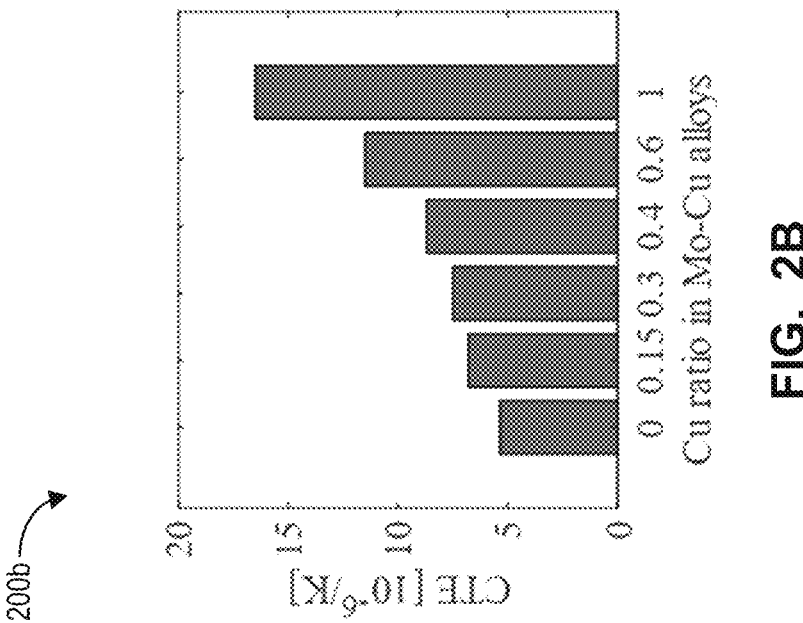
FIG. 2B is a plot illustrating the mechanical properties of pure Mo and Mo—Cu alloys.
Figure 2A:
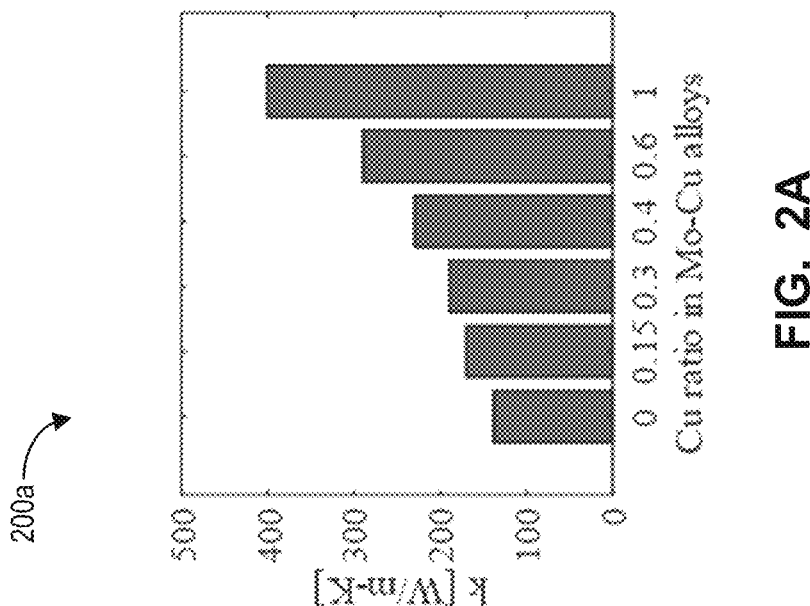
FIG. 2A is a plot illustrating the thermal conductivity properties of pure molybdenum (Mo) and molybdenum-copper (Mo—Cu) alloys.

FIGS. 2A and 2B show plots illustrating the thermal conductivity properties of pure Mo and Mo—Cu alloys (plot 200a), as well as the mechanical properties of pure Mo and Mo—Cu alloys (plot 200b).

As shown in plot 200a, alloys with a higher Cu ratio have a higher thermal conductivity (k) which tends to reduce the thermal resistance and junction temperature. However, as shown in plot 200b, this also leads to a larger CTE, which might induce greater thermal stress. Accordingly, simulations are used herein to better select materials with a balance of high thermal conductivity, and low CTE, and therefore determine the ratio of Cu with the optimal thermal-mechanical performance.

As provided above, the metallic substrates are bonded to the heatsink 104 using a CTE matched resin 106, which also provides electrical insulation. The inclusion of the insulator 106 allows for application of the packaging module in high voltage applications (e.g., 1.2 kilovolts (kV) or greater) and in large scale applications.

In at least one example, a BT resin prepreg (HL832NSF) from Mitsubishi® Gas Chemical is selected. This material has a close CTE ($5\times10^{-6\circ}$ C.) in the x- and y-directions compared to that of SiC die 102, and the candidate metallic materials suitable for high-temperature applications. Further, this resin's material glass transition temperature is around 270° C., which is 1.5 to 2 times higher than common epoxy or polyimide materials applied in PCBs (printed circuit boards) and power modules.

The use of nano-silver paste to sinter the SiC die 102 to the substrate 108 also has appreciated advantages. For example, this bonding method has been previously shown to be suitable for high temperature applications due to its high melting temperature of approximately 961° C. Nano-silver paste material also has approximately 3× higher thermal conductivity and 5× higher electrical conductivity than common SnAg (tin silver) based solder. It is also understood that nano-silver sintering joints have a much better reliability than conventional solders.

II. Selection of Pure Molybdenum (Mo) in SSM Based on Steady-State Thermal-Mechanical Simulations The following section discusses thermal-mechanical simulations conducted to validate the selection of pure molybdenum (Mo) for use in the proposed packaging's metal layers (e.g., the substrate 108, the heatsink 104, and leads 110).

A major concern in designing power module packaging is thermal strain and stress due to high temperatures, which is critical to the lifetime of the power module. As provided herein, steady-state thermal-mechanical simulations were used to investigate how the ratio of copper (Cu) in molybdenum-copper (Mo—Cu) alloys affects the thermal-mechanical performance of a packaging module. These simulation results illustrate that pure molybdenum (Mo) provides desired improved thermal-mechanical properties, and confirms that the material is best suited for the disclosed SSM packaging module. The simulations are carried out using steady-state thermal mechanical finite element analysis (FEA).

In more detail, the process of heat transfer in a power module often begins with the heat generated at the semiconductor die 102. The heat is transferred from the semiconductor die 102 to the heatsink 104 by conduction through solid layers (e.g., the substrate 108 and heatsink 106). Finally, heat is dissipated at the bottom of the heatsink 104 by convection to the ambient air or coolant.

Equations (1)-(5) express the heat transfer process. The heat generated at the top of the semiconductor die 102 (i.e., surface 102b) is expressed by Equation (1):

$$\left.\frac{\partial T}{\partial z}\right|_{z=0} = -\frac{Q}{k_{die}A} \qquad (1)$$

Conduction of heat within each solid layer 106, 108 is expressed by Equation (2):

$$\frac{\partial^2 T}{\partial x^2} + \frac{\partial^2 T}{\partial y^2} + \frac{\partial^2 T}{\partial z^2} = 0 \qquad (2)$$

Conduction at the contact between the $i_{th}$ to the $(i+1)_{th}$ solid layers is expressed by Equations (3) and (4):

$$\left.k_i\frac{\partial T_i}{\partial z}\right|_{z=z_i} = -k_{i+1}\left.\frac{\partial T_{i+1}}{\partial z}\right|_{z=z_i} \qquad (3)$$

$$T_i(x, y, z_i) = T_{i+1}(x, y, z_i) \qquad (4)$$

Convection at the bottom of the heatsink 104 is expressed by the Equation (5):

$$\left.k_{heatsink}\frac{\partial T_{heatsink}}{\partial z}\right|_{z=z_{heatsink}} = -h(T_{heatsink} - T_{coolant}) \qquad (5)$$

In Equations (1)-(5), T denotes the temperature, $T_i$ is the temperature of the $i_{th}$ layer at the contact point, $z_i$ denotes the distance from the bottom of the $i_{th}$ layer to the top of the die, Q expresses the heat, A is the surface area of the die, $k_i$ is the thermal conductivity of the $i_{th}$ layer, and h denotes the convection coefficient of the convection cooling.

As noted above, a major concern in designing power module packaging is thermal strain and stress due to high temperatures, which is critical to the lifetime of the power module. More particularly, when a material is subject to thermal expansion, the material's actual strain ($\varepsilon_a$) is expressed as the difference between the material's unconstrained thermal strain ($\varepsilon_{uc}$) and the material's constrained strain ($\varepsilon_c$), as expressed through Equations (6)-(9). The constrained strain ($\varepsilon_c$) causing stress is expressed by Equation (8) for elastic materials. Derived from the above, the stress caused by material "A" to another contacted material "B" by thermal expansion is expressed through Equation (9).

$$\varepsilon_a = \varepsilon_{uc} - \varepsilon_c = \frac{L_T - L_{ref}}{L_{ref}} \qquad (6)$$

$$\varepsilon_{uc} = \alpha(T - T_{ref}) \qquad (7)$$

$$\sigma = E\cdot\varepsilon_c \qquad (8)$$

$$\sigma_B = \frac{E_B\cdot E_B\cdot\Delta CTE\cdot\Delta T}{E_B + E_A} \qquad (9)$$

wherein E expresses the elastic modulus of the materials, $T_{ref}$ expresses the stress-free reference temperature (i.e., typically the room temperature), and $L_{ref}$ is the length of the material at the reference temperature.

It has been recognized that reducing the coefficient of thermal expansion (CTE) mismatch between materials helps reduce thermal stress. However, this is complicated by the fact that among the pure Mo and Mo—Cu alloys, the material with a closer CTE to an SiC die also has a lower k value (i.e., thermal conductivity) which, leads to a higher temperature (see e.g., FIGS. 2A and 2B). Thus, there is an appreciated trade-off made in material selection to achieve closer CTE to the SiC die while providing a higher k value.

To determine the optimal material selection for the packaging module—a steady state FEA simulation was conducted using ANSYS® Mechanical® software. As provided, the simulation confirms that optimality of selecting Mo material in the packaging module.

The conducted simulation assumes parameters for a proposed packaging module as expressed in Table 2, which provides material matrix and dimensions of various simulated layers. For comparative purposes, Table 2 also provides assumed parameters for a conventional DBC module, which acts as a benchmark to compare performance to the proposed Mo-based module.

TABLE 2

| Example Layer Configuration for Mo packaging module and DBC module | | | |
|---|---|---|---|
| Proposed Mo-based module | | Conventional DBC based module | |
| Layers | Dimensions (mm) | Layers | Dimensions (mm) |
| Top lead (Mo/Mo—Cu) | 5 × 5 × 0.1 | Al bond-wires | d = 0.38 |
| Nano-silver paste | 5 × 5 × 0.05 | SiC die | 5 × 5 × 0.18 |
| SiC die | 5 × 5 × 0.18 | Nano-silver paste | 5 × 5 × 0.18 |
| Nano-silver paste | 5 × 5 × 0.05 | DBC copper top | 15 × 15 × 0.2 |
| Metal Substrate (Mo/Mo—Cu) | 15 × 15 × 2 | DBC ceramic (Si₃N₄) | 15 × 15 × 0.32 |
| Resin bonding | 15 × 15 × 0.2 | DBC copper bottom | 15 × 15 × 0.2 |
| Heatsink (Mo/Mo—Cu) | 15 × 15 × 3 | DBC solder (SnAg solder) | 15 × 15 × 0.25 |
| | | Baseplate (copper) | 15 × 15 × 2 |
| | | TIM | 15 × 15 × 0.16 |
| | | Heatsink (copper) | '15 × 15 × 3 |

Figures 3A, 3B:
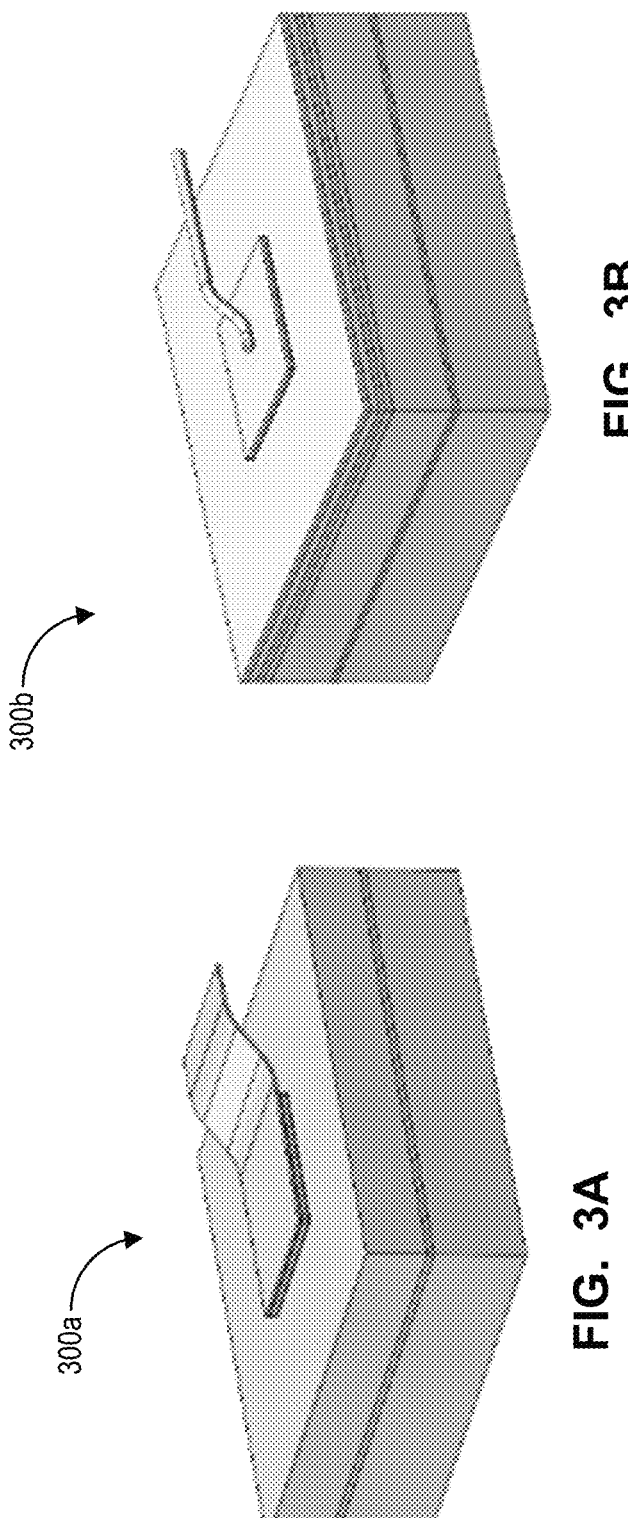
FIG. 3A is an illustration of an example packaging module, in accordance with the teachings herein.
FIG. 3B is an illustration of an example packaging direct-bond-copper (DBC) module.

For simplification, in the conducted simulation, the circuit tracing on the substrate and complex interconnections were avoided in the single-die modules. An SiC MOSFET die in the size of 5 mm×5 mm×0.18 mm was used for both simulated modules. FIG. 3A shows an example illustration of the proposed simulated Mo module 300a, while FIG. 3B shows an example illustration of the conventional simulated DBC module 300b.

The simulations were subject to several assumptions: (a) first, the proposed packaging module was considered to be symmetric. Accordingly, only a quarter section model of the module was applied in the FEA model; (b) the silicone gel layer 114 was ignored (FIG. 1); (c) the heat generation in the SiC die 102 was assumed to be volumetrically uniform; (d) except for the bottom of the heatsink 104, other surfaces were adiabatic; (e) for the benchmark DBC module, the bottom of the baseplate was fixed in the z-direction. Thus, the thermal grease and the heatsink had no impact on mechanical performance; and (f) for the proposed module, the bottom of the heatsink was fixed in the z-direction.

A number of boundary conditions were also set for simulation purposes. The boundary conditions included: (i) setting heat losses equivalent to 33 W on the dies; (ii) setting the cooling boundary as a convection of 5000 W/m-K at the bottom of the heatsink 104 with a coolant temperature of 25° C.; and (iii) assigning frictionless supports to the symmetry planes as well as the bottom surface of the DBC module's baseplate and the proposed module's heatsink.

Figure 4B:
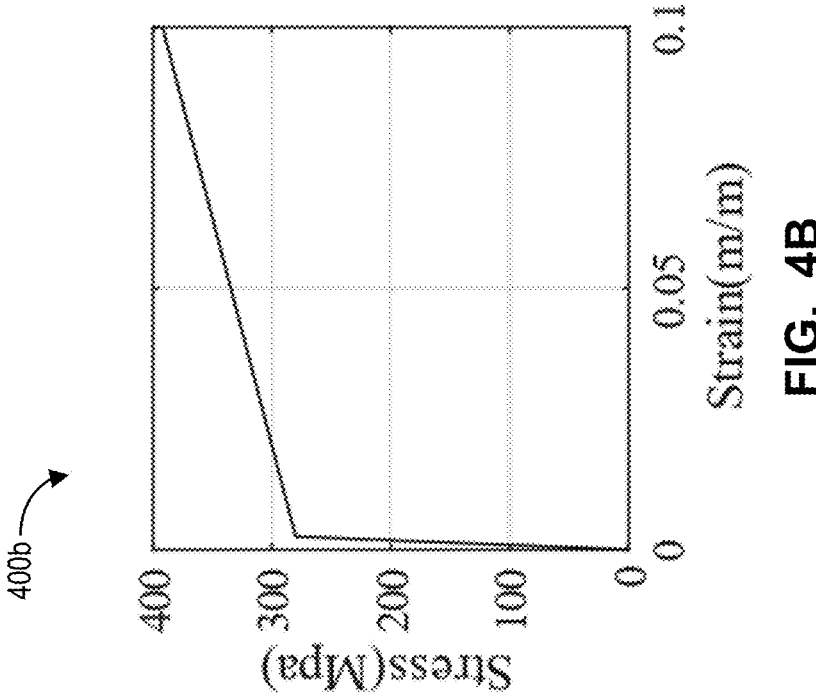
FIG. 4B is a plot showing an example bilinear strain hardening curve for copper.
Figure 4A:
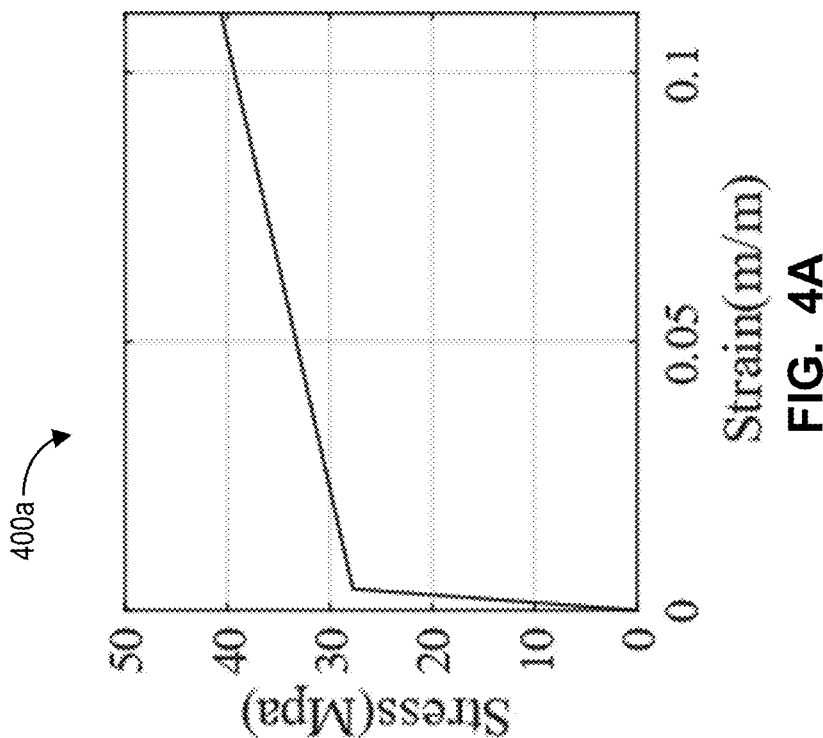
FIG. 4A is a plot showing an example bilinear strain hardening curve for aluminum.

The thermal-mechanical properties required for steady-state simulations are shown in Table 3 (below) for different evaluated materials. The materials include various Mo and Mo—Cu alloys that can be used for the metallic layers in the proposed packaging module. The elastoplastic properties of aluminum and copper are modeled using the bilinear strain hardening curves shown by way of example in plot 400 of FIG. 4A (i.e., for aluminum), and plot 400b of FIG. 4B (i.e., for copper).

TABLE 3

Thermal-Mechanical Properties

| Material | E(Gpa) | Poisson's ratio | k (W/m-K) | $(1 \times 10^{-6}/°\,C.)$ |
|---|---|---|---|---|
| SiC | 420 | 0.14 | 120 | 4 |
| Si₃N₃ | 310 | 0.25 | 30 | 3.3 |
| Mo | 330 | 0.31 | 138 | 5.3 |
| Mo85Cu15 | 280 | 0.31 | 170 | 6.8 |
| Mo70Cu30 | 230 | 0.31 | 190 | 7.5 |
| Mo60Cu40 | 210 | 0.32 | 230 | 8.7 |
| Mo40Cu60 | 170 | 0.33 | 290 | 11.5 |
| HL832NSF | 32 | 0.19 | 0.7 | 5.5 |
| TIM | — | — | 0.7 | — |
| Aluminum | 70 | 0.35 | 237 | 23 |
| Copper | 110 | 0.34 | 401 | 17 |
| Nano Silver Paste | 20 | 0.37 | 200 | 19.6 |
| SAC405 SnAg Solder | 40 | 0.37 | 50 | 20 |

In the conducted simulations, the solder and sintered nano-silver for the proposed module are assumed to be visco-plastic materials. These are commonly modeled by an Anand visco-plastic model. In particular, the Anand model is typically used for large, isotropic, visco-plastic deformations, and small elastic deformations, and is therefore suitable for solders and sintered nano-silvers.

A single-scalar internal variable is also used to construct the simulated model, which is the deformation resistance (s). The Anand model also further requires no clear yield condition.

The Anand model is described in Equation (10), which shows the relationship between stress (σ) and plastic strain rate ($\varepsilon_p$). Here, the plastic strain includes the creep strain. The evaluation of deformation resistance (s) is achieved through Equations (11) and (12).

$$\dot{\varepsilon}_p = A \cdot e^{-\frac{Q}{TR}} \cdot \left[ \sinh\left( \xi \frac{\sigma}{s} \right) \right]^{1/m} \tag{10}$$

$$s = \left[ h_0 \cdot \left| 1 - \frac{s}{s^*} \right|^a \cdot \text{sign}\left( 1 - \frac{s}{s^*} \right) \right] \cdot \dot{\varepsilon}_p \tag{11}$$

$$s^* = \hat{s} \left[ \frac{\dot{\varepsilon}_p}{A} \cdot e^{\frac{Q}{RT}} \right]^n \tag{12}$$

wherein R expresses gas constant, T is the absolute temperature, s* is the saturation value of s.

Other involved simulation parameters are illustrated Table 4 (below). The sintered nano-silver parameters are experimentally obtained from "Yu" (see D. ji Yu, X. Chen, G. Chen, G. quan Lu, and Z. qiang Wang, "Applying Anand model to low-temperature sintered nanoscale silver paste chip attachment," Mater. Des., vol. 30, no. 10, pp. 4574-4579, 2009) based on a material with 82% relative density (X. Chen, R. Li, K. Qi, and G. Q. Lu, "Tensile behaviors and ratcheting effects of partially sintered chip-attachment fifilms of a nanoscale silver paste," J. Electron. Mater., vol. 37, no. 10, pp. 1574-1579, 2008).

TABLE 4

ANAND Model Parameters

| Parameters | Nano Silver Paste | SAC405 SnAg Solder |
|---|---|---|
| Initial deformation resistance (s₀) | $2.77 \times 10^6$ | $1.3 \times 10^6$ |
| Activation energy (Q) | 5709 | 9000 |
| Pre-exponential factor (A) | 9.81 | 500 |
| Multiplier of stress (ξ) | 11 | 7.1 |
| Strain rate sensitivity of stress (m) | 0.657 | 0.3 |
| Hardening/softening constant (h₀) | $1.58 \times 10^{10}$ | $5.9 \times 10^9$ |
| Coefficient for Deformation Resistance Saturation (ŝ) | $6.74 \times 10^7$ | $3.94 \times 10^7$ |
| Deformation Resistance (n) | 0.003 | 0.03 |
| Strain Rate Sensitivity of Hardening/Softening (a) | 1 | 1.11 |

Reference units (stress, temperature, time): Pa, K, s

Figure 5:
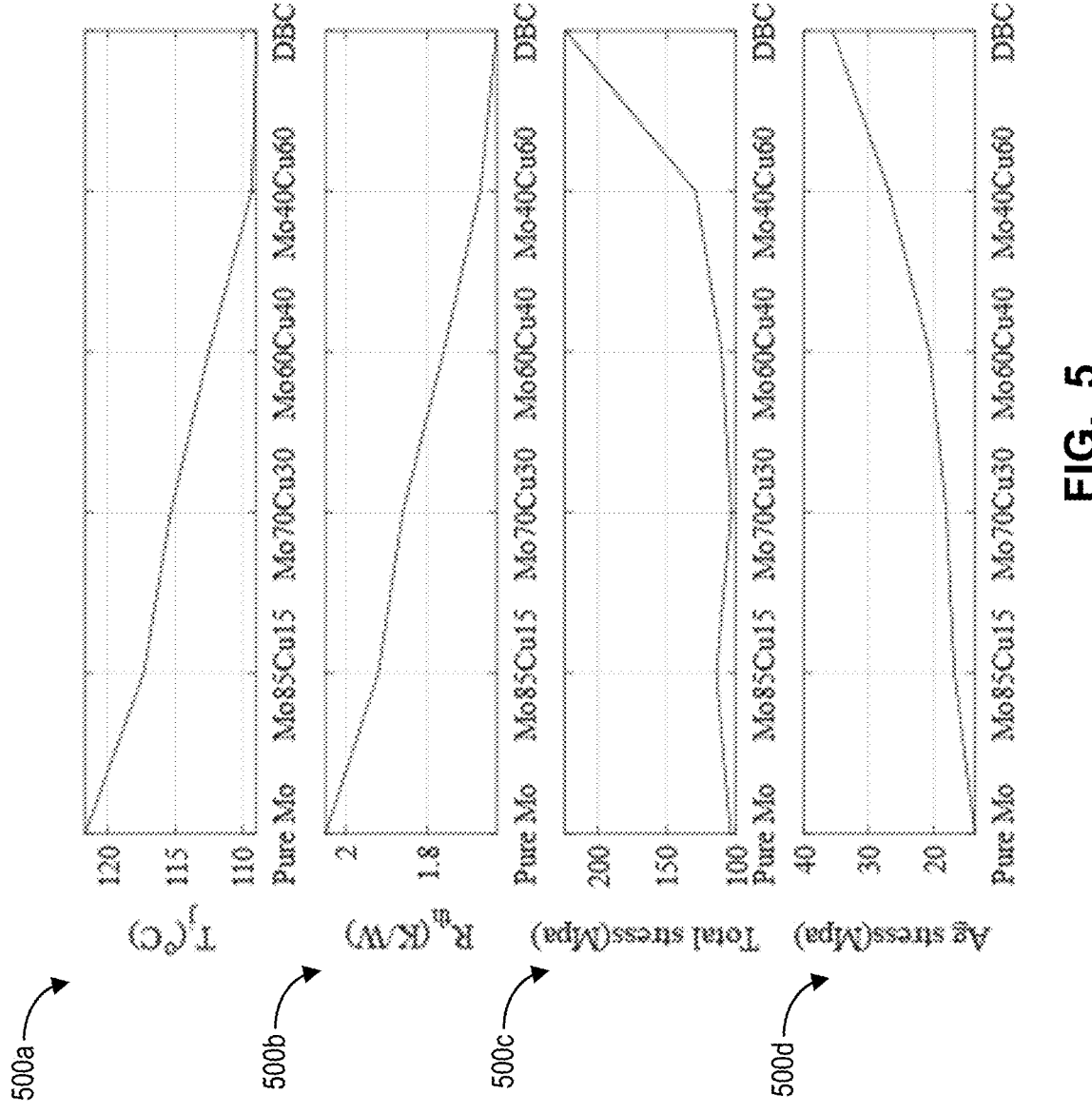
FIG. 5 shows various plots resulting from a steady-state thermal-mechanical simulation of example packaging modules.

Reference is made to FIG. 5, which shows plots 500a-500d corresponding to the thermal-mechanical simulation results for packaging modules which use pure Mo, Mo85Cul15, Mo70Cu30, Mo60Cu40 or Mo40Cu40 for the metallic layers, as well as for the conventional DBC module.

More particularly, simulation plot 500a shows a comparison of the junction temperatures (T_j) for each evaluated material (i.e., in units of ° C.), simulation plot 500b shows a comparison of the thermal resistances (R_th) for each evaluated material (i.e., in units of kelvins per watt (K/W)), plot 500c shows a comparison of the total stresses for each evaluated material (i.e. in units of megapascals (Mpa)), and plot 500d show stress at the bonding or silver sintered layers for each evaluated material (i.e. in units of megapascals (Mpa)).

The simulation results for the junction temperature (T_j) (plot 500a) and the thermal resistance (R_th) (plot 500b) are considered to be two key results in evaluating the cooling performance of the evaluated power modules. As shown in plots 500a and 500b, among all the candidates, the material with the highest Cu ratio (i.e., Mo40Cu60) is observed to lead to the lowest junction temperature (T_j) and thermal resistance (R_th), which is due to its highest thermal conductivity. As well, while the DBC module has more layers, the large application of Cu in this module results in a better heat spreading, thus, a lower observed thermal resistance ($R_{th}$). Therefore, based only on simulation results in plots 500$a$ and 500$b$, the DBC module appears to exhibit the most desirable junction temperature ($T_j$) and lowest thermal resistance ($R_{th}$).

In the disclosed packaging design, however, the critical temperature of all selected materials (e.g., melting temperature and glass transient temperature) is greater than 220° C. This temperature is much higher than the typical maximum operating temperature of conventional power modules (e.g., 150° C. to 175° C.).

It has been appreciated that a significant concern therefore is, in fact, the thermal stress/strain caused by thermal expansion, which is the source of major failure modes. This concern may accordingly de-emphasize the importance of having the lowest junction temperature ($T_j$) and thermal resistance ($R_{th}$).

As noted previously, thermal-mechanical issues resulting from thermal stress/strain are not only affected by the operating temperature, but also by the mechanical properties of the packaging module materials. These mechanical properties correspond to the material's coefficient of thermal expansion (CTE) and the elastic modulus. In the other words, a proper selection of material in the packaging module should reduce the risk of failure, despite resulting sacrifice to the overall thermal resistance and junction temperature of the packaging module.

In the steady-state thermal-mechanical simulations, the thermal stress is viewed as the criteria in evaluating the performance of different materials. Lower thermal stress is able to prevent cracking and typically improves the resistance of fatigue. As shown in plot 500$c$ in FIG. 5, it is observed that the proposed module with pure Mo exhibits significant advantages in thermal stress. Compared with the DBC module, the power module with pure Mo reduces the total stress by half (i.e., 53% less stress), and the critical stress at the bonding layers (stress at the silver sintered layer) is reduced by 62% (plot 500$d$).

Accordingly, the steady-state thermal-mechanical simulations demonstrate that: (a) the higher the Cu ratio, the better the heat transfer, but at the expense of degraded thermal stress; and (b) the pure Mo module results in significantly lower thermal stress. Accordingly, and for these reasons, a pure Mo module is selected as the material for the proposed packaging module. Further, although the DBC based module may have better heat transfer, it has much higher thermal stress which can increase the risk of failure to a great extent.

III. Transient Thermal-Mechanical Evaluation of SSM Module

The following section illustrates the advantage of the proposed SSM packaging in improving lifetime and temperature range.

Lifetime is evaluated by subjecting power modules to multiple failures and fatigue modes. The most critical fatigue corresponds to fatigue at the die bonding and bond wires. However, as bond wires are eliminated in the disclosed SSM packaging, the only mode discussed herein is the fatigue at the die bonding and sintered silver layers.

The Coffin-Manson model is a widely applied method in analyzing the lifetime of metallic or solder materials under cyclic-plastic deformation. This model has been previously used for assessing nano-silver sintering die bonding. In particular, this model considers that the lifetime of a material has an exponential relationship with the plastic strain difference ($\Delta\varepsilon_p$) during acycle, as shown in Equation (13).

$$N_f = C_1 \Delta\varepsilon_p^{-C_2} \tag{13}$$

wherein $N_f$ denotes the lifetime (cycles), $C_1$ and $C_2$ are material constants.

Figure 6:
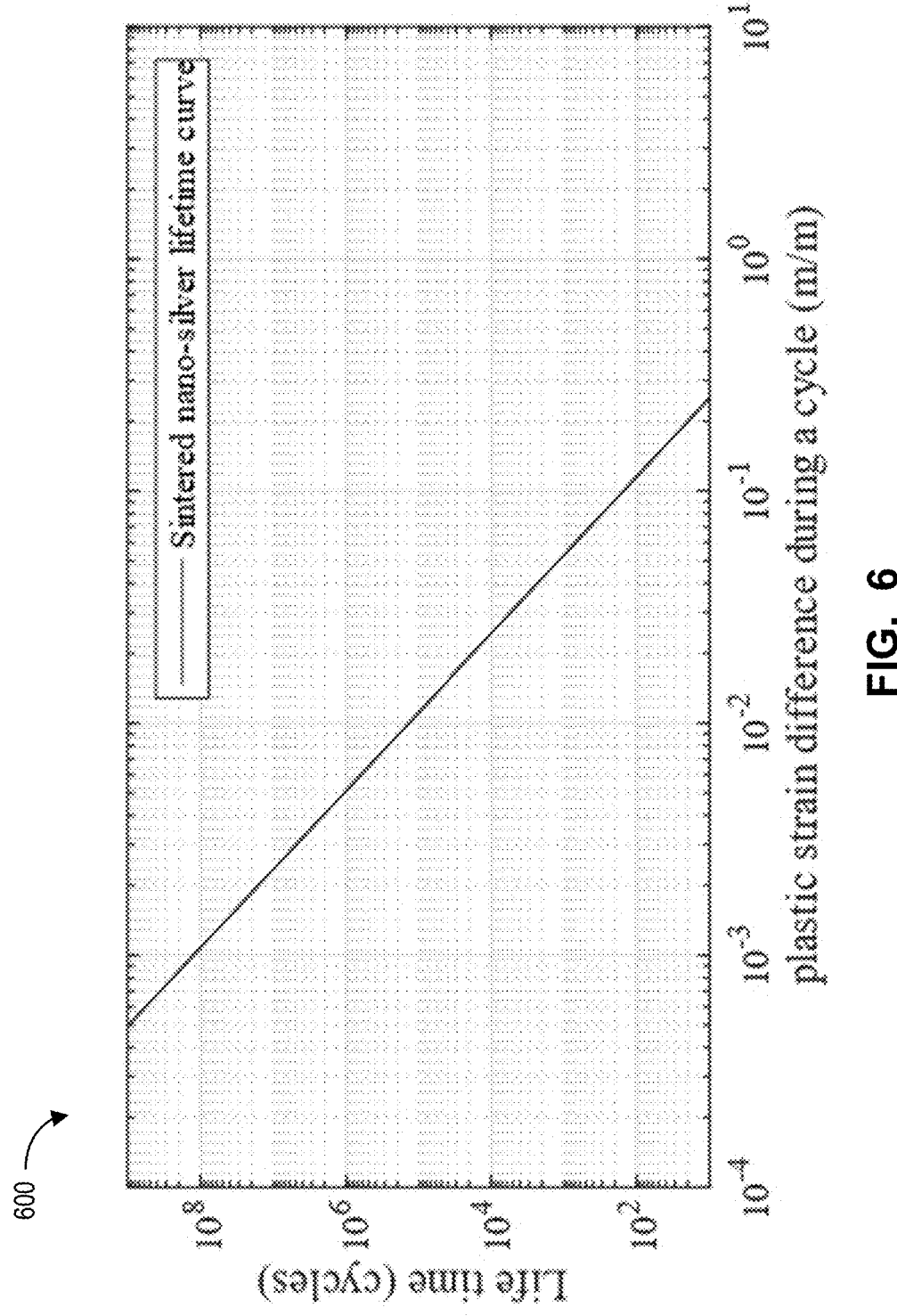
FIG. 6 is a plot showing a Coffin Manson lifetime characterization of nano-silver sintering bonding.

The parameter characterization of the specific nano-silver materials used herein (nanoTach® from NBE®) was obtained from Knoerr (M. Knoerr, S. Kraft, and A. Schletz, *"Reliability assessment of sintered nano-silver die attachment for power semiconductors,"* in 2010 12th Electron. Packag. Technol. Conf., Singapore, 2010, pp. 56-61), and is shown in plot 600 of FIG. 6, in which one can obtain that $C_1$ equals 0.16 and $C_2$ is −2.96. The properties of the sintered nano-silver are largely dependent on its relative density (or porosity). The nanoTach® material in Knoerr has a relative density of 75%-85%, which is close to the one used to construct the Anand visco-plastic model. Therefore, it was considered reasonable to combine these parameters in simulations.

Figure 7:
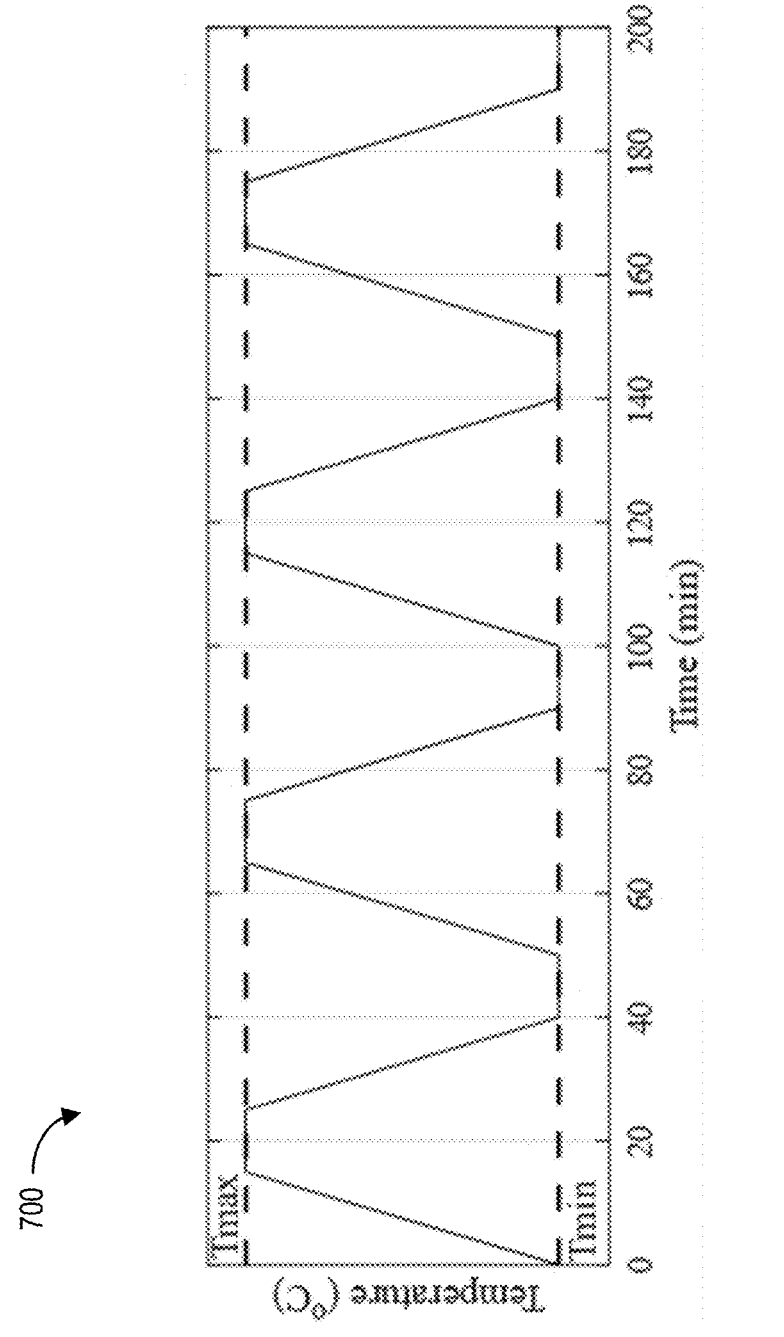
FIG. 7 is an example JEDEC® temperature cycling profile.

Temperature cycling is a standard approach to assess the lifetime of power modules. Several cycling profiles based on JEDEC® standard were applied herein. The profiles of these cycling processes are shown in plot 700 of FIG. 7. All the cycling profiles used had a $T_{min}$ of −40° C., while the $T_{max}$ varied.

Transient FEAs were carried out in ANSYS to implement these temperature cycling processes. The cyclic temperature is set for the entire module. Thus, the heat generation and cooling boundaries in the steady-state simulations were no longer applied, while other boundary conditions remained the same.

Figures 8A, 8B, 8C:
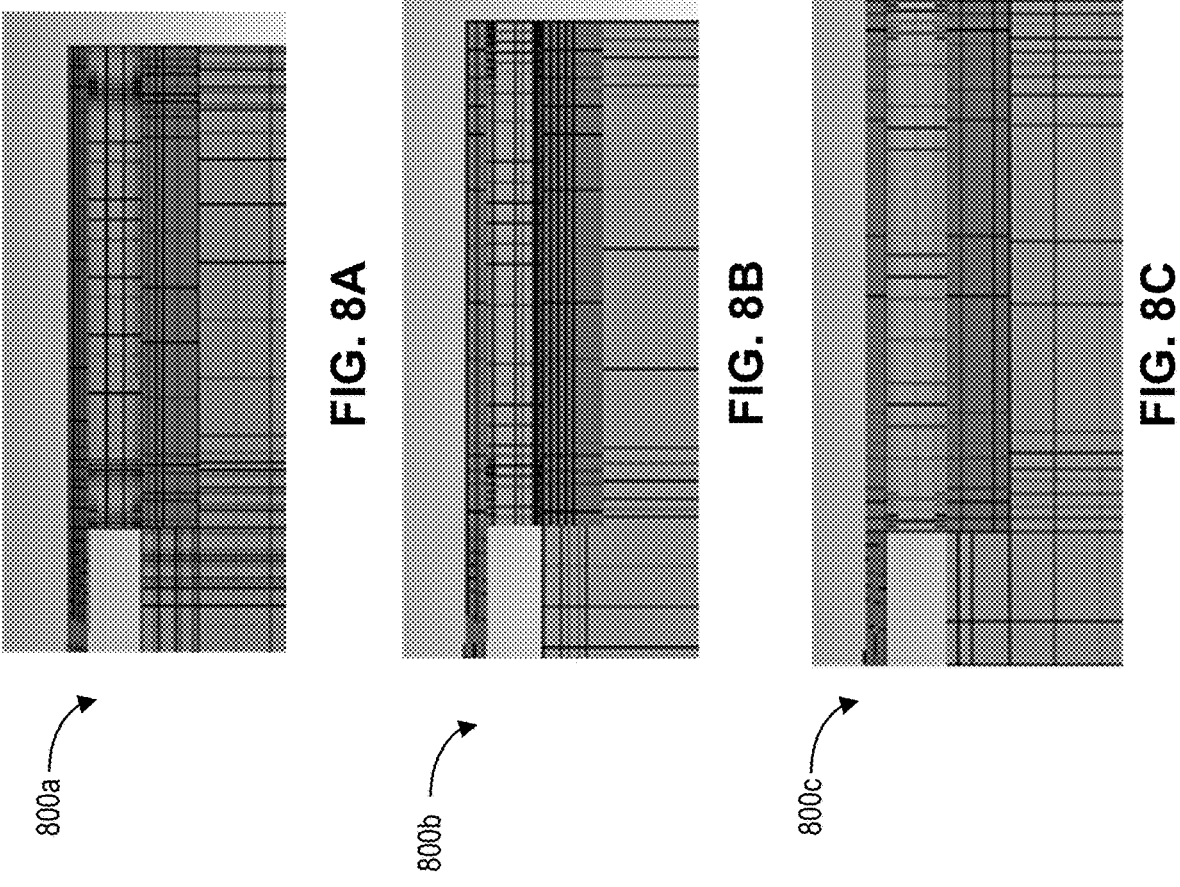
FIGS. 8A-8C show different meshing with different element sizes.
Figure 9:
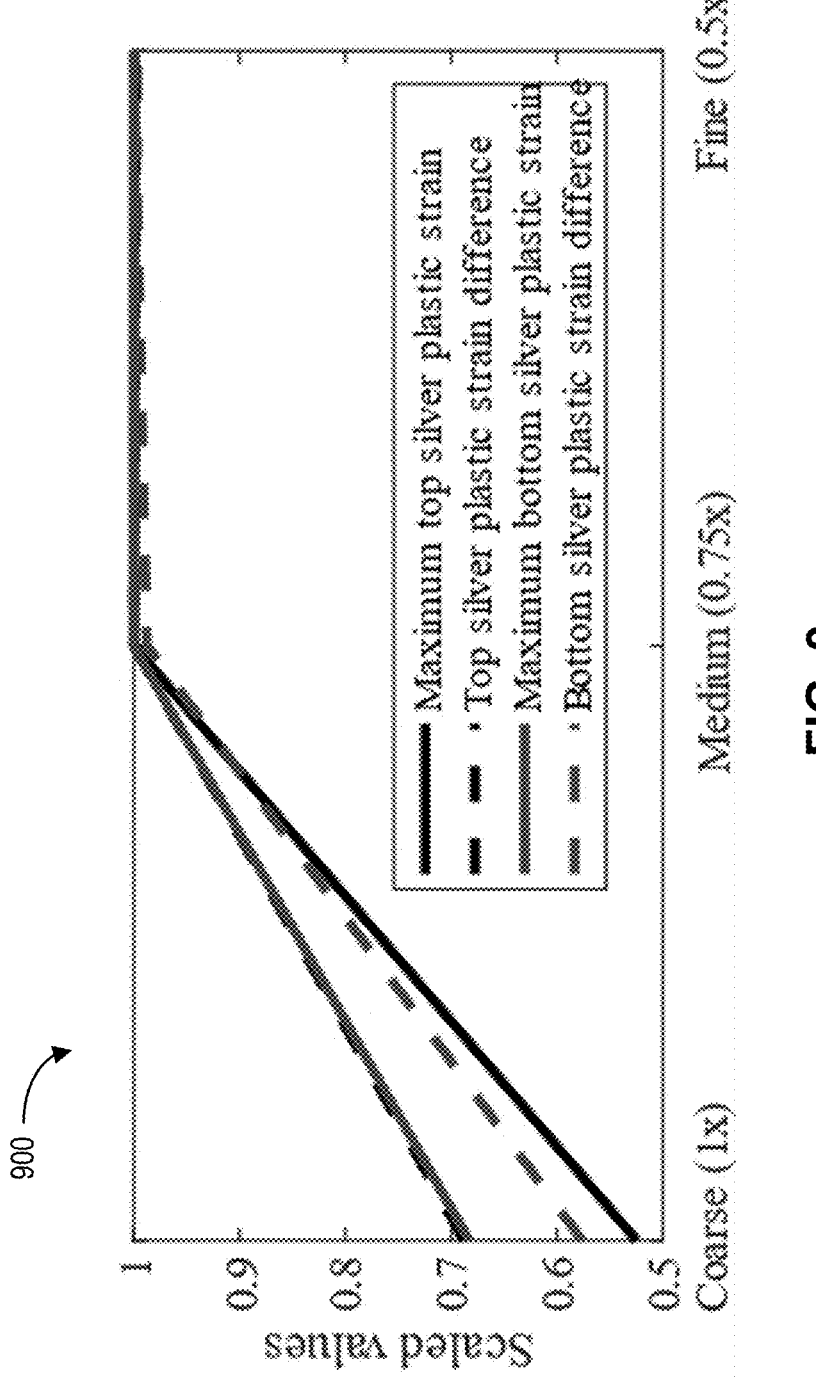
FIG. 9 is a plot of an example mesh sensitivity evaluation.

It was recognized that transient FEAs are exceptionally time-consuming. Accordingly, it was determined as to not be practical to apply extremely fine meshing. A mesh sensitive study was conducted to determine the suitable mesh size that guarantees reliable results with affordable simulation time. As shown in FIGS. 8A-8C, three different meshing with 0.5×—fine (800$a$) (FIG. 8A), 0.75×—medium (800$b$) (FIG. 8B), and 1×—coarse (800$c$) (FIG. 8C) element sizes at the critical regions were compared. FIG. 9 shows simulation results get stabilized at 0.75× and 0.5× element size (see plot 900). A 0.5× element size was ultimately used for all the simulations. The convergence plots can be used to further judge the confidence level of the transient FEA model.

Figure 10:
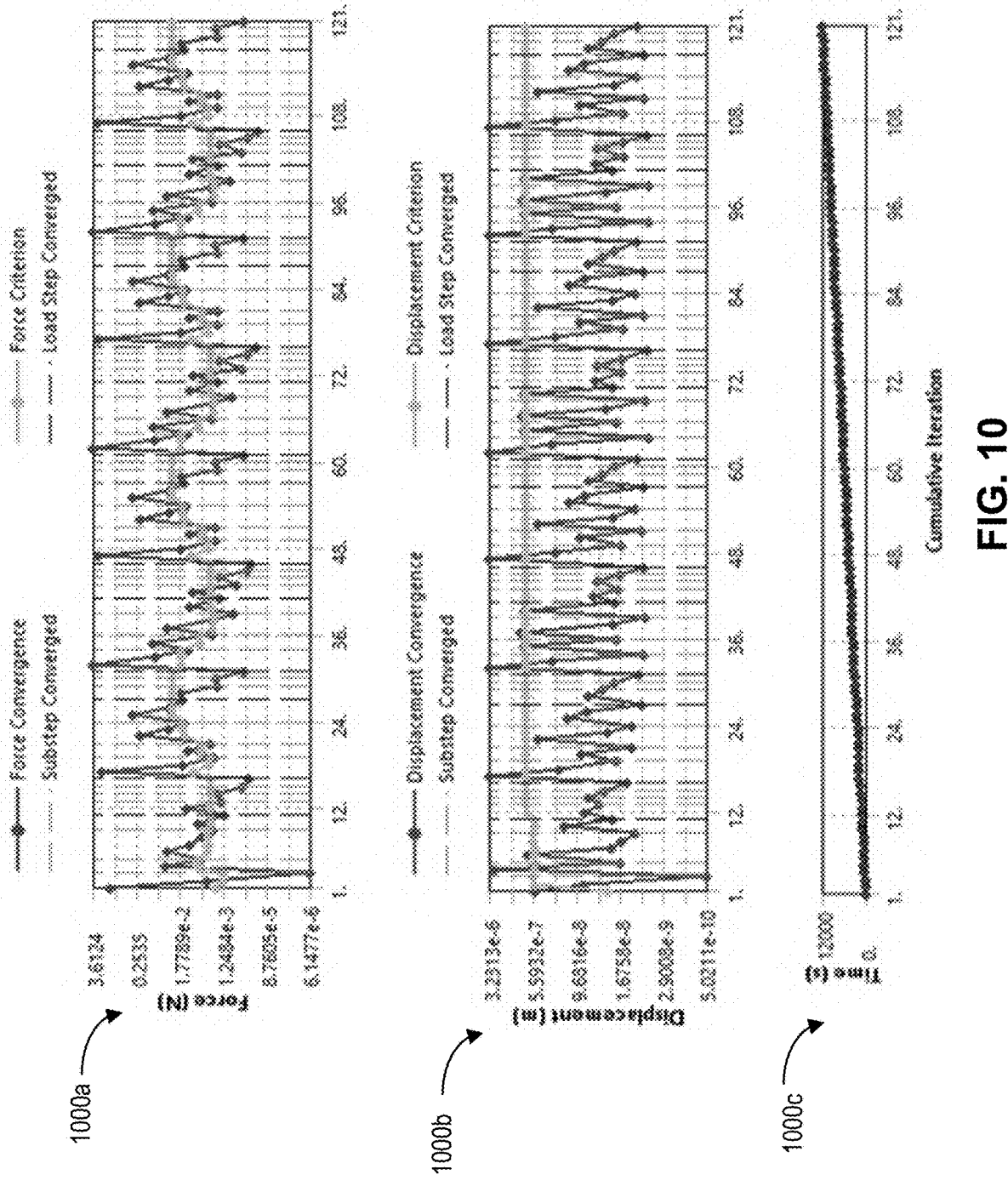
FIG. 10 shows various force and displacement convergence plots resulting from temperature cycling FEA (finite element analysis) modeling.

FIG. 10 shows a force plot (plot 1000$a$), a displacement convergence plot (plot 1000$b$) and a plot in respect of cumulative iteration (plot 1000$c$). It is observed that the SSM model converged quickly after 1 to 3 iterations for each sub-step, which indicates that the model is properly defined. To this end, plot 1000$c$ shows the accumulation of time versus simulation steps (e.g., 200 minutes total time).

Figure 11:
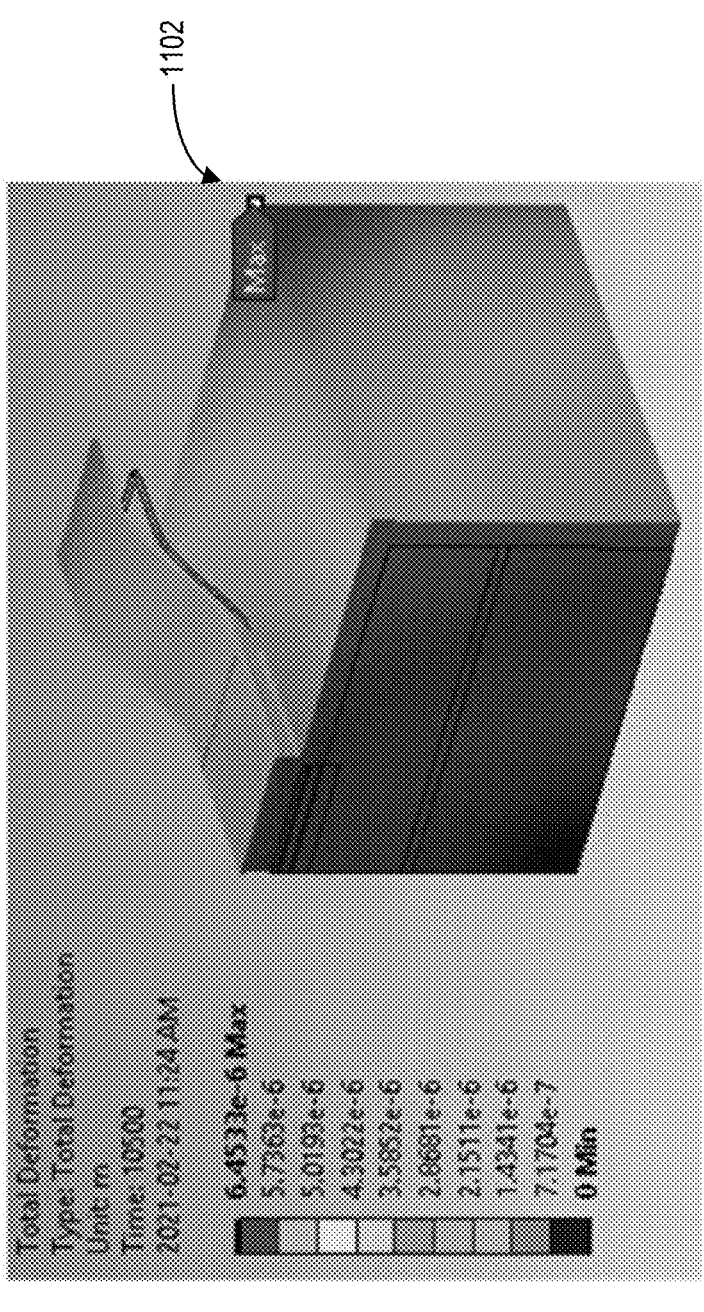
FIG. 11 is an image showing total deformation of an example packaging module under 40° C. and 125° C. temperature cycling.

Temperature cycling between −40° C. and 125° C. was used as an example to understand the transient thermal-mechanical behavior of the SSM module. The total deformation of the module at the 175th minute is shown in FIG. 11. The maximum deformation appears at the farthest end 1102, as expected.

As discussed above, the critical components in the packaging module are the bonding layers. For the disclosed SSM module, there are two bonding layers located at both the top and the bottom of the SiC die (102$a$, 102$b$ in FIG. 1).

Figure 12:
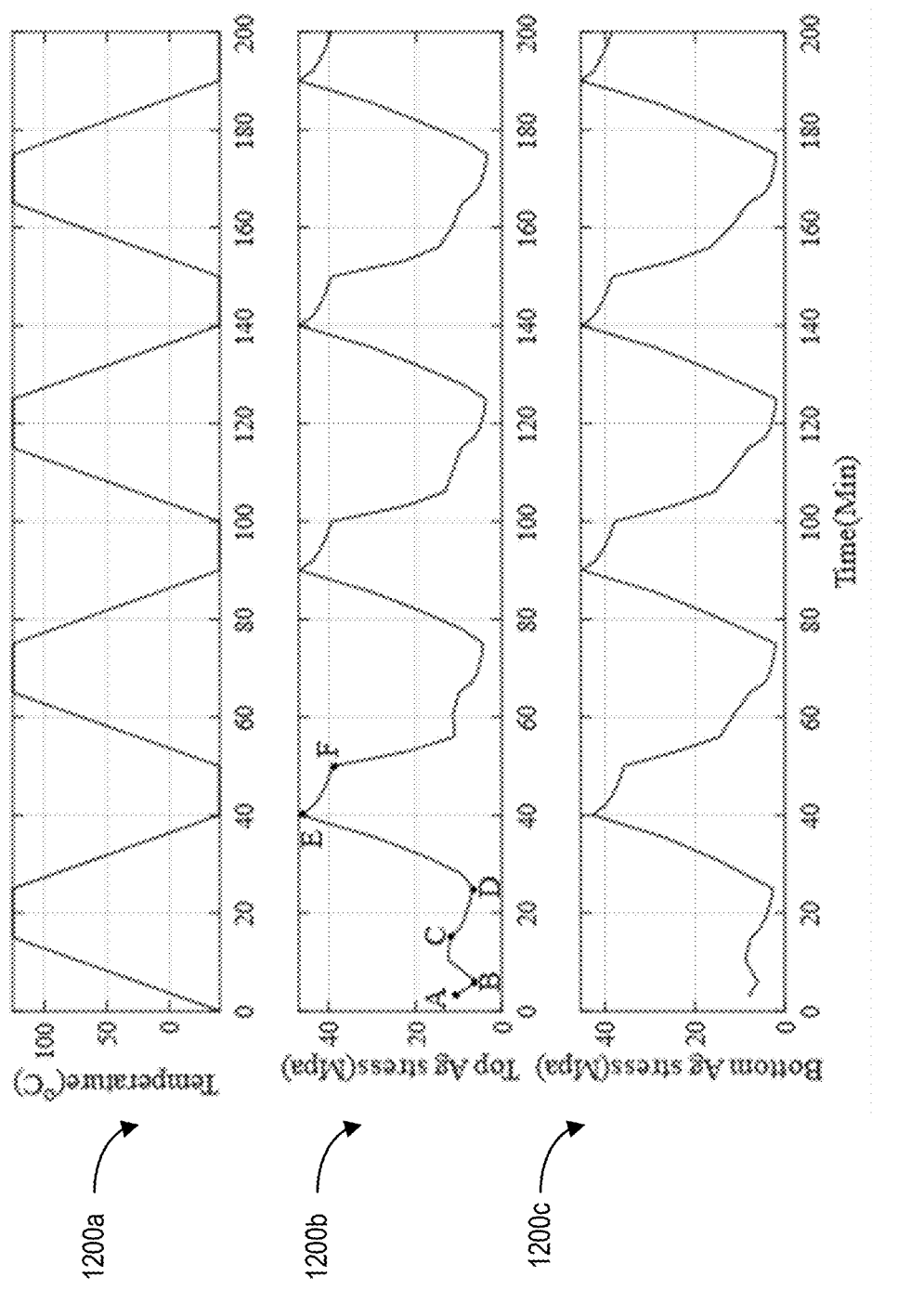
FIG. 12 shows plots of stress experienced by an example silver-sintered Mo (SSM) packaging module under 40° C. and 125° C. temperature cycling.

FIG. 12 shows the stress fluctuation curves of these two layers (i.e., 112$a$, 112$b$ in FIG. 1) during the temperature cycling. In particular, plot 1200*a* shows the temperature cycling as a function of time, plot 1200*b* shows the stress on the top bonding layer as a function of time (112*b* in FIG. 1), and plot 1200*c* shows the stress on the bottom bonding layer as a function of time (112*a* in FIG. 1).

In general, as shown, the two bonding layers underwent similar stress changes, however, the maximum stress at the top silver layers (46.8 Mpa) was slightly higher than that of the bottom silver layer (45.3 Mpa).

Stress relaxation were also observed during the temperature cycling process. For example, taking the first cycle of the top silver layer as an example (plot 1200*b*)—from points 'A' to 'B', the stress decreases because the temperature approaches 25° C. (the stress-free temperature) from −40° C. From points 'B' to 'C', the temperature continues to increase until it reaches 125° C., however, the stress from thermal expansion is compensated by the stress relaxation, which allows the actual stress to first increase and then decrease slightly. From points 'C' to 'D', when the temperature load is fixed at 125° C., the stress is brought down by stress relaxation only.

During the cooling process from (points 'D' to 'E'), the stress elevates fast due to the compression. Subsequently, the stress relaxation is dominant again during the second constant temperature region (points 'E' to 'F'). Specifically, the stress relaxation is caused by the creep of the sintered nano-silver which has rate dependent visco-plastic properties. The creep of the bonding layer relaxes the strain, which releases the elastic stress at the contacted layers (SiC and Mo). Consequently, the stress at the sintered nano silver is reduced as well. Intrinsically, the creep and stress relaxation is due to mechanisms such as dislocation glide, dislocation creep, and diffusional flow (Nabarro creep) in the sintered nano silver.

FIG. 13 illustrates the stress profiles of the two bonding layers at the end of the cycling in FIG. 12. In particular, image 1300*a* shows the stress profile for the top bonding layer (112*b* in FIG. 1), while image 1300*b* shows the stress bonding on the bottom bonding layer (112*a* in FIG. 1).

For both layers, the maximum stress points are located at the corners 1302, 1302*b*. In particular, stress concentration is always seen at sharp edges. Meanwhile, the edges and corners are subject to the mismatch of thermal expansion by different materials, and therefore, they are typically the most critical regions.

Figure 14:
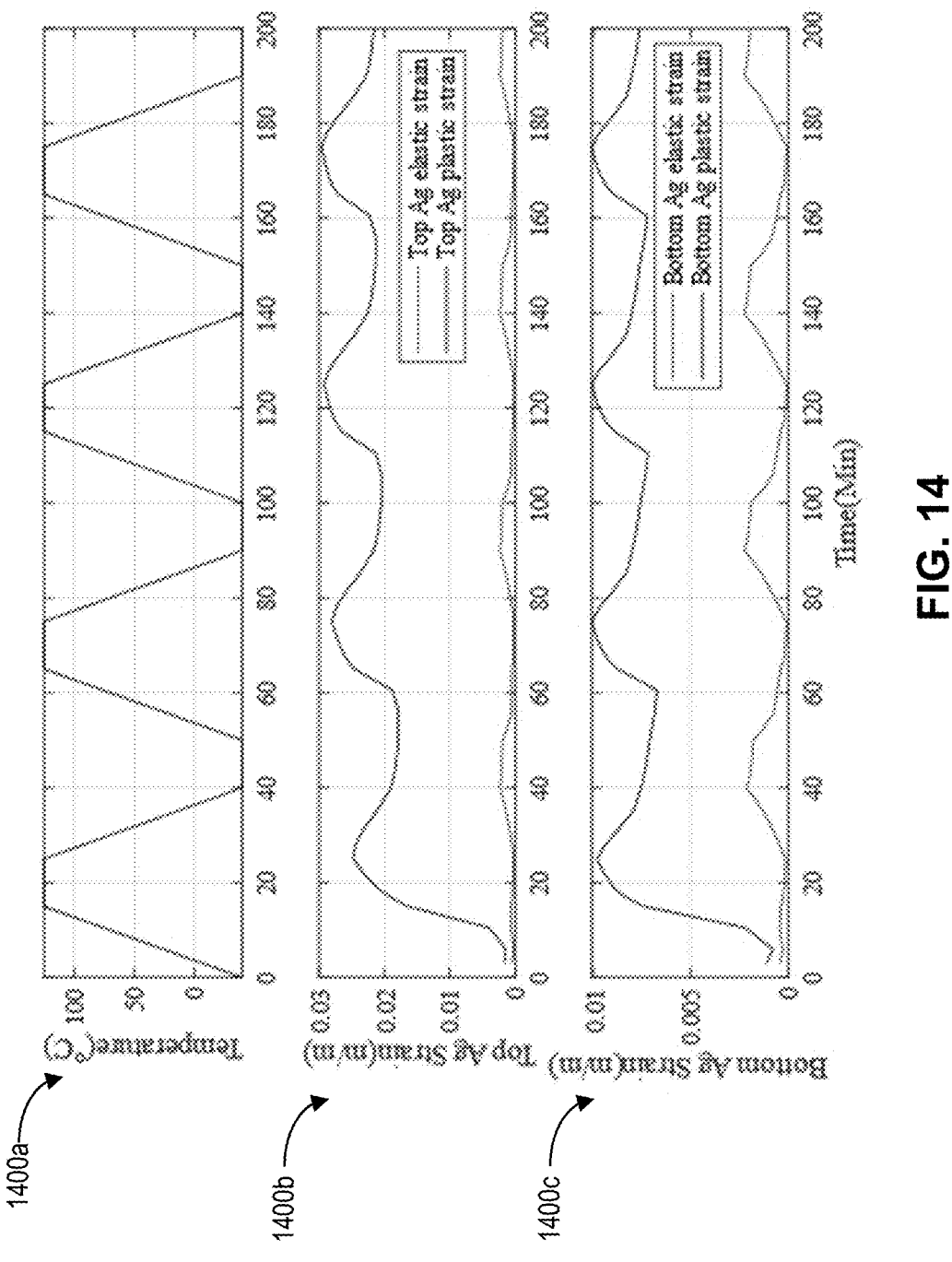
FIG. 14 shows plots showing the strain experienced by an example SSM packaging module under 40° C. and 125° C. temperature cycling.

According to the Coffin-Manson model, the strain profiles are directly related to the lifetime of these materials. FIG. 14 illustrates the fluctuation curves of the strain during the temperature cycling, including both the elastic and plastic strains. In particular, plot 1400*a* shows temperature cycling as a function of time, plot 1400*b* shows the fluctuation curve of the strain for the top bonding layer as a function of time (112*b* in FIG. 1), and plot 1400*c* shows the fluctuation curve of the strain on the bottom bonding layer as a function of time (112*a* in FIG. 1).

As shown, overall, the strain curves are stabilized after two cycles. For both the top and the bottom layers, the elastic strain is much smaller than the plastic strain, which demonstrates again that this is a plastic-dominant deformation. The bottom silver layer is clamped by the SiC die and the thick Mo substrate which has a frictionless support boundary at its bottom surface. In contrast, the top silver layer is clamped by the SiC and the thin Mo lead which is free to move. Therefore, the bottom layer is better constrained. In the simulation results, the bottom layer also undergoes less deformation during cycling. Therefore, the maximum plastic strain (0.0296 m/m) is exhibited at the bottom nano silver sintering layer (0.0101 m/m). More importantly, the variation of the plastic strain rate ($\Delta\varepsilon_p$) of the top layer (0.0082 m/m) is also much larger than that of the bottom layer (0.0029 m/m). Accordingly, it is observed that the top silver layer is subjected to a higher risk of fatigue.

FIG. 15 illustrates the plastic strain distributions of the top bonding layer (1500*a*) and bottom bonding layer (1500*b*). Similar to the stress distribution, the maximum points are located at the corners.

Temperature cycling processes were also simulated to compare the performance of the proposed SSM module and the conventional DBC module. As explained above, the top silver layer 112*b* is more critical in the SSM module. Thus, it was compared with the bonding layer in the DBC module.

Figure 16:
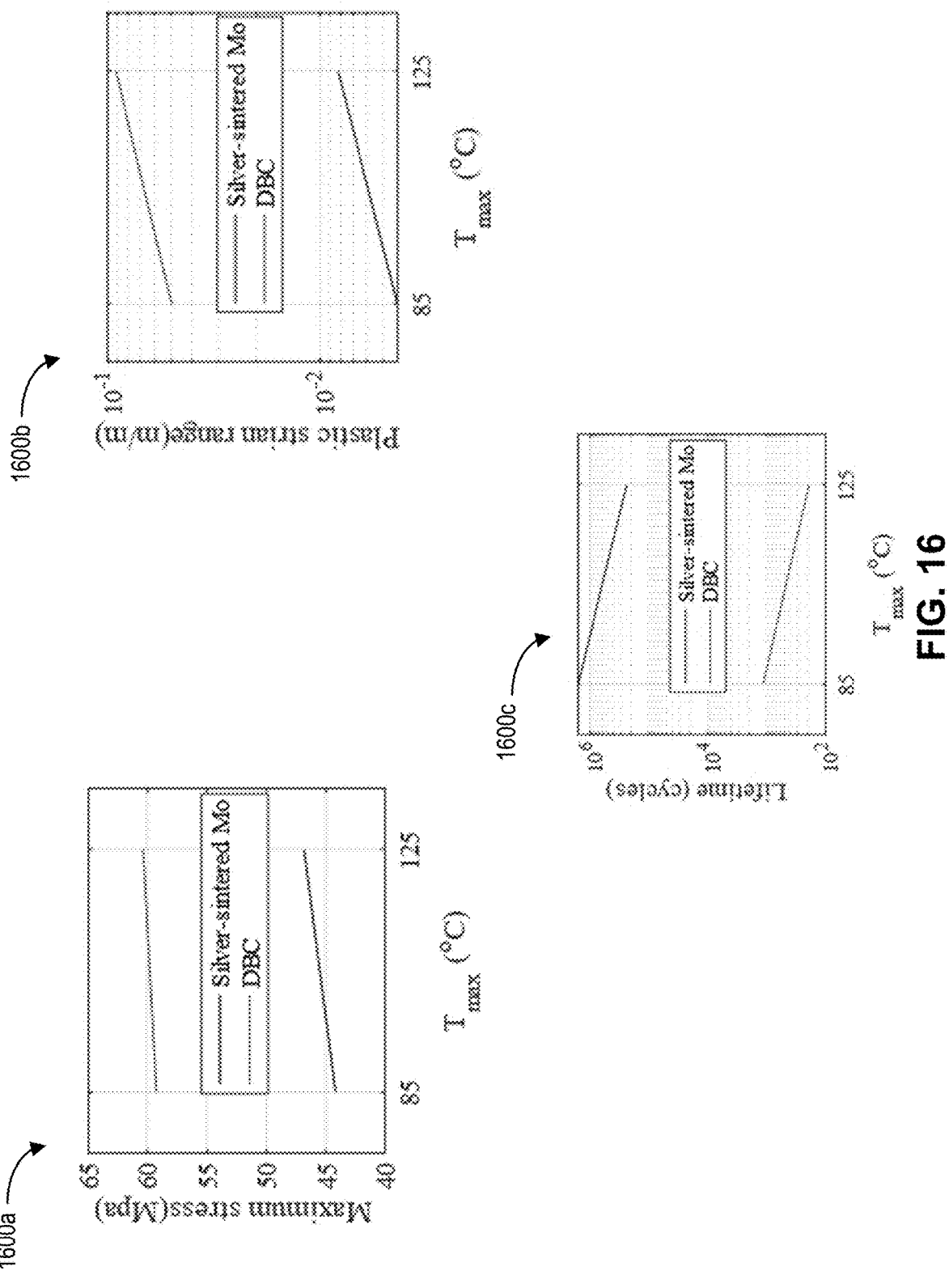
FIG. 16 are various plots comparing an example SSM module, in accordance with the teachings herein, and a DBC module, and illustrating stress at silver bonding.

Two most common-used cycling processes from JEDEC®, −40° C. to 85° C. and −40° C. to 125° C., were used for the comparison, which are shown in FIG. 16. In particular, plot 1600*a* compares maximum stress (Mpa) at different temperatures between the silver-sintered Mo packaging and the DBC packaging. Plot 1600*b* compares the plastic strain srange (m/m) at different temperatures between the silver-sintered Mo packaging and the DBC packaging. Plot 1600*c* compares the lifetime (i.e., in cycles) at different temperatures between the silver-sintered Mo packaging and the DBC packaging.

As shown, the higher $T_{max}$ leads to higher stress and plastic strain difference, causing a shorter lifetime for both modules. However, the differences between the two modules are significant. Under both −40° C. to 85° C. cycling and −40° C. to 125° C. cycling, the SSM module has nearly 25% lower maximum stress at the bonding, 10× lower plastic strain difference, and over 1000× longer lifetime. Accordingly, these results demonstrate that the proposed SSM packaging has a significantly better performance in fatigue and lifetime as compared to the DBC packaging.

Figure 17:
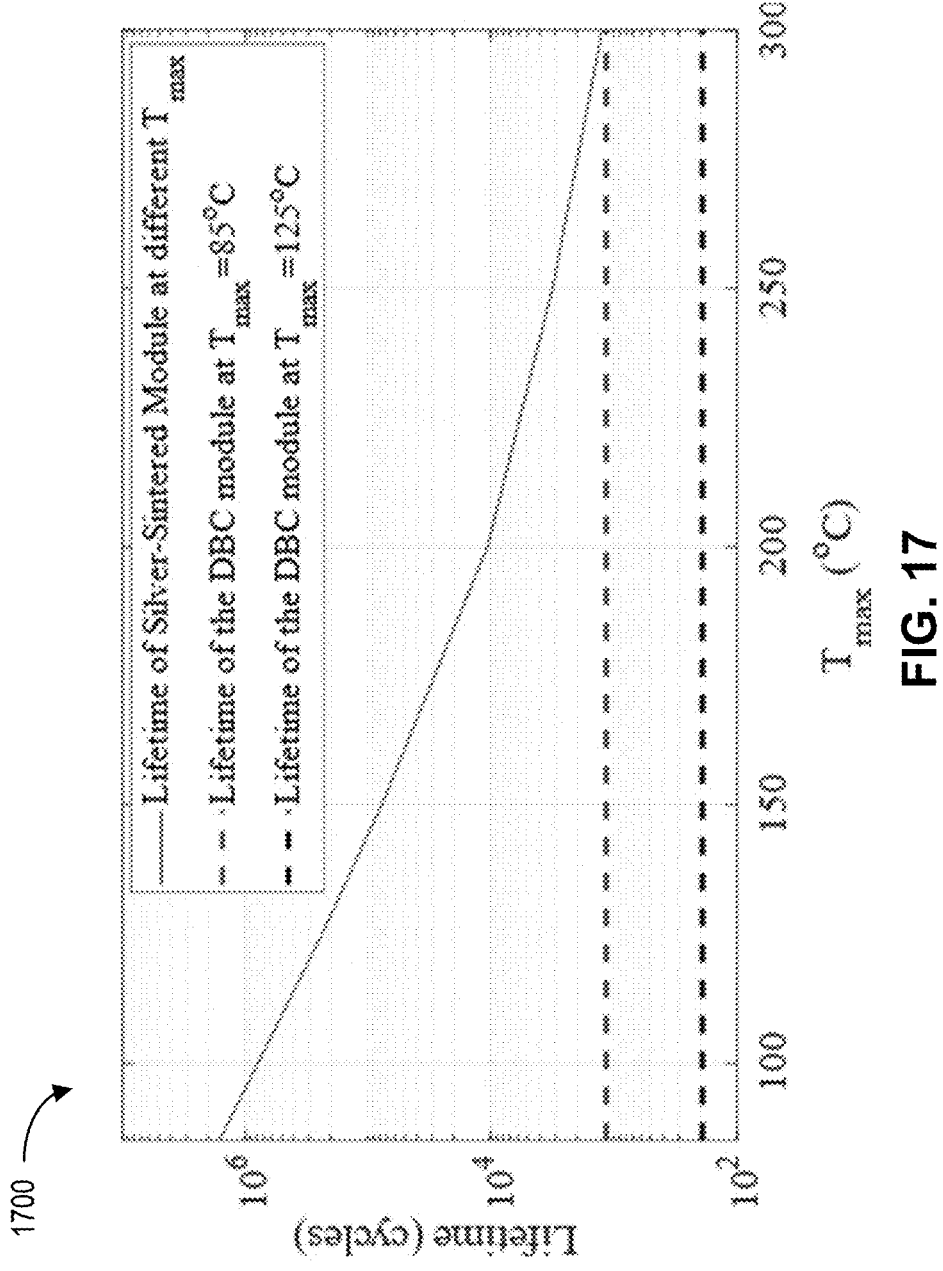
FIG. 17 is a plot showing lifetime comparison between an example SSM module and a DBC module at different temperatures.

FIG. 17 shows a plot 1700 of the relationship between lifetime and $T_{max}$ for the proposed SSM packaging. The lifetime values for DBC module under temperature cycling with 85° C. $T_{max}$ and 125° C. $T_{max}$ are set as benchmarks. A more obvious trend of lifetime descending with temperature can be seen in this plot. More importantly, the proposed module has nearly the same lifetime at 300° C. $T_{max}$ to that of the DBC module at 85° C. $T_{max}$. This indicates that the SSM module has the potential to operate at a much higher temperature and a larger temperature range with a similar lifetime expectation to conventional technologies.

FIG. 18 shows table 1800, which compares the results of the proposed module with data obtained in respect of the DBC module from M. Knoerr, S. Kraft, and A. Schletz, "Reliability assessment of sintered nano-silver die attachment for power semiconductors," in 2010 12th Electron. Packag. Technol. Conf., Singapore, 2010, pp. 56-61, where the Coffin-Manson parameters used in simulations are obtained.

Comparing all the DBC modules using nano-silver sintering bonding (case C, D, E, and F), the cases from Knoerr (case E and F) are predicted to have a slightly longer lifetime, which is mainly due to a smaller temperature range during thermal cycling. As well, different die sizes (Si Diode vs. SiC MOSFET) and DBC materials ($Al_2O_3$ vs. $Si_3N_4$) may effect the results. Overall, these lifetime values are in the same magnitudes, indicating that the simulations herein provide a decent confidence level.

Case G and H are the simulation results of nano silver sintering with Mo substrates, which have longer lifetime than others. This is mainly due to the low $\Delta\varepsilon_p$ during each cycle (around $4\times10^{-3}$ m/m and $8\times10^{-3}$ m/m, respectively).

As discussed above, the CTE difference between the SiC die and the Mo substrate is significantly smaller than between the SiC die and DBC substrate coppers, which results in the expected advantage. More particularly, similar to case H, a case with a $\Delta\varepsilon_p$ of $8\times10^{-3}$ m/m is also reported in Knoerr. Such a case is likely to be achieved by having a short duration or a small temperature range during thermal cycling with DBC substrates. The experimental result of lifetime of this case is around $2\times10^5$, which agrees with case H very well. Thus, it is recognized that the proposed SSM packaging has an appreciated advantage regarding lifetime over the conventional module. As well, the SSM packaging's superior thermal-mechanical performance can elevate the maximum operating temperature of power modules.

IV. Silver Sintering on Mo Substrates

Methods of manufacturing SSM packaging are provided herein. In one embodiment, the nano-silver sintering processes can be pressure-based, meaning that external pressure is applied during the sintering process. In an alternative embodiment, the nano-silver sintering process can be a pressure-less process, meaning that no external pressure is applied during the sintering process. It may be inconvenient to apply external pressure to the SSM packaging, therefore the pressure-less method may be more suitable for SSM packaging. A method of pressure-less sintering of SiC and other MOSFET dies on substrates including Mo can be provided herein. A key challenge for providing ease of manufacturing of the proposed SSM packaging is resolving how to bond nano-silver sintering to SiC dies on Mo substrates.

Figure 23:
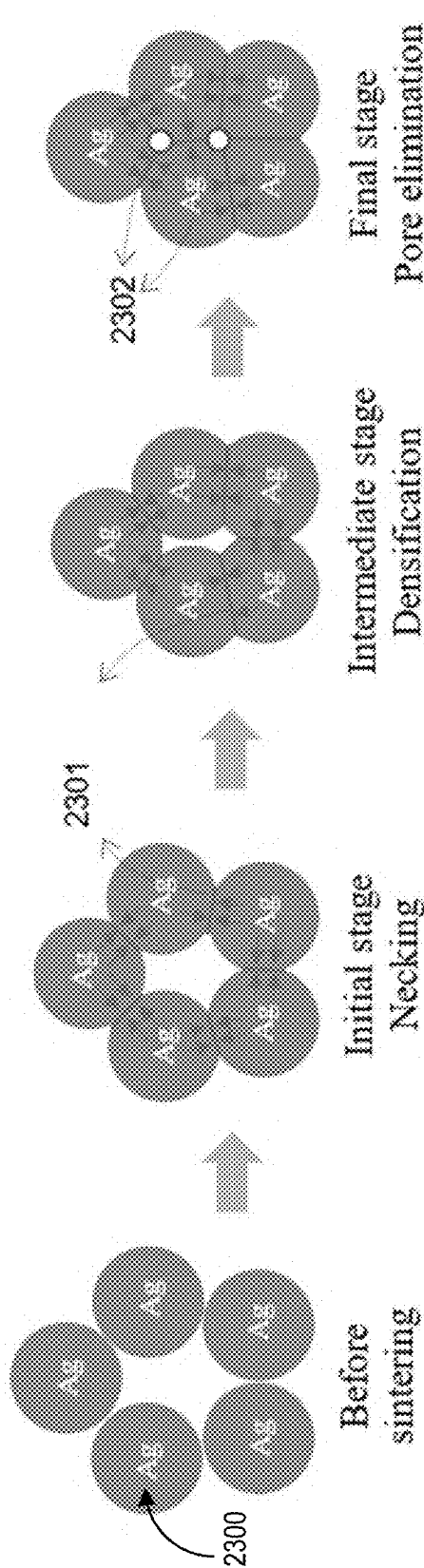
FIG. 23 provides a diagram depicting a three-stage sintering process.

In more detail, nano silver sintering is a solid-state atomic diffusion process driven by the reduction of total surface energy and/or interfacial energy. FIG. 23 provides a diagram depicting a three-stage sintering process, in one embodiment. In the initial stage, adjacent silver particles 2300 can be joined with each other by surface atomic diffusion at the initial necking stage. Initial bonding lines can be formed along the grain boundaries 2301 while large vacancies may still exist in this stage. In the intermediate stage, densification happens due to viscous flow or grain boundary diffusion. The bond lines extend, and small vacancies and pores 2302 can start to appear. In the final stage, pores 2302 may shrink until the pores are eliminated due to viscous flow or grain boundary diffusion. A dense silver bonding can then be achieved. In the sintering process, the surface energy of materials can be reduced by decreasing the surface area of the materials. There can be various parameters that affect the sintering quality, including particle size, surface condition, sintering temperature, time duration, and pressure.

It has been reported that nano silver sintering could exhibit significantly better performance when the contact material has a similar atomic number and lattice structure with silver. Silver itself and gold are the most common recommendations for the contact material when it is bonded to DBC substrates. Molybdenum, however, has a different lattice structure with silver. As well, molybdenum can form oxidized layers at the sintering temperature, which could reduce the bonding quality. Therefore, directly sintering the die on the bare molybdenum surface can be difficult to achieve. As such, a method of sintering a die on a Mo substrate is provided herein.

In the disclosed embodiments, both bare Mo and coated Mo can be used. The surface on the SiC chip 102 has three layers of metallization, which are Nickel (Ni)(0.6 μm)/lead (Pb)(0.2 μm)/aluminum (Au)(0.1 μm). The metallization on the coated Mo are ruthenium (Ru)(0.15 μm)/sliver (Ag)(0.3 μm) achieved by magnetron sputtering coating.

The sintering parameters are mainly based on Knoerr and Yu, which are also the main reference for material properties in the former simulations. However, the process is modified such that the holding time at the sintering temperature is extended to 30 minutes, and the sintering pressure is set to be 10 Mpa, which is thought to likely result in a denser bonding compared with the references Knoerr and Yu.

Figure 19:
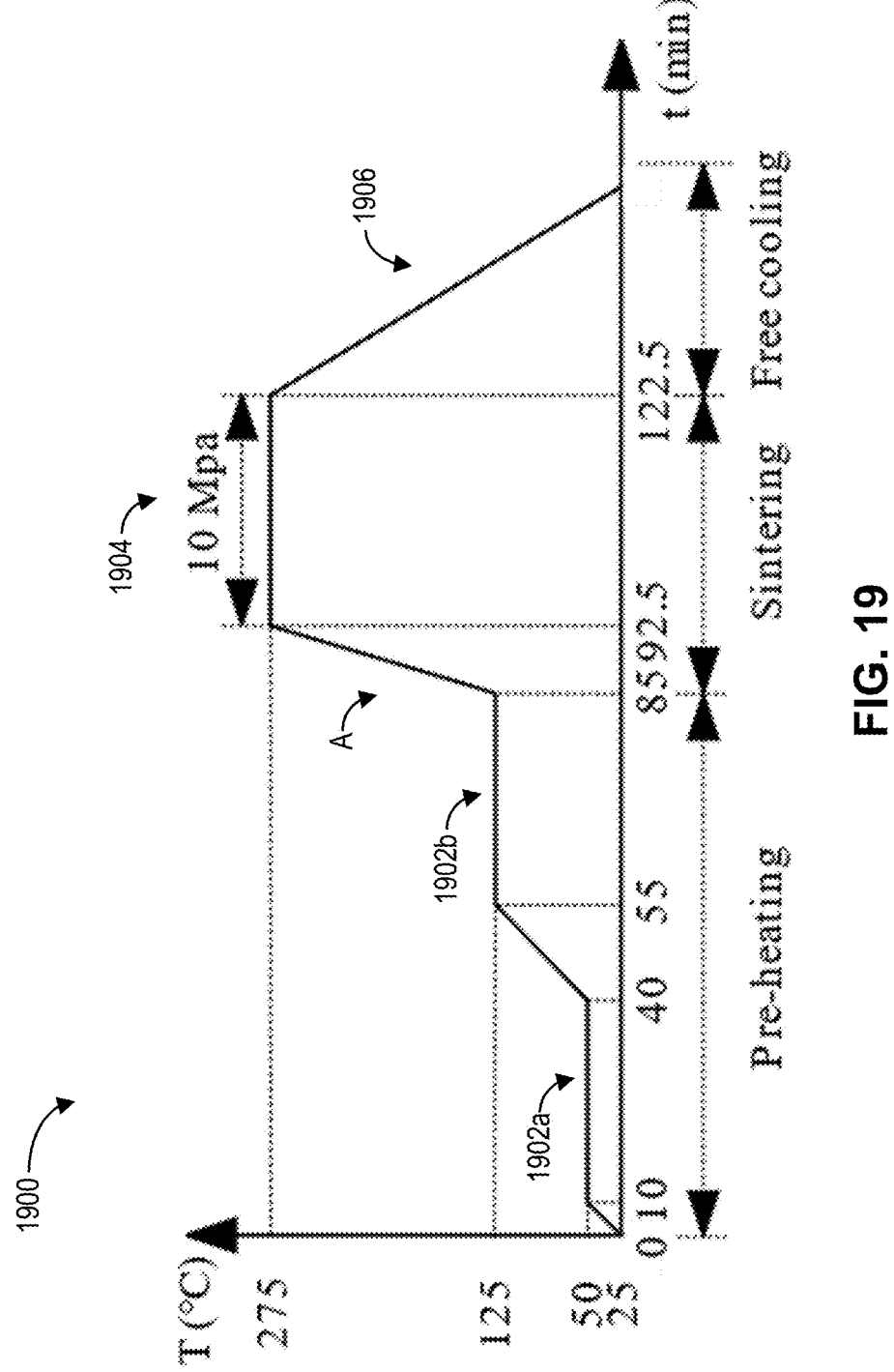
FIG. 19 is a plot showing an example sintering profile.

To this end, FIG. 19 shows a plot 1900 illustrating an example method for sintering nano silver paste onto a sample forming the disclosed packaging (also known as the sintering profile). The method described in plot 1900 can be iteratively applied for each new layer of nano silver paste applied to a sample (e.g., a first layer 112a, and a second layer 112b in FIG. 1).

As shown, at 1902, in the pre-heating stage, the nano silver paste is applied to a surface of a sample (e.g., layer 112a over substrate 108 in FIG. 1, or layer 112b over SiC die surface 102b), and the sample along with the applied paste is initially pre-heated to completely evaporate the organic constituents in the nano silver paste. In some example cases, the sample is pre-heated at 50° C. (1902a), and then at 125° C. (1902b).

At 1904, at the sintering stage, the temperature, which the sample is subject to, is quickly increased to perform sintering and achieve densification. For example, the temperature can be increased to 275° C., and over a time span of approximately 7.5 minutes (time period "A"). In other cases, the temperature is increased in a range of 250° C.-280° C., and over a time span of 7-15 minutes. These values are empirically determined to result in the necessary sintering and densification.

In the sintering stage, at 1904, pressure is also applied to connect two elements via the paste (e.g., during the temperature increase). For example, at the sintering stage 1904, the SiC die surface 102a and first ends 110a_1, 110b_i of respective leads 110a, 110b are positioned to overlay the respective substrate portions 108 with the applied nano silver paste layer 112a (FIG. 1), and pressure can be applied to connect these elements together. In other cases, a distal end of each lead 110a_2, 110b_2 can be pressured into contact with the surface 102b of the SiC die, i.e., via the applied nano silver paste layer 112b. In some example cases, the applied pressure is in a range of 5-20 Mpa. In other cases, the applied pressure is approximately 10 Mpa. The pressure can be applied, for example, along the z-axis (FIG. 1).

Finally, at 1906, in the free cooling stage—the sample is free cooled to room temperature (e.g., 25° C.).

Figures 20, 21A, 21B:
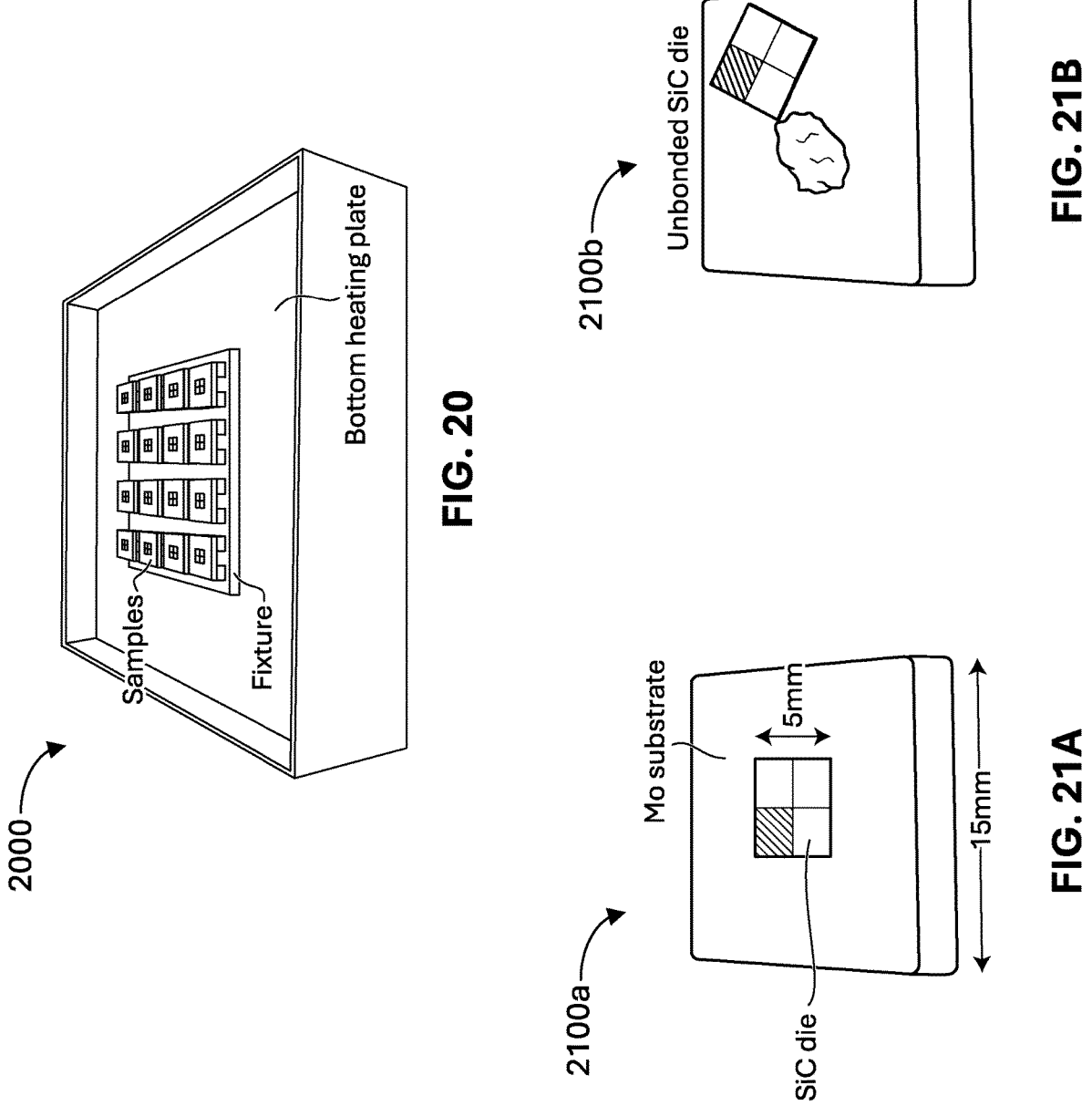
FIG. 20 is an image of a manufacturing setup.
FIGS. 21A and 21B are images of sintered samples, including a sample with ruthenium (Ru)/silver (Ag) coated molybdenum (Mo) substrate, and a sample with bare Mo substrate.

In at least some example cases, the entire process shown in plot 1900 occurs in an air environment, as oxygen may be needed to evaporate the organics. A heat-press may be used to manufacture the packaging samples, as shown in image 2000 of FIG. 20.

In at least one example, a nano silver paste of around 60 μm thickness is screen printed onto Mo substrates using a customized stencil.

As introduced, both bare Mo and Mo coated with ruthenium (Ru)/silver (Ag) are evaluated. The sintered samples are shown in images 2100a and 2100b in FIGS. 21A and 21B, respectively. It was determined that the bonding with bare Mo substrate failed, as the SiC die falls off the substrate with a very gentle push. The surface of the bare Mo substrate is partially oxidized. However, the SiC die was successfully bonded on the Ru/Ag coated Mo substrate. Accordingly, prior to applying the nano silver paste (i.e., plot 1900), the Mo substrate 108 is initially coated with Ru/Ag to enhance the bonding with the nano silver paste 112a.

Figure 22:
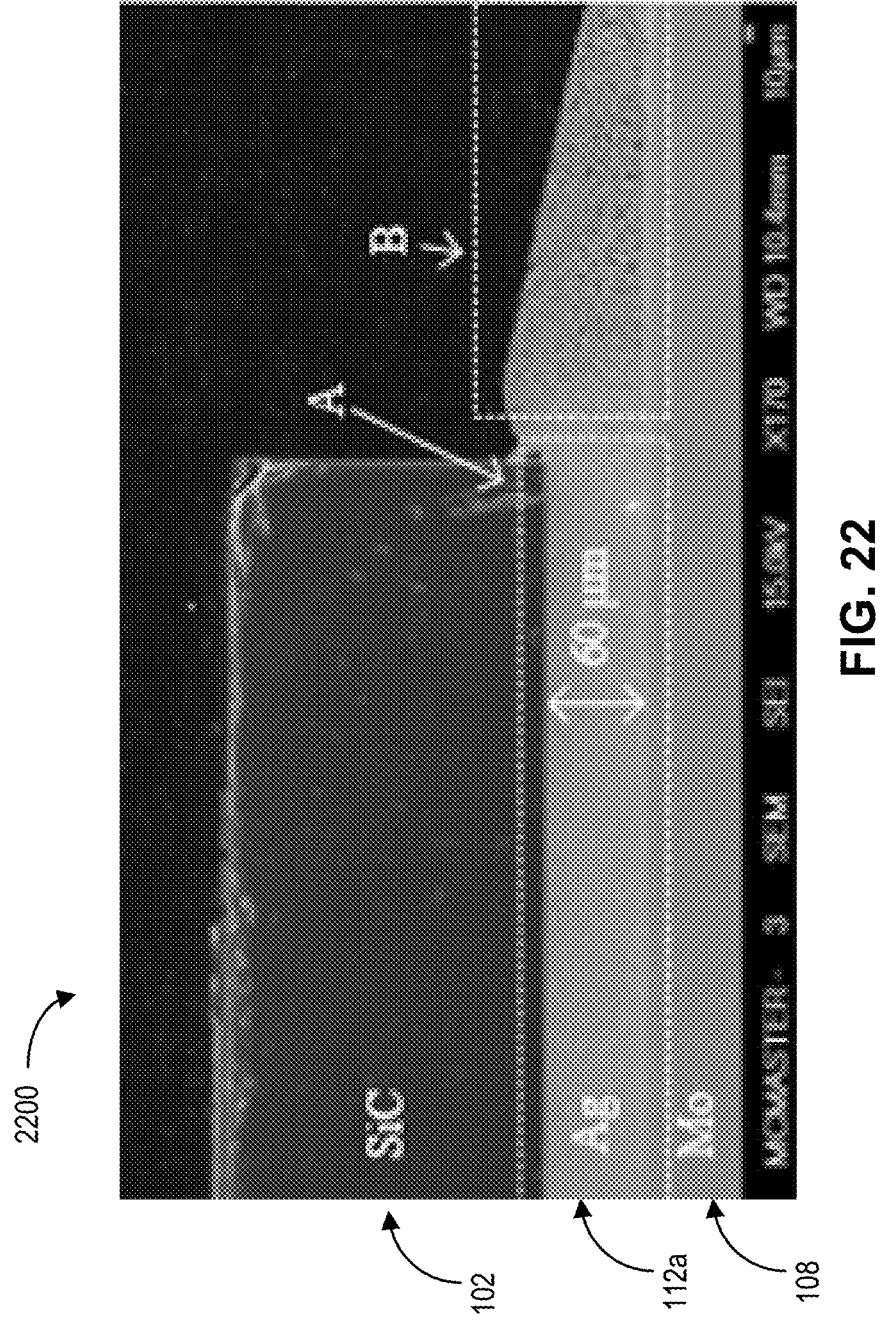
FIG. 22 is a scanning electron microscope (SEM) image of a sintered sample with ruthenium Ru/Ag coated Mo.

To further evaluate the bonding quality, scanning electron microscope (SEM) was used to image the bonding line. As show in FIG. 22, a sliver layer 112a around 60 µm is formed between the SiC chip 102 and the Mo substrate 108. In area "A" where the pressure is applied, a very dense bonding line is achieved, and no cracks or large voids were located. Further, the porosity of this area was found to be significantly smaller than what is reported in Knoerr's and Yu. Therefore, it was expected to exhibit better performance regarding strength and reliability. On the contrary, more and larger pores can be seen in area B (excessive silver materials outside of the die area) where the pressure is not applied. This demonstrates that pressure can help achieve a better bonding quality.

Overall, a feasible process of sintering the die on the Mo substrate—including the metallization, the temperature profile, and the pressure value—demonstrates that the SSM packaging is manufacturable.

In some embodiments, the silver sintering process can be done using micro-scale silver particles, which require external pressure of about 9-40 MPa. However, the silver sintering process can also be done using nano-scale silver particles. Superior sintering quality can be achieved by using nano-scale silver particles without applying external pressure. This is mainly because the total surface area and energy increase with the reduction of particle size. Therefore, the driving force of the diffusion sintering is enhanced. For example, using nanoscale silver particles with a size of around 11 nm can improve the shear strength of the sintered Cu—Cu bonding by over four times, compared with using fine silver particles with a size of around 100 nm.

Sintering temperature may also affect the sintering quality. Higher sintering temperature can enhance the diffusivity of atoms, however, excessive temperature could result in damage to semiconductor dies. A lower sintering temperature can be preferable to reduce manufacturing costs and to reduce thermal-deterioration of materials in the SSM packaging during the sintering process. For example, the insulator material Bismaleimide Triazine (BT), which has a glass transient temperature of 265° C., may be sensitive to thermal-deterioration. However, a higher sintering temperature may be preferable to achieve a satisfactory bonding quality. Generally, the sintering temperature range of about 160° C. to 350° C. can be used.

Sintering time may also affect the sintering quality. The sintering time should ideally be long enough to complete the diffusion; however, studies have found that improvement may be unnoticeable if the sintering time exceeds 30 minutes.

Silver sintering could exhibit selective results with different contact surfaces. In conventional packaging designs, semiconductor dies are normally bonded to Cu substrates. However, studies have shown that the bare copper surface may not be ideal for silver sintering in the air, as Cu may get oxidized at the sintering temperature, and the formed CuO/Cu$_2$O structures will prevent the inter-diffusion between Ag and Cu and decrease the bonding strength, especially the power-like Cu$_2$O particles. Moreover, these oxidation structures can degrade the lifetime of the bonding. When the contact surface has lattice structure close to that of Ag and is not prone to oxidation, the sintering result can be improved. For example, Ag and Au surfaces can be used as contact surfaces for SSM packaging.

In one embodiment of the SSM packaging, SiC dies are sintered on Mo substrates. However, as Mo has a different lattice structure than that of Ag, and it is possible to be oxidized at the sintering temperature, an additional coating may be utilized to improve sintering results.

The surface roughness ($R_a$) of contact surfaces can also affect the sintering quality. The surface roughness of the contact surface should be noticeably larger than the silver particle size (8-12 nm) to allow silver particles to form mechanical interlock with the contact surface. However, $R_a$ of the Mo surface should also be much smaller than the bond-line thickness (around 50 µm) to avoid affecting the consistency of the sintering quality across the bond-line. In one embodiment, $R_a$ of the SiC die surface can range from 30 nm to 120 nm. In one embodiment, $R_a$ of the Mo surface can range from 1 µm to 25 µm. For example, the $R_a$ of the SiC die surface and the Mo surface can be 60 nm and 1 um, respectively.

Figure 24:
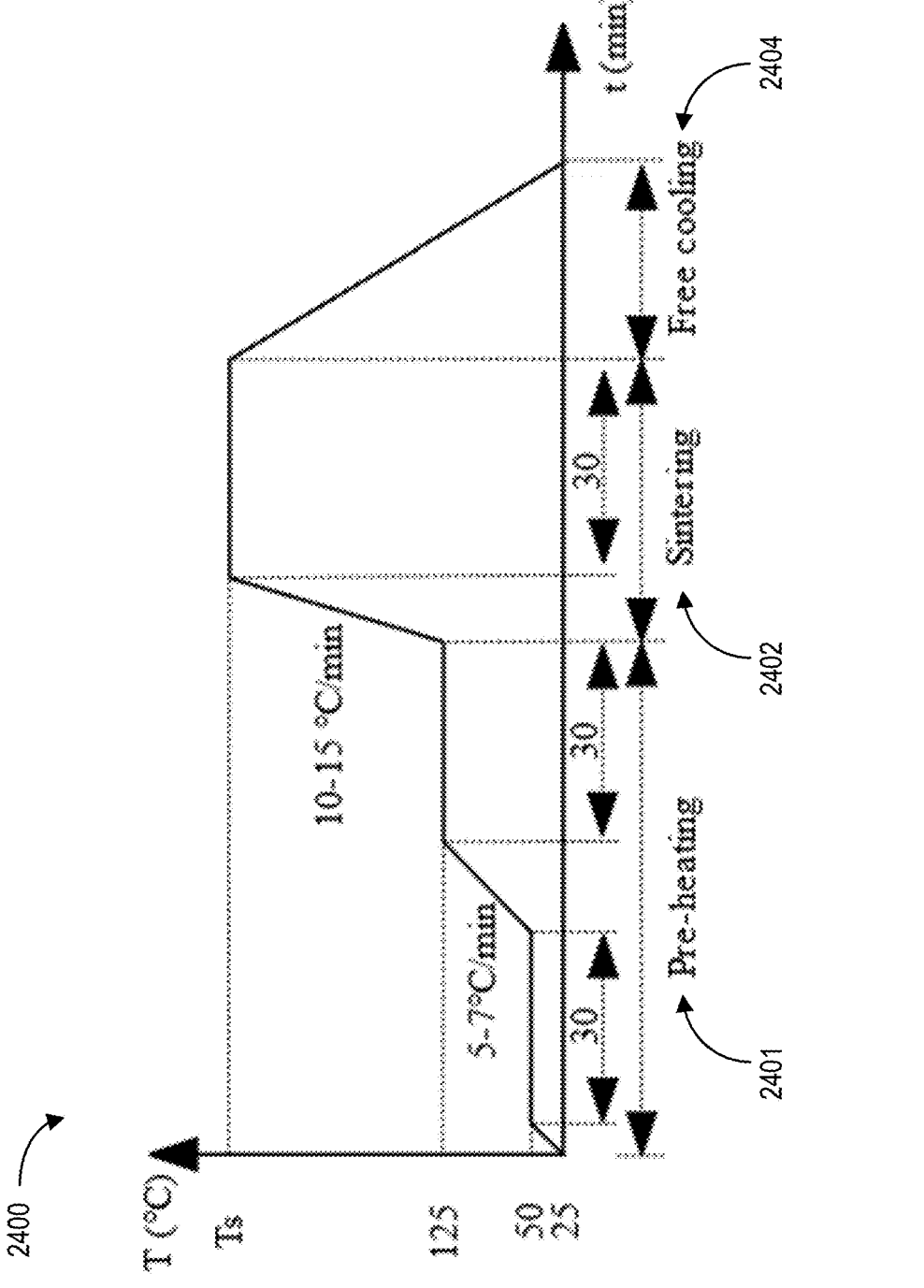
FIG. 24 provides a proposed temperature profile of the sintering process.

FIG. 24 provides a proposed temperature profile 2400. Sintering temperature and can be critical to successfully achieving pressure-less nano-silver sintering in the SSM packaging. At 2401, samples can be pre-heated to evaporate organic matters in the nano-silver paste, including solvent, thinner, binder, and surfactant. These organic matter subjects are preferably eliminated to let the diffusion bonding happen between nano-silver particles and contact surfaces. The sintering process should preferably take place in the air since oxygen is necessary for the evaporation of organics matters in the nano-silver paste. In one embodiment, the pre-heating stage can comprise a two-stage pre-heating temperature profile. A thermo-gravimetric-analysis (TGA) indicated that the two-stage pre-heating can slow down the evaporation process which could reduce the influence on silver particle's densification from outgassing. The two-stage pre-heating temperature profile may begin by heating the sample to around 50° C. for about 30 minutes. The pre-heating stage may continue by heating the sample to around 100° C. to around 125° C. for about 30 minutes. However, evaporation completes at around 125° C., therefore the sample can be held 125° C. The rate of temperature change may be increased by about 5° C. to 7° C. per minute. After pre-heating stages 2401, samples can be sintered at the sintering temperature ($T_s$) for around 30 minutes, see stage 2402. The enhancement of sintering quality may be insignificant when the sintering time increases over 30 minutes. $T_s$ may be changed depending on sintering material properties to determine the most suitable value. Generally, the sintering temperature range of about 160° C. to 350° C. can be used.

Table 5 provides four case studies which feature different $T_s$ and surface conditions of Mo substrates. Considering the reference profile and the glass-transition temperature (265° C.) of the BT resin, $T_s$ was varied from 240° C. to 275° C. Cases A, B and C use Mo substrates coated with a Ni (0.8 µm)/Au (0.1 µm) coating. These coatings can be achieved by e-beam evaporation technique, or any other suitable technique. Case D uses an Mo substrate with no coating. The SiC die may not properly attached to a bare Mo substrate 108 and can be easily peeled off, potentially causing the bare Mo surface to partially oxidize. In one embodiment, the substrate 108 can be coated with a Ni/Au coating to ensure that the MOSFET die 102 is reliably attached to the Ni/Au coated substrate. The coating may comprise a first Nickel (Ni) layer having a thickness of about 0.8 microns. The coating may comprise a second Gold (Au) layer having a thickness of about 0.1 microns. Other suitable materials can also be used for the first and second coating layers.

23

TABLE 5

| | | Sintering trails | | |
|---|---|---|
| Cases | $T_s$ (° C.) | Surface condition of Mo |
|---|---|---|
| A | 240 | Ni/Au coated |
| B | 250 | Ni/Au coated |
| C | 275 | Ni/Au coated |
| D | 275 | Bare Mo |

In one embodiment, the material chosen for sintering can be nano-silver particles with a size of about 8-12 nm. The nano-silver particles can be mixed with organic matters (such as binder, dispersant, and thinner) to form a paste with 82 wt. % weight density.

In one embodiment, Mo substrates can be used, but other substrate materials may also be used. The substrates can be cleaned with Acetone, Methanol, and deionized water before sintering to remove any contaminations.

The nano-silver paste can be applied to the substrates using stencil printing. The pre-sintered thickness can be about 50 µm. The post-sintered thickness can be about 20-30 µm, which can ensure high bonding quality. Generally, a thinner thickness of the bond-line can lead to better thermal and electrical conductivities. However, a thicker bond-line can mitigate the surface roughness and provide sufficient bonding strength, therefore the thickness of the bond-line should be engineered to meet parameters.

Relative density refers to the ratio of the volume occupied by silver to the total volume of the bonding. In cross sections, it can be represented by the ratios of areas. Relative density can be a key parameter in evaluating the bonding quality. A higher relative density means fewer pores and vacancies, therefore, less opportunity for cracking initiation and propagation. Furthermore, higher relative density may also lead to better thermal and electrical conductivities. Relative density higher than 70% is considered to be a good overall performance quality, and a relative density of 80% or higher marks an excellent overall performance, especially reliability.

FIG. 25 provides a chart of the relative densities of cases A, B and C from table 5. The samples of cases A, B and C were observed under SEM, and relative densities of different spots were calculated. The relative distance refers to the ratio of the distance from a point to the left edge and the total length of the bonding line. The left and right edges have lower relative densities since the mismatched thermal-expansion between materials causes uneven internal pressure, resulting in lower relative densities on the left and right edges.

Peak relative densities of all three cases are higher than 95%. The average relative densities in all three cases are above 80%. Also, the majority of bonding lines are denser than 70%, except for some minor regions in case A. This indicates that all three cases result in an acceptable bonding quality. However, due to the uneven distribution discussion above, case A has a large portion of length whose relative density is lower than 80%. Therefore, the reliability of this case can be noticeably worse than the other two cases. Case B and case C exhibit a similar distribution. Thus, their bonding qualities are close.

Figure 26:
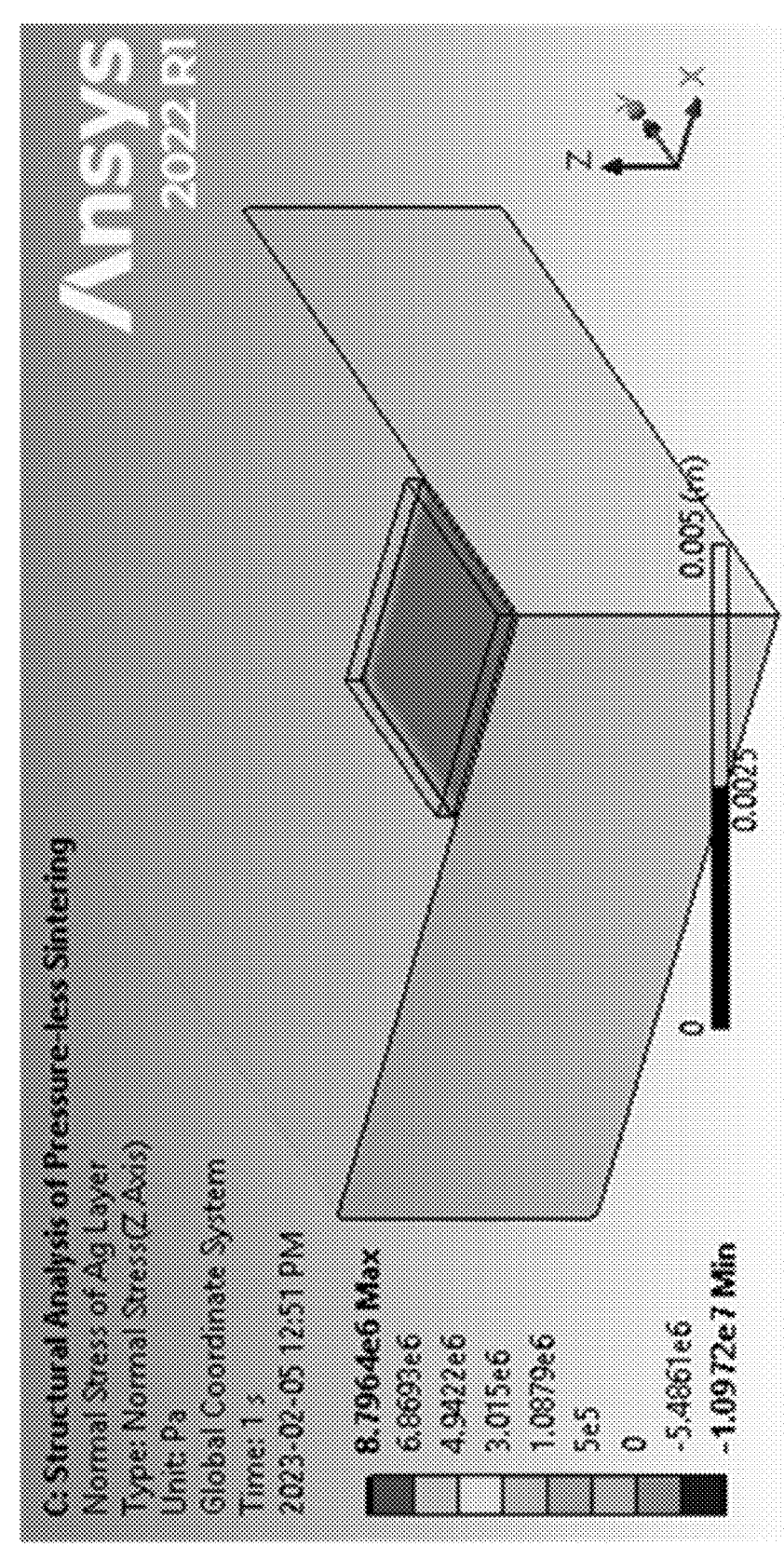
FIG. 26 shows the stress simulation of the silver layer at a $T_s$ of 250° C. using the finite-element-analysis (FEA) software.

FIG. 26 shows the stress simulation of the silver layer at a $T_s$ of 250° C. using the finite-element-analysis (FEA) software, ANSYS Mechanical. To simplify the simulation, only a quarter of the sample is considered since it is a symmetric structure. It can be seen that edges and corners withstand tensile stress in the z direction while the center area is under compression stress, which means particles in the center area receives enhanced driven-force for diffusion bonding, leading to this uneven distribution of relative density.

When external pressure is applied, this uneven distribution of relative density is less noticeable, which indicates the advantage of pressure-based sintering. As aforementioned, a higher $T_s$ could enhance the diffusion bonding between particles, therefore, a higher sintering temperature can also be used to mitigate the uneven distribution of relative density, which can be seen in Case B and Case C in FIG. 25. A suitable $T_s$ for pressure-less sintering can result in a satisfactory bond-line.

$T_s$ is preferably balanced to be as low as possible to avoid affecting the properties of the BT resin, and to be as high as possible to achieve a satisfactory bond-line. Therefore, 250° C. is selected as the most suitable sintering temperature to achieve both satisfactory bond lines and low thermal degradation of the materials. Sintering temperatures in the range of about 160° C. to 350° C. can be used, but a sintering temperature of about 250° C. is preferable.

Relative density of the silver bond-line is dependent on $T_s$. A higher $T_s$ resulted in a greater average density, with 250° C. being the most suitable $T_s$. The sintering quality at 250° C. was close to that at 275° C. While a lower temperature could minimize the impact on the BT resin in the SSM packaging scheme and reduce manufacturing cost.

The sintering profile shown in FIG. 24 with a $T_s$ of 250° C. resulted in an average relative density of 91.36%. And 75% of the total length of the bond-line exhibited a relative density higher than 80%. The bonding quality in this case is better than renowned references. EDS line scan also indicated the formation of Ag—Au inter-metallic joints.

Uneven distribution of relative density was seen for all cases, where the middle region is denser than the edges. This phenomenon is more pronounced in pressure-less sintering due to the lack of an external driving force for the outgassing of evaporated organics. Vacancies at the low side of the bond-line were eliminated before those at the upper side due to the fact that samples were heated from the bottom.

SEM microstructures of the bond-line at different relative distances are shown in FIG. 27. The thickness of the Ag layer bonding the Mo substrate to the SiC (i.e. the bond-line thickness) can be between 20-30 µm to ensure high bonding quality. FIG. 27 provides the SEM microstructures for a nano-silver sintered layer bonding the Mo substrate to the SiC die, conducted at a sintering temperature of 250° C. In this example, the left and right edges typically contain larger pores and vacancies, while the middle region is denser, which agrees with the trend in FIG. 25. The transition regions are located at around 10% and 85% relative distances, where vacancies started to be eliminated. The maximum dimension of vacancies is larger than 10 µm at edges in this example. In transition regions, it shrinks to around 5 µm. In the middle region, only a few small pores with a maximum dimension of less than 1 µm exist due to the uneven internal pressure distribution, especially during pressure-less sintering, which lacks external driven force. Another notable phenomenon is that vacancies on the lower side of the bonding-line is eliminated before the upper side, which can be seen at 20% and 80% relative distances. This is because samples are only heated from the bottom. In one embodiment, the samples may be heated from any side, including the top, or via convective heating.

Figure 28:
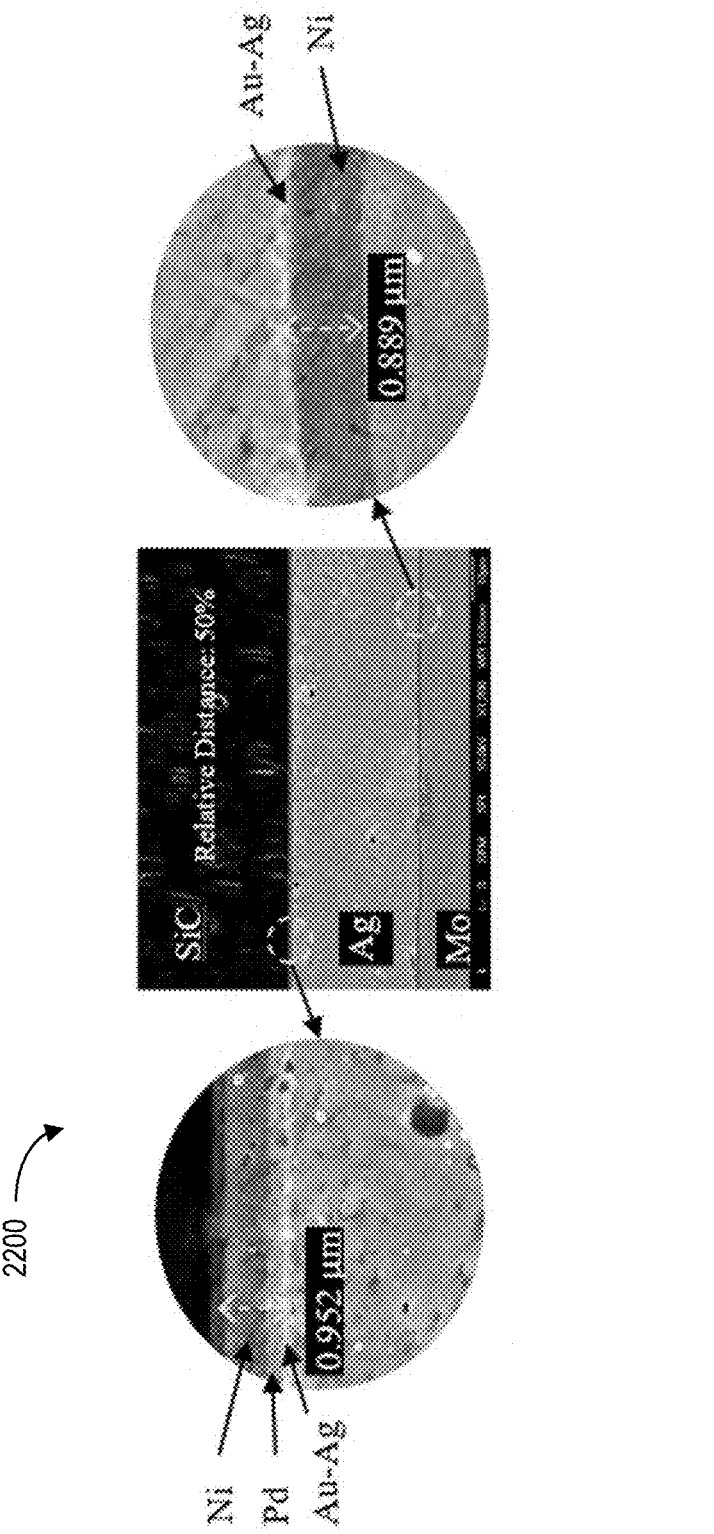
FIG. 28 provides a diagram showing the Microstructures of contact-lines.

Microstructures of contact-lines are shown in FIG. 28. A three-layer stack-up of Ni—Pd—(Au—Ag) is seen at the contact-line between the SiC die and the silver. In this example, the total thickness is measured at approximately 0.9 μm. At the contact-line between the silver and the Mo substrate, there is a two-layer stack-up of Ni—(Au—Ag). In this example, the total thickness is measured as 0.9 μm, close to the designed value during the e-beam evaporation.

Figures 29A, 29B, 29C, 29D, 29E, 29F:
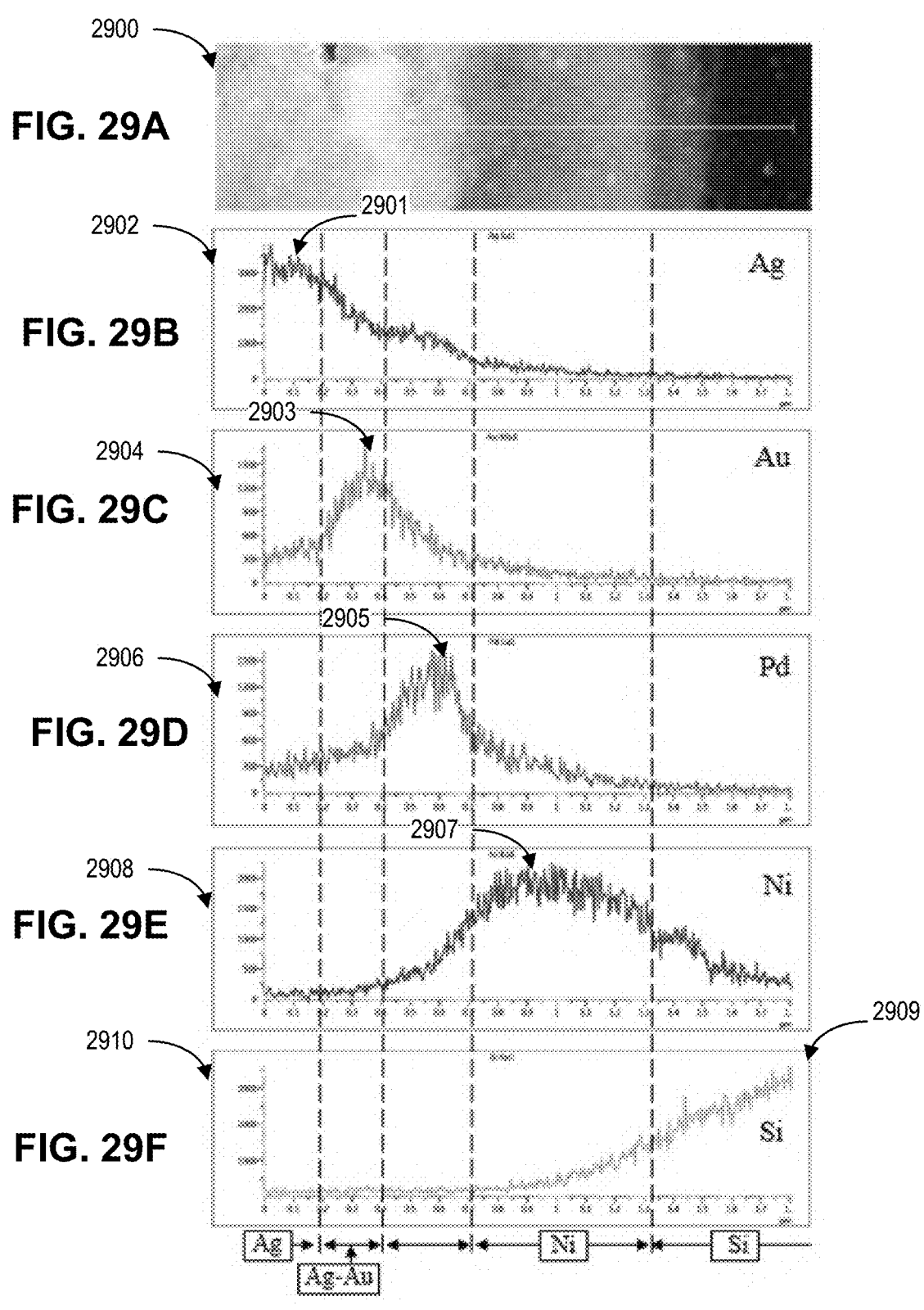
FIG. 29A provides a diagram showing the Microstructures of contact-lines of Ag—Au—Pd—Ni—Si layers.
FIG. 29B provides a diagram showing the EDS line scan analysis of the Ag layer.
FIG. 29C provides a diagram showing the EDS line scan analysis of the Au layer.
FIG. 29D provides a diagram showing the EDS line scan analysis of the Pd layer.
FIG. 29E provides a diagram showing the EDS line scan analysis of the Ni layer.
FIG. 29F provides a diagram showing the EDS line scan analysis of the Si layer.

The Ni—Pd—(Au—Ag) and Ni—(Au—Ag) contact-lines were further analyzed by EDS. EDS line scan analysis detects the elemental composition at contact lines, as illustrated in FIG. 29. FIG. 29A provides a diagram 2900 showing the Microstructures of contact-lines of Ag—Au—Pd—Ni—Si layers. FIG. 29B provides a diagram 2902 showing the EDS line scan analysis of the Ag layer, having a peak at 2901. FIG. 29C provides a diagram 2904 showing the EDS line scan analysis of the Au layer, having a peak at 2903. FIG. 29D provides a diagram 2906 showing the EDS line scan analysis of the Pd layer, having a peak at 2905. FIG. 29E provides a diagram 2908 showing the EDS line scan analysis of the Ni layer, having a peak at 2907. FIG. 29F provides a diagram 2910 showing the EDS line scan analysis of the Si layer, having a peak at 2909.

Figures 30A, 30B, 30C, 30D, 30E:
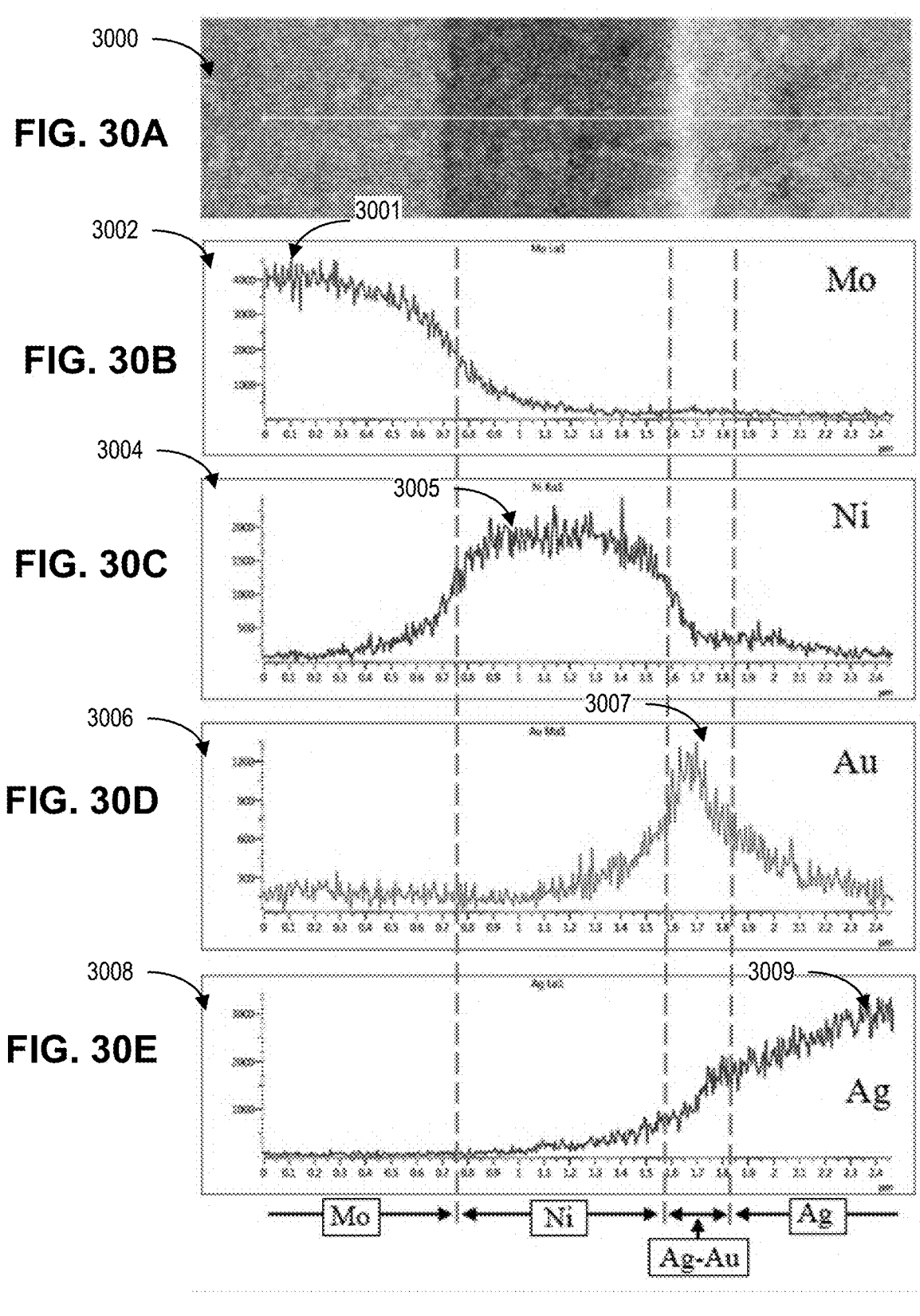
FIG. 30A provides a diagram showing the Microstructures of contact-lines of Mo—Ni—Au—Ag.
FIG. 30B provides a diagram showing the EDS line scan analysis of the Mo layer.
FIG. 30C provides a diagram showing the EDS line scan analysis of the Ni layer.
FIG. 30D provides a diagram showing the EDS line scan analysis of the Au layer.
FIG. 30E provides a diagram showing the EDS line scan analysis of the Ag layer.

In another embodiment, the FIG. 30A provides a diagram 3000 showing the Microstructures of contact-lines of Mo—Ni—Au—Ag layers. FIG. 30B provides a diagram 3002 showing the EDS line scan analysis of the Mo layer, having a peak at 3001. FIG. 30C provides a diagram 3004 showing the EDS line scan analysis of the Ni layer, having a peak at 3005. FIG. 30D provides a diagram 3006 showing the EDS line scan analysis of the Au layer, having a peak at 3007. FIG. 30E provides a diagram 3008 showing the EDS line scan analysis of the Ag layer, having a peak at 3009.

The EDS measurement was performed with an energy of 20 kV, and line-scans consisted of 500 points separated evenly across the 2 μm length of the line. Measurements were taken from each point then the line spectrum is based on each point collected at those evenly separated points. The desired inter-diffusion between silver and the contact surfaces can be found. At the contact line between SiC die and silver, Ag—Au inter-metallic joints are formed. At the contact line between Mo and silver, there is also a well-mixed region of Ag—Au. The diffusion barrier effect of Ni and Pd is effective, as there is no Ag penetration into SiC or Mo.

As such, a method of bonding SiC dies on Mo substrates by pressure-less nano-silver sintering process can provide a suitable sintering process for the SSM packaging schemes.

A method of analytical modeling and optimization of power modules is proposed herein. The method is compatible with modules with insulated-metal-substrate (IMS) types of packaging schemes, and more specifically relates to Silver-Sintered Molybdenum (SSM) packaging schemes. A half-bridge power module with SSM packaging is also proposed herein.

Power modules are the main building blocks in power electronic systems. The optimal design of power modules is essential for achieving satisfactory efficiency, reliability, and power density. Power modules typically contain multiple semiconductor dies that are connected to form an electrical circuit When a plurality of semiconductor dies are packaged into a power module, many physical challenges may exist. Thermal management of the module may be required to deal with the heat losses generated by dies. Meanwhile, parasitic elements of the internal conductors affect the switching behavior of devices. One parameter which should be considered is the junction temperature ($T_j$) of semiconductor dies. The junction temperature should be limited to a safety threshold. Another parameter which should be considered is the stray inductance of the main switching loop ($L_s$), which should be minimized to reduce the switching loss and the overvoltage during switching. There exist several methods to evaluate $T_j$ and $L_s$ of power modules. Numerical methods, such as finite-element-analysis (FEA), are accurate but time-consuming, and are mostly used in simulating a fixed structure.

As such, analytical models can be more suitable for rapid calculations during optimization of a power module design.

When designing power modules, there can be a tradeoff between the thermal performance, power density, and $L_s$. Generally, a larger footprint could reduce the Tj, but also reduce the power density and increase the $L_s$. Therefore, co-optimization is needed to ensure balanced performances. Evolutionary algorithms can be applied in this field.

Although the conventional planar packaging with the direct-bond-copper (DBC) substrate is widely-used, new packaging technologies have been proposed in the past two decades in response to the growing need for performance, reliability, and cost. However, it should be noted that different packaging technologies usually require special design methodologies. Silver-Sintered Molybdenum (SSM) packaging is proposed herein and features high temperature durability and long lifetime. SSM packaging is a category of insulated-metal-substrate (IMS) type of packaging, which has a simplified layer stack-up compared to the DBC-based modules. Therefore, directly applying the design methods for the DBC module would be inadequate. An example of the SSM packaging scheme is shown in FIG. 1. The molybdenum (Mo) substrate 108 is integrated on a direct-cooled Mo heatsink 104 using bismaleimide triazine (BT) resin bonding 106, which forms an IMS-type structure. The SiC die 102 is sintered on the substrate, and the interconnections are constructed by planar leads 110.

Figure 31:
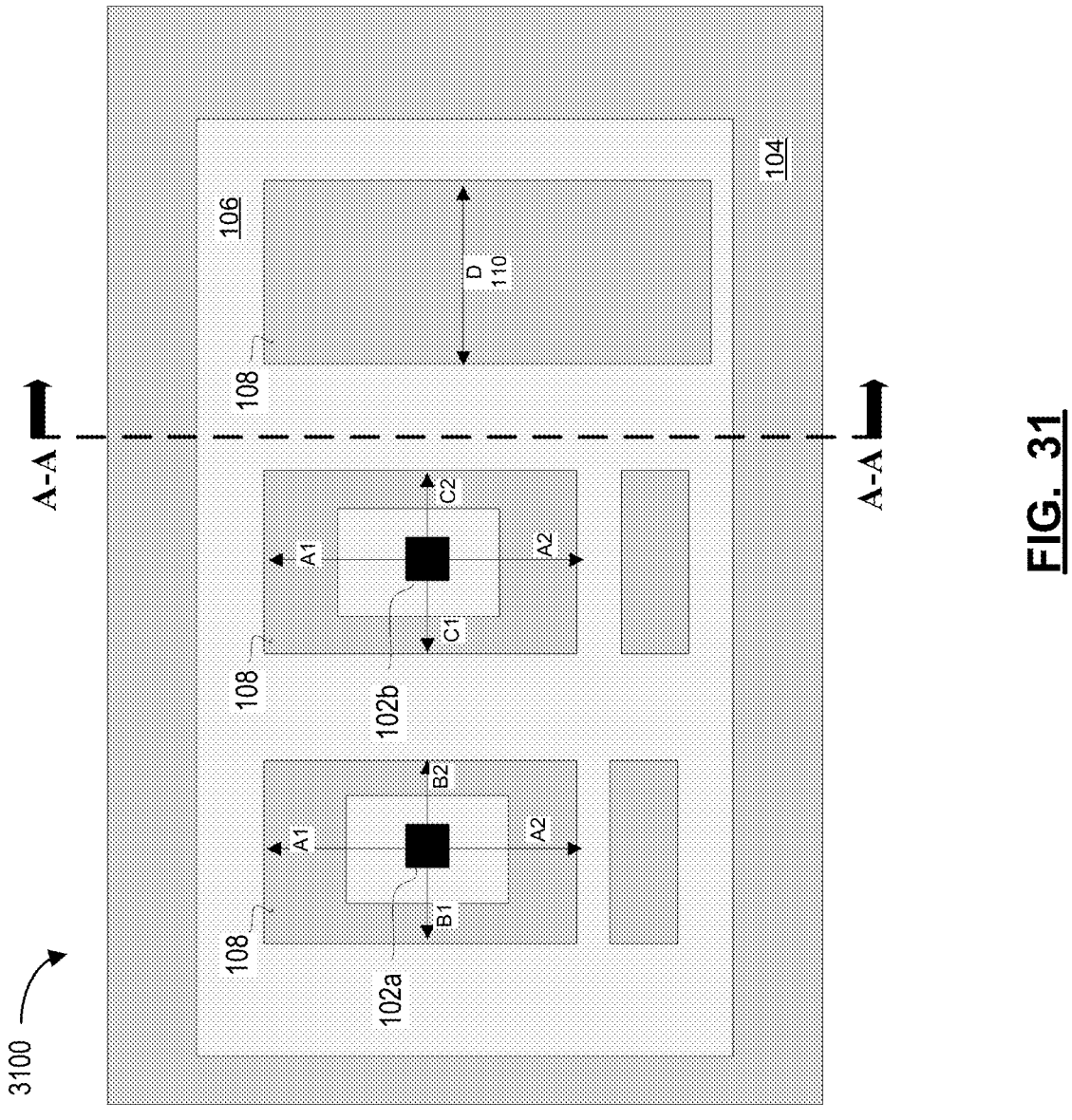
FIG. 31 provides an example of a half-bridge module containing two dies.
Figure 32:
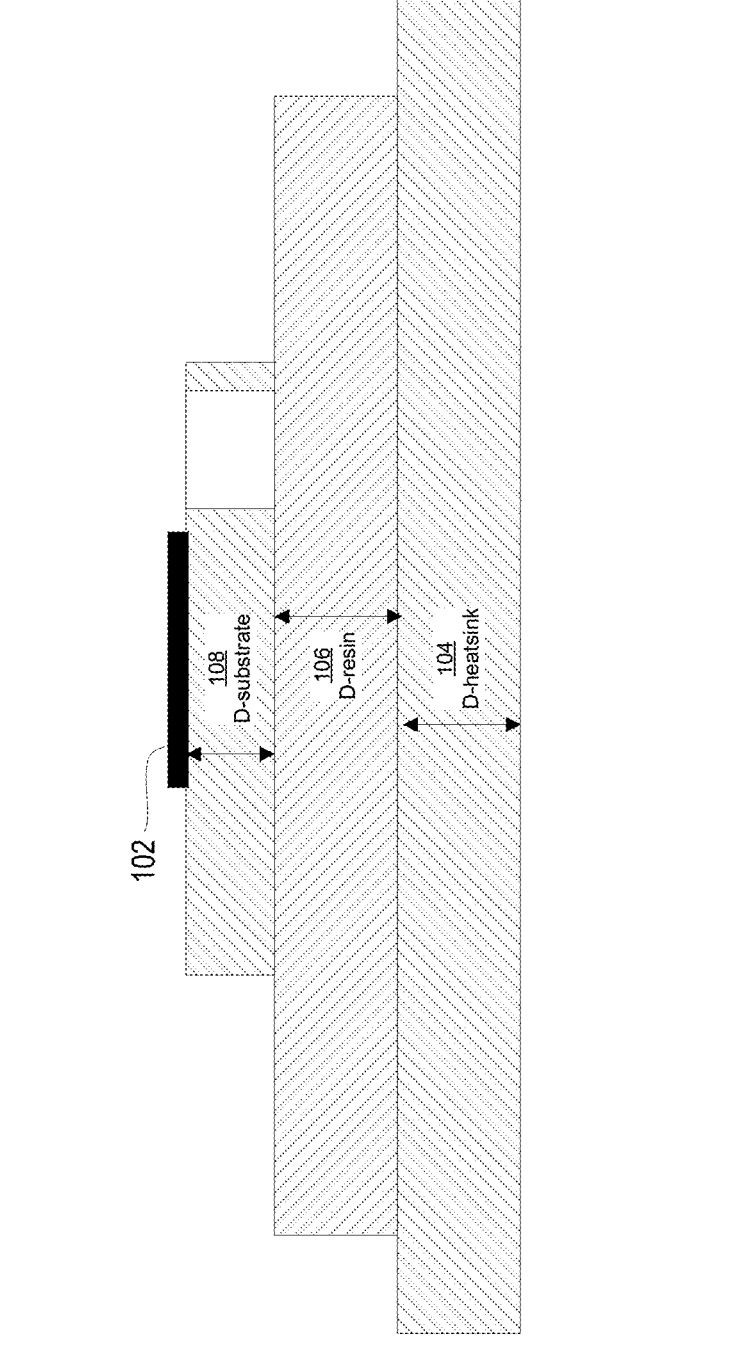
FIG. 32 is a cross-section of FIG. 31, taken along line AA-AA.

The layout of a half-bridge module is shown in FIG. 31, where several geometric parameters can be defined and can be considered as variables in the optimization methodology. FIG. 31 provides an example of a half-bridge module containing two dies 102, however it can be understood that a plurality of dies may be fit on the power module 3100. The SSM packaged module can comprise the substrate layer 108, the resin layer 106, and the heatsink layer 104. The geometries A1, A2, B1, B2, C1, C2 and D can be used to represent the position of the die 102 from its respective substrate. The cross-section of FIG. 31, taken along line AA-AA, is shown in FIG. 32.

Thermal-electrical modeling methods and a co-optimization procedure for SSM power modules are proposed herein. The models proposed herein are configured for the SSM packaging and other similar packaging structures. Therefore, the models when applied on concerned structures, exhibit greatly improved accuracies compared with existing thermal-electrical models that are designed for power modules with the conventional packaging. Meanwhile, as analytical models, they typically require no calibrations using numerical simulations, which can enable faster calculations than methods involving simulations. The co-optimization method also provides a working procedure for the optimal design of half-bridge SSM power modules.

Thermal Model

Thermal management can be essential in power module design. The temperature distribution, especially Tj at dies, can affect the reliability and lifetime of the device. Typically, it is required to keep the Tj within a safe range, for example, the threshold may be 200° C. for the considered SSM packaging. It can also be important to ensure that the difference of Tj between different dies is limited.

Figure 33:
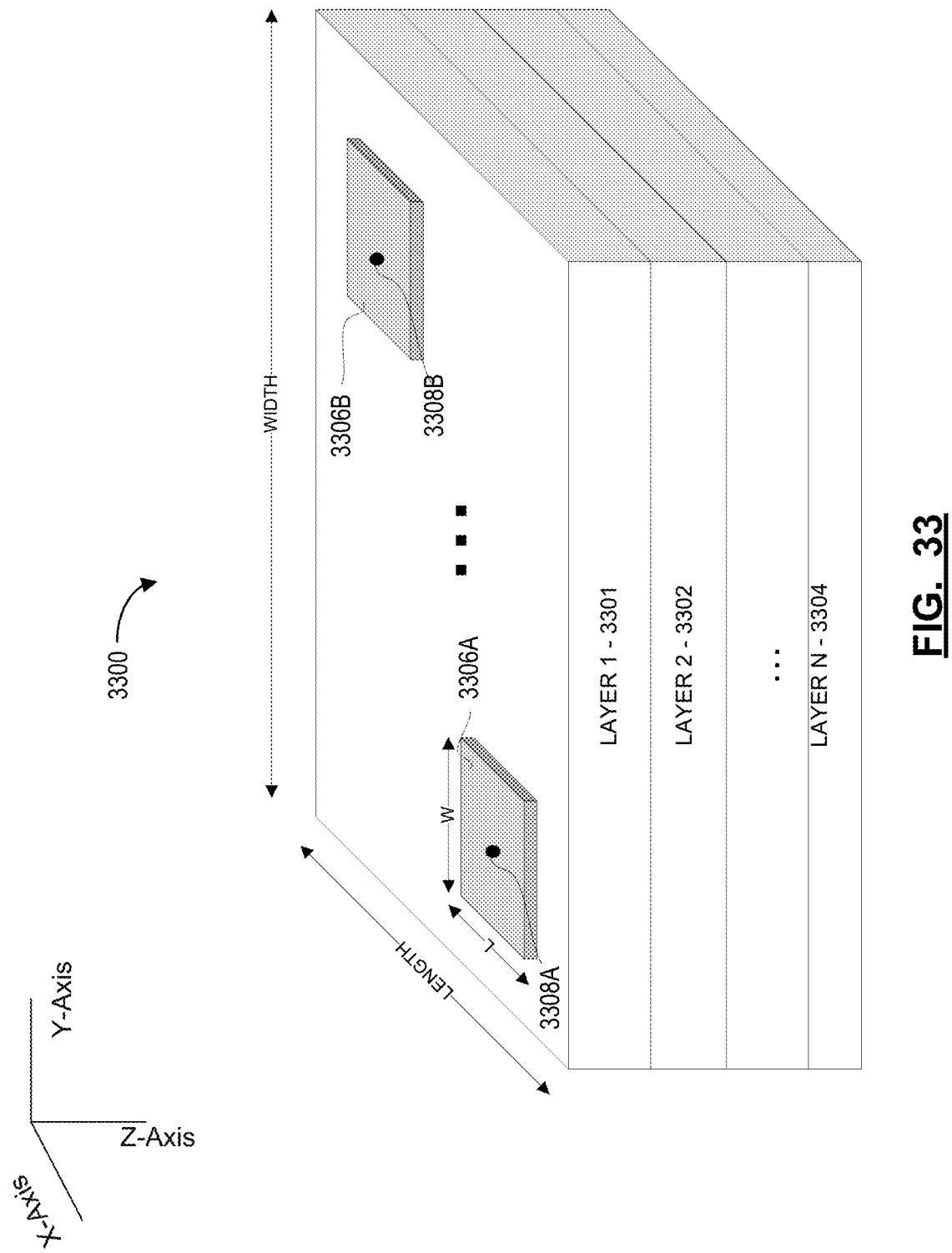
FIG. 33 is a schematic diagram of the simplified geometry of the internal structure of a power module.

The simplified geometry of the internal structure of a power module 3300 is illustrated in FIG. 33. In one embodiment, the internal structure of power modules is similar to a stack of cuboid layers with a unified section area. A plurality of rectangular areas 3306 can be identified on top of the first layer 3301 of the power module stack 3300. The power module may comprise a plurality of layers 3301, 3302 . . . up to layer N 3304. The plurality of rectangular areas 3306 receive heat flux, representing the corresponding areas on the substrate, and are equal in size and shape to the die area. At point 3308A, the position of a first die 3306A can be represented by geometric coordinates on the (X,Y,Z) axis. At point 3308B, the position of a subsequent die 3306B can be represented by geometric coordinates on the (X,Y,Z) axis. For instance, the coordinate for die 3306A can be referred to as $(X_A, Y_A, 0)$; and the coordinate for die 3306B can be referred to as $(X_B, Y_B, 0)$. If multiple heat sources exist, the total temperature field is the summation of all temperature fields when considering each heat source individually due to the linearity of this heat transfer problem.

The governing equation for the steady-state 3-D heat transfer is shown in Equation (1) of FIG. 35. The boundary conditions for an example power module geometry can be summarized by equations (2), (3), (4) of FIG. 35. Here, $\theta$ refers to the temperature rise, which is the temperature difference between the specific location and the coolant. $k_i$ denotes the thermal conductivity of the $i_{th}$ layer. $z_i$ refers to the bottom of the $i_{th}$ layer, which equals $E_{ij}=1\ d_j$, where $d_i$ is the thickness of the $i_{th}$ layer. P is the heat flow at each heat input area. h is the equivalent convection coefficient at the bottom. The geometrical variables, including $X_D$, $Y_D$, I, w, L, and W, can be found in FIG. 33.

This problem can be solved by the Separation of the Variable (SOV) method. The general solution is given in (5) in FIG. 36. $A_{i0}$, $B_{i0}$, $A_{im}$, $B_{im}$, $A_{in}$, $B_{in}$, $A_{imn}$, and $B_{imn}$ are parameters to be determined by integral and differential operations of boundary conditions. An iterative method can be used to derive those parameters.

In one embodiment, the SSM power packaging can have a three-layer configuration. In the proposed method, the temperature distribution of the heatsink layer 104 is needed to calculate the junction temperature ($T_j$). The required parameters are solved and elaborated in FIG. 37 and FIG. 38, equations (6) to (18). With those parameters, the temperature field can be easily expressed using equation (5) and (19).

In one embodiment, The SSM power packaging has a three-layer configuration, as shown in FIG. 32. The required parameters are solved and elaborated in (6) to (18). With those parameters, the temperature field can be easily expressed using (5) and (19). Intermediate parameters needed for equations (11) to (13) are defined in (14) to (18), shown in FIG. 38. $T_j$ can be dependent on the coolant temperature ($T_{coolant}$) and the temperature-rise at the die bonding layer and the die layer, as shown in (19).

A brief introduction of the solving process of Fourier parameters is given in the following paragraphs, which is based on an iterative process. STEP 1: Obtain $B_{1m}$, $B_{1n}$, $B_{1mn}$, and $B_{10}$. Substitute Equation (5) into Equation (2) and solve it. Then, Equation (6), (8), (9), and (10) are obtained. STEP 2: Obtain $A_{10}$: It may be beneficial to assume a two-layer structure. Using the bottom surface boundary condition, (Equation (4)) and Equation (5), Equation (20) can be obtained. Similarly, using the interface boundary conditions see Equation (3), and Equation (5), Equation (21) and (22) can be obtained. Next, Equation (23) can be obtained by combining Equation (6) and (21). Also, use Equation (20), (22), and (23), $A_{10}$ for the assumed two-layer structure can be obtained, as shown in Equation (24). Therefore, $A_{10}$ for a three-layer structure (SSM packaging) can be written in the same pattern, as shown in Equation (7). STEP 3: Obtain $A_{1m}$, $A_{1n}$, and $A_{1mn}$ by substituting Equation (5) into Equation (4) and solving. Then, Equation (15) is obtained. Substituting Equation (14) into Equation (25) and (26), then $A_{1m}$ can be solved. $A_{1n}$ and $A_{1mn}$ can be obtained in a same fashion.

The aforementioned original Fourier-based method can have limitations. For instance, areas of all layers are assumed equal, which may not be realistic. For example, the heatsink layer is usually larger than the substrate layers. Thus, there should be an equivalent area assigned for all layers. Defining the equivalent area is essential to achieve accurate estimation using Fourier based thermal models. In practice, the equivalent area should be defined based on the thermal-coupling and heat spreading. In another word, the equivalent area should represent where the main heat flux pass through horizontally.

Furthermore, all layers are assumed to be a single and united body. However, in power modules, some layers are separated into segments, such as the top tracing layer of the substrate. This assumption does not have a noticeable effect on conventional power modules, because their tracing layer can be very thin and have little impact on the heat spreading. However, this could lead to significant errors when applied in IMS-type modules.

IMS-type packaging is featured with a sandwich structure. Unlike the conventional packaging, where the baseplate is the main heat spreader, the heat spreading in IMS-type modules mostly occurs at the thick substrate layer. Also, because of the extremely low k of the resin layer, the thermal coupling between different substrate segments can be minimal. The horizontal heat flux commuting between different segments can be extremely low and neglectable. Therefore, in IMS type modules, each segment should preferably be considered individually.

Figure 34:
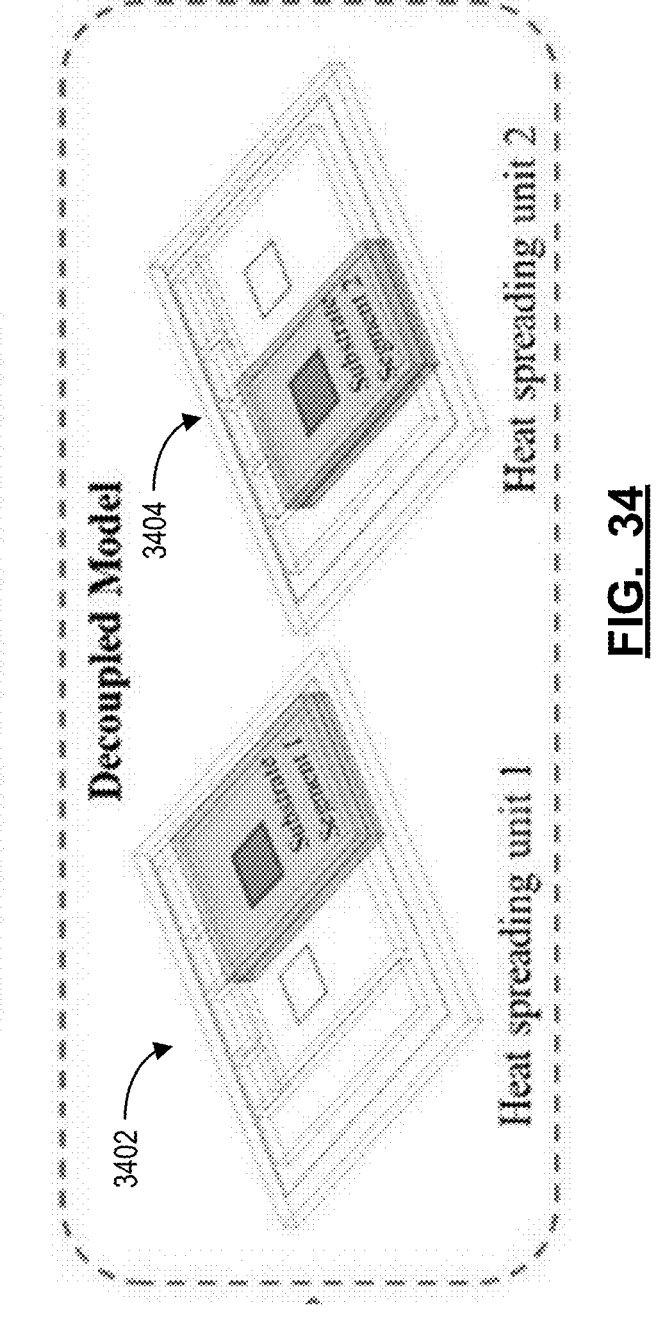
FIG. 34 provides a diagram showing the decoupling of a half-bridge module with two dies.

To capture the unique heat transfer characteristics of IMS-type modules, a decoupling method is proposed. The decoupling of a half-bridge module 3400 with two dies 3306A and 3306B is given in FIG. 34 as an example. In this embodiment, there are two substrate segments 3402 and 3404 that are receiving the heat flux. The volume under each segment is considered as an individual heat transfer unit, which is utilized to calculate the Tj of the corresponding die using the Fourier-based method. The equivalent area for each individual calculation equals to the area of the corresponding Mo substrate due to aforementioned reasons.

To evaluate the accuracy of the decoupled Fourier-based method for IMS-type power modules, a sample of six cases were simulated using the original coupled model, the decoupled model, and FEA (conducted in ANSYS Mechanical). The geometrical topology follows the schematic shown in FIG. 32, and their dimensions are summarized in Table 6, below. Other dimensions were held constant, specifically, A1=A2=10 mm; D=5 mm; $d_{substrate}$=1 mm; $d_{resin}$=0.2 mm. These simulations covered symmetric and asymmetric designs with different footprints. In simulations, h is 5000 W/m$^2$ X$^\circ$ C. at 105$^\circ$ C. coolant temperature. $P_{loss}$ is 41 W for each die. Tj values from FEA simulations are measured at the center of dies' top surface, which agrees with the Tj definition in the analytical thermal model.

TABLE 6

Dimension of cases for thermal model evaluation.

| Dimensions | Case A | Case B | Case C | Case D | Case E | Case F |
|---|---|---|---|---|---|---|
| B1 (mm) | 10 | 10 | 10 | 15 | 10 | 15 |
| B2 (mm) | 10 | 10 | 10 | 15 | 10 | 15 |
| C1 (mm) | 5 | 10 | 15 | 10 | 5 | 5 |
| C2 (mm) | 15 | 10 | 5 | 10 | 5 | 5 |

Figure 40A:
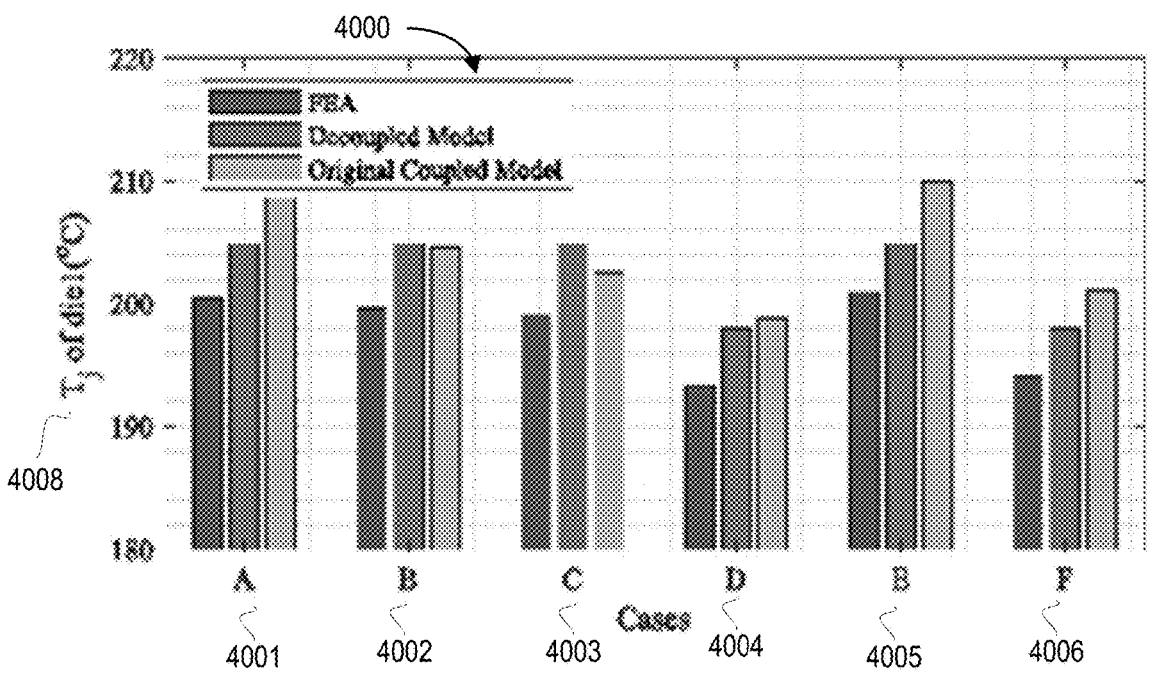
FIG. 40A is a graph plotting the various junction temperatures for each of the 6 test cases.

Tj of die 1 (located on substrate segment 1) are illustrated in FIG. 40A. FIG. 40A plots the Tj of die 1 (4008) providing the FEA results, the decoupled model, and the original coupled model results of case A (4001), case B (4002), case C (4003), case D (4004), case E (4005) and case F (4006). FEA results of cases A, B, and C show that Tj of die 1 is not affected by the area of segment 2, which is also found in results from the decoupled model. Although, the original coupled model fails to capture this trend.

Figure 40B:
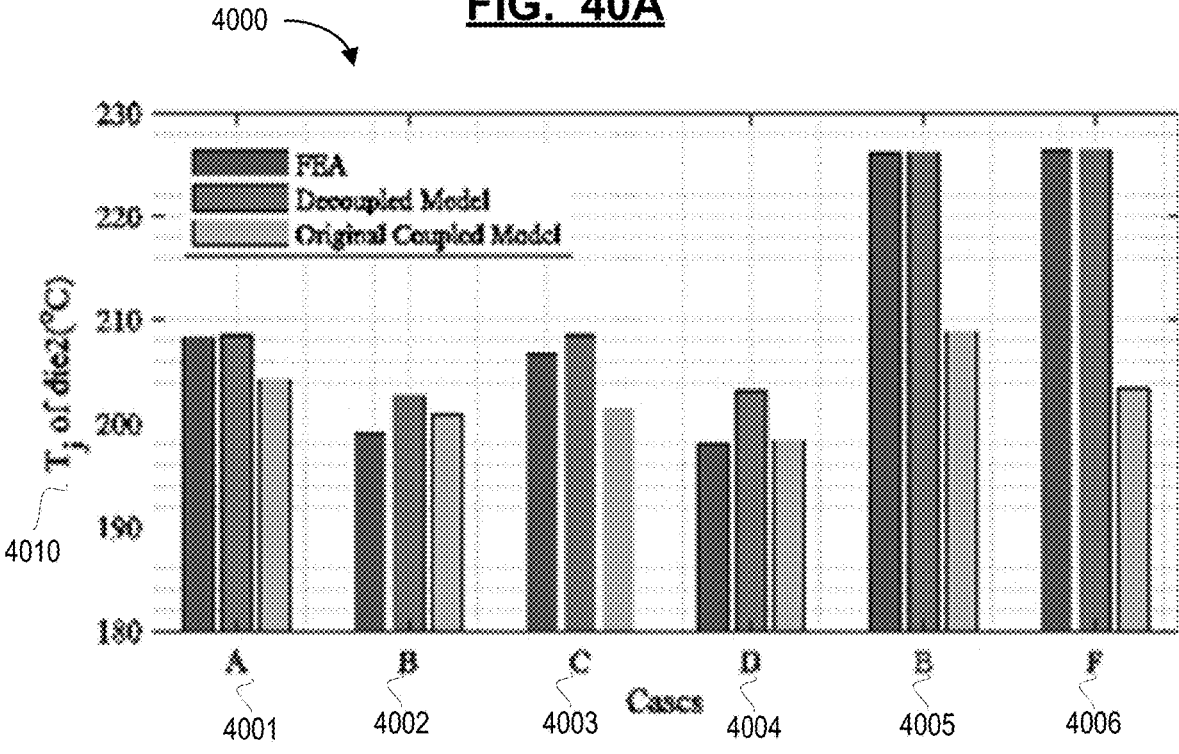
FIG. 40B is a graph plotting the various junction temperatures for each of the 6 test cases.

FIG. 40B shows Tj of die 2. FIG. 40B plots the Tj of die 2 (4010) providing the FEA results, the decoupled model, and the original coupled model results of case A (4001), case B (4002), case C (4003), case D (4004), case E (4005) and case F (4006). In this graph, it can be seen that the original coupled model shows significantly larger errors in cases E and F, where segment 1 is several times larger than segment 2. Overall, when estimating the temperature-rise (Tj–Tcoolant) for symmetric layouts, average errors were about 3.7% and 4.7% for the decoupled model and the original coupled model, respectively. While for asymmetric layouts, they were found to be about 3.2% and 9.5%, respectively.

Figure 41:
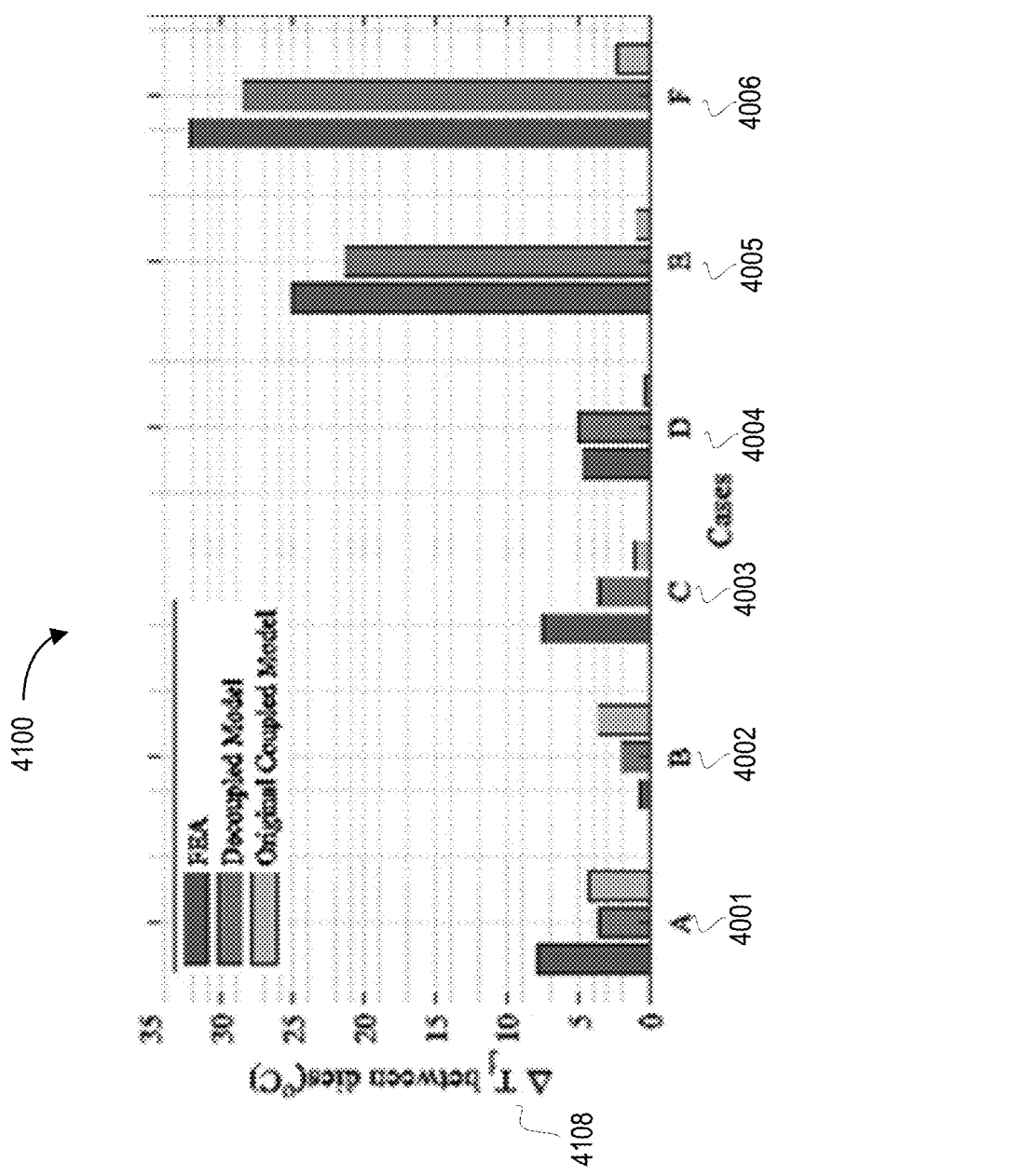
FIG. 41 is a graph plotting the difference between dies of the junction temperatures for each of the 6 test cases.

FIG. 41 is a graph 4100 plotting the difference between dies of the junction temperatures 4108 for each of the 6 test cases; case A (4001), case B (4002), case C (4003), case D (4004), case E (4005) and case F (4006). More importantly, as can be seen in FIG. 41, when using the original coupled model, the estimations of ΔTj 4108 between dies are very inaccurate for asymmetric cases (D, E, and F). Only in case A 4001 does the original coupled model show a slightly smaller error. This is because die 2 is located closer to die 1 instead of at the center of segment 2 in case A, which strengthens the coupling effect between the two segments. Overall, the decoupled model reduced the average error of ΔTj estimation from 93.8% to 10.9% for asymmetric layouts. As expected, the proposed decoupled model exhibits significant benefits for IMS-type modules by considering the barrier effect between the substrate segments and the low thermal spreading at the resin layer. Therefore, accurate calculations can be provided during the design optimization.
Stray Inductance Model Stray inductance leads to overvoltage and contributes to the switching loss of power modules. Therefore, it should be minimized. Power modules typically have busbar-like internal conductors. Therefore, a method called the partial inductance model is adopted in this work, which was initially developed for estimating the $L_s$ of laminated busbars.

Figures 42A, 42B:
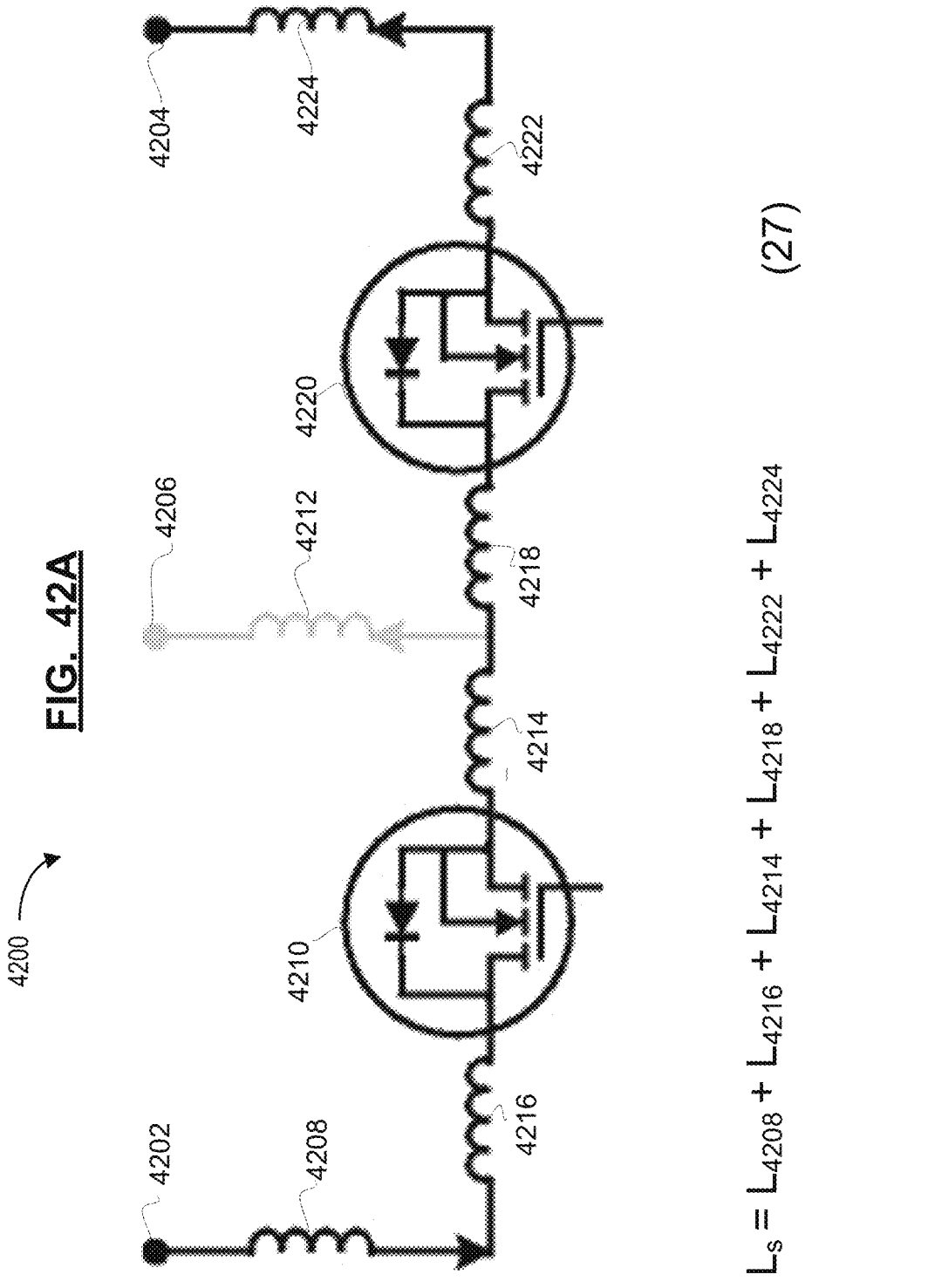
FIG. 42A is a schematic diagram of an electronic circuit showing The total inductance of the power modules' main commutation loop.
FIG. 42B provides equations that can be used for modelling the half-bridge module.

The total inductance of the power modules' main commutation loop ($L_s$) can be of concern, as it contributes to the drain-source over-voltage during switching. Therefore, minimizing $L_s$ can be desired when designing power modules. As highlighted in FIG. 42A, $L_s$ is a combination of several inductance segments (4208, 4216, 4214, 4218, 4212, 4222, 4224). The positive DC terminal is labelled as 4202, the negative DC terminal is labelled as 4204 and the output is labelled as 4206. $L_O$ (output inductance) is shown as inductor 4212. A high-side (HS-MOS) is shown as MOSFET 4210 and a low-side (LS-MOS) is shown as MOSFET

4220. $L_{P\text{-}Tr}$ is shown as inductor 4208, $L_{P\text{-}HD}$ is shown as inductor 4216, $L_{HS\text{-}O}$ is shown as inductor 4214, $L_{O\text{-}LD}$ is shown as inductor 4218, $L_{LS\text{-}N}$ is shown as inductor 4222, $L_{LS\text{-}Tr}$ is shown as inductor 4224. Ls can be defined as the sum of all the inductance measurements in the power modules' main commutation loop. Since there are no overlaps between these corresponding conductors, mutual-inductance can be ignored. Therefore, the total $L_s$ is the summation of self-inductances of all conductor segments, as given in Equation (27) shown in FIG. 42B, but can be defined as Ls=$L_{4208}$+$L_{4216}$+$L_{4214}$+$L_{4218}$+$L_{4222}$+$L_{4224}$.

Figure 43:
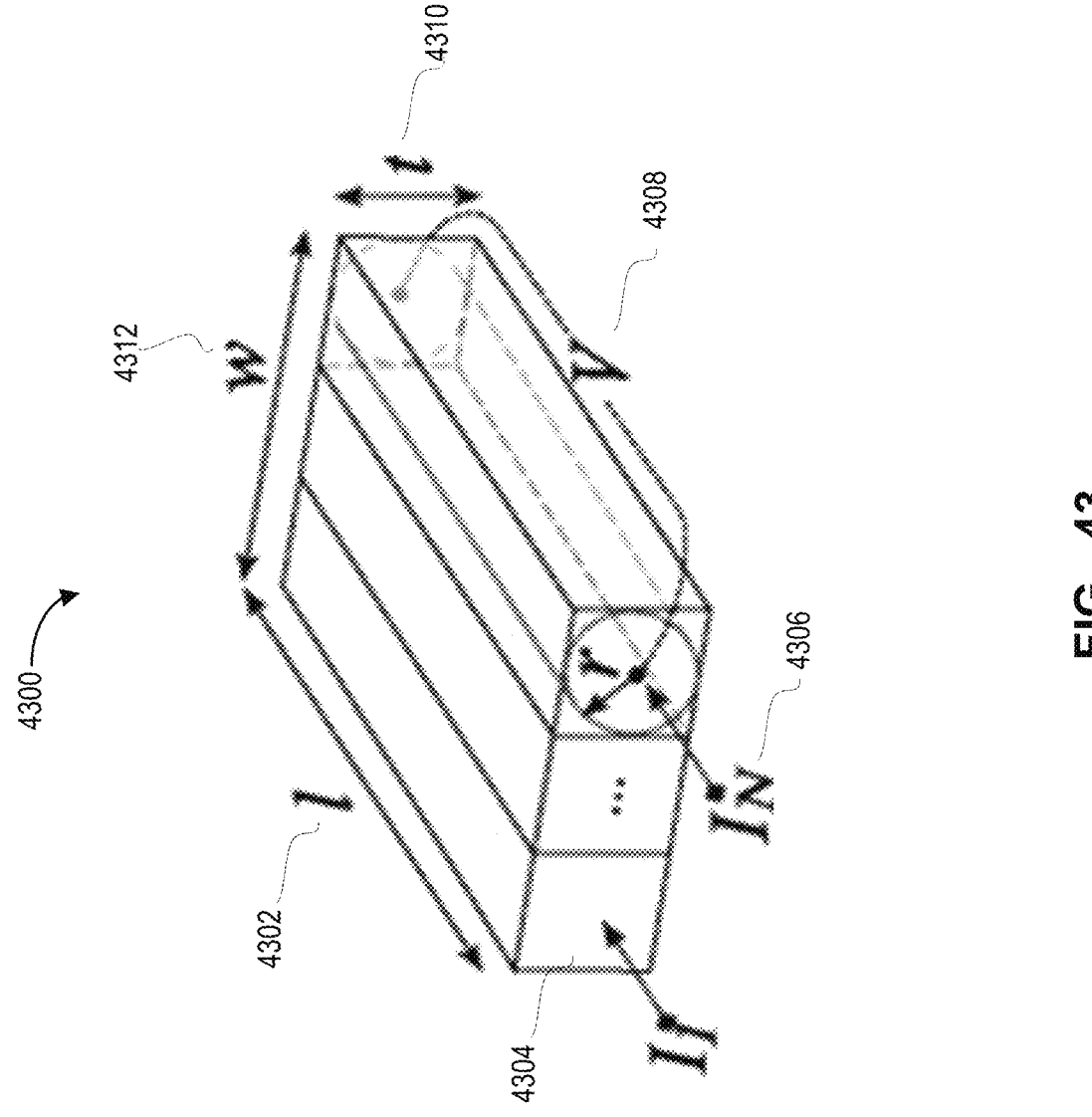
FIG. 43 is a schematic diagram of a wide conductor, separated into N sets of thin conductors in parallel with a square cross-section.

A Partial Inductance Model for Rectangular Conductors can be demonstrated by a wide conductor, which can be separated into N sets of thin conductors 4304 to 4306 in parallel with a square cross-section, as shown in FIG. 43. Furthermore, thin rectangular conductors can be simplified as circular wires whose radius (r) equals half of the thickness (t) 4310. The length of the wires can be represented by l 4302, and the total width of the conductors can be represented by w 4312. The current of each wire is shown as $I_1$ to $I_N$. The self-inductance of a single wire ($L_w$) is obtained in (28), shown in FIG. 44. The mutual-inductance between the ith and jth wires ($M_{w\text{-}ij}$) are expressed in (29), where μ0 (free space permeability) is $4\pi \times 10^{-7}$ H/m, where l is the length of the wire, dij is the center-to-center distance between the ith and jth wires.

The $L_s$ of the wide conductor can be obtained by the combination of the partial inductances of those paralleled wires. The voltage and current of those conductors are described in Equation (30). The matrix is inversed in Equation (31). The total current is the summation of all wires' current, as written in Equation (32). Therefore, the total inductance $L_s$ is given in Equation (33).

Figure 45:
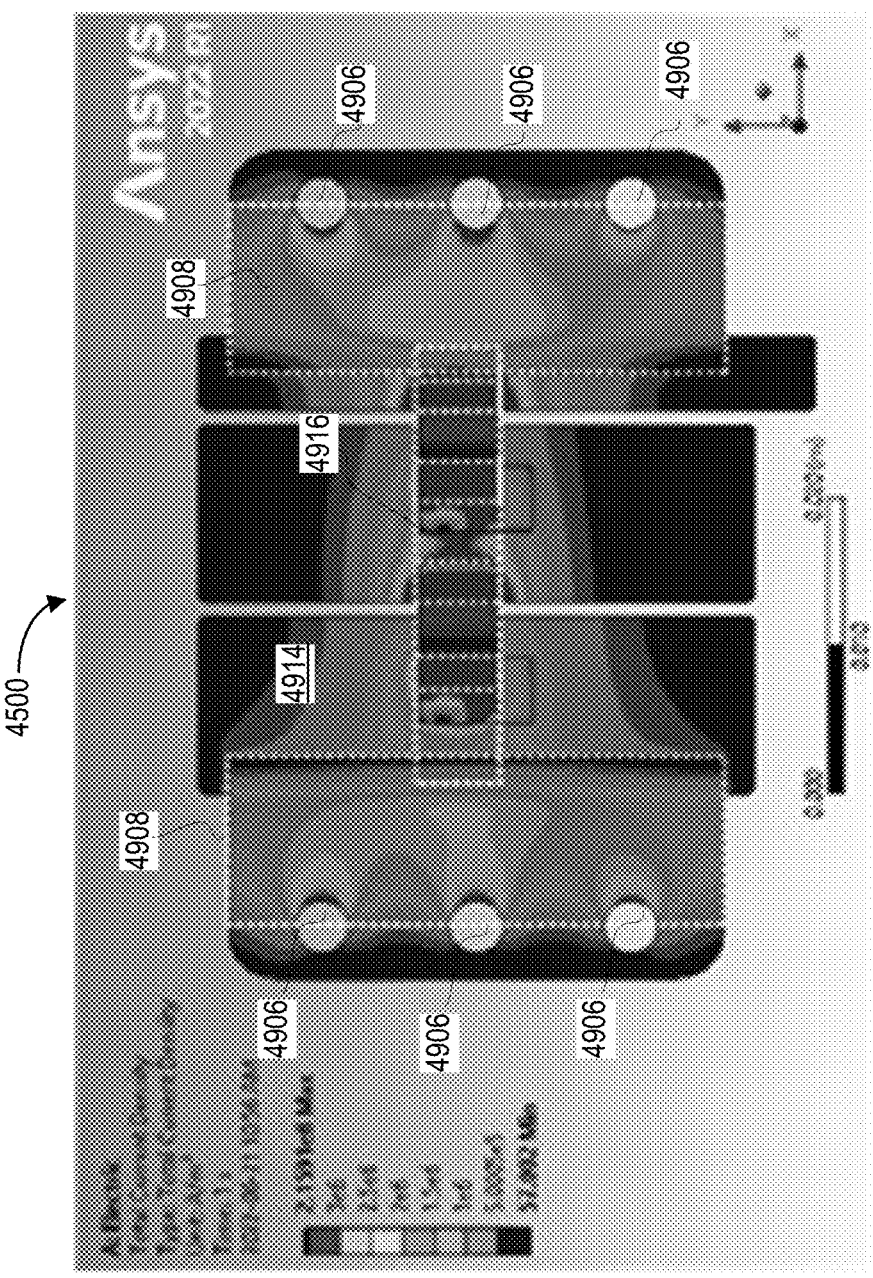
FIG. 45 is a profile of the current density of an SSM module.
Figure 46:
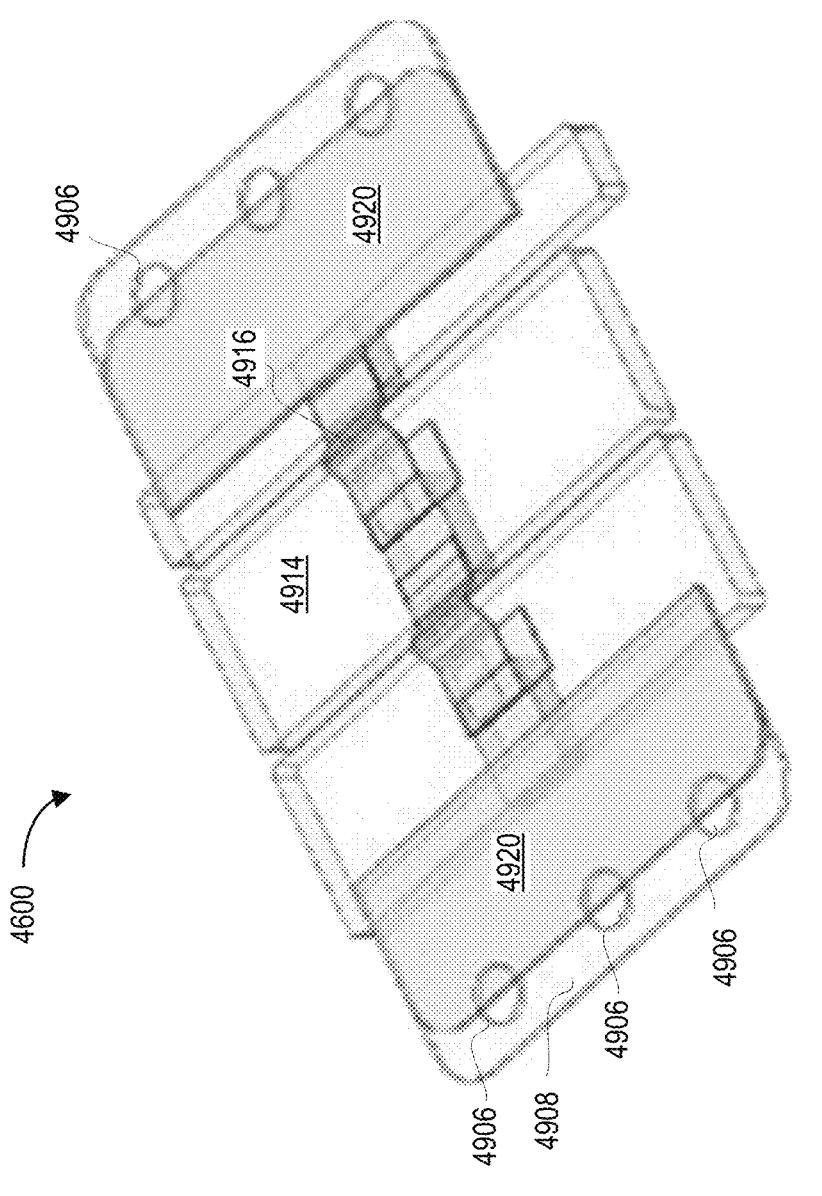
FIG. 46 is a schematic diagram of a half-bridge module.

A profile of the current density of an SSM module is shown in FIG. 45, which illustrates an uneven distribution. In an embodiment, a half-bridge module 3100 can comprise several conductor bodies, including terminals 4906, substrates 4914, and leads 4916. FIG. 46 is a schematic diagram of a half-bridge module 3100. In one embodiment, only the main portions 4920 and 4918 of conductors are considered in the calculation of $L_s$, which are the highlighted parts in FIG. 46. In one embodiment, the half bridge module 4600 can comprise: a substrate 4914; conductor portions 4920; DC positive terminal 4906, DC negative terminal 4908, and leads 4916. In another embodiment, the half bridge module 4900 can include mounting holes 4902, output terminal 4904, heatsink 4910, and resin insulator 4912.

One embodiment of a half-bridge module can be seen in FIG. 46. In an embodiment, a half-bridge module 4600 can comprise several conductor bodies 4908, including terminals 4906, substrates 4914, and leads 4916.

Figures 47A, 47B, 47C, 47D:
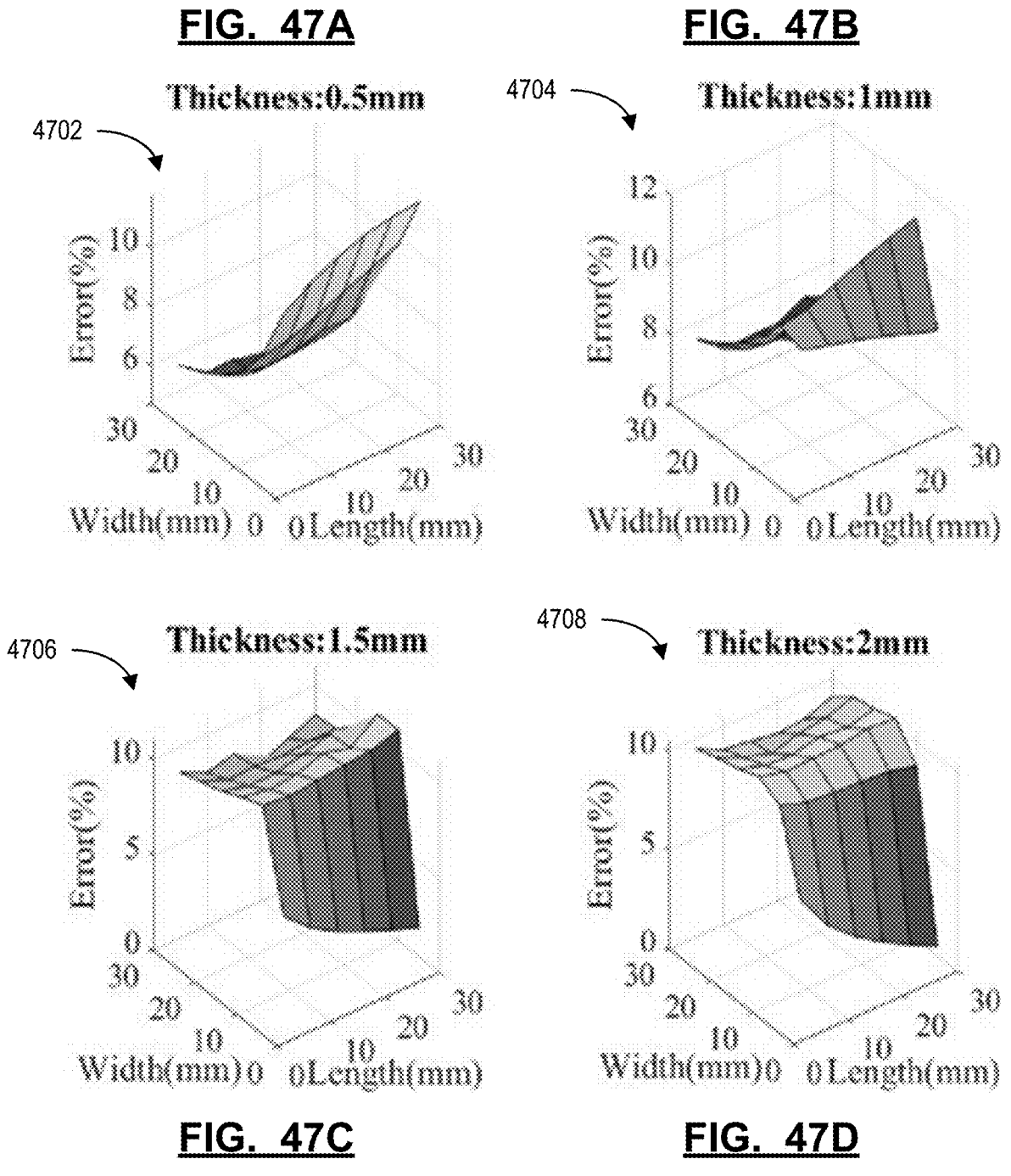
FIG. 47A-D provides graphs showing parametric evaluation on error of the partial inductance model on rectangular conductors with various dimensions.

Numerical simulations in ANSYS can be performed to evaluate the accuracy of the analytical model. Single rectangular conductors with various l, w, and t are simulated using both Q3D and the analytical model. A frequency of 60 MHz was used in all simulations which refers to the common switching speed of SiC MOSFETs. Results of the parametric comparisons are shown in FIG. 47A-D, which provides parametric evaluation on error of the partial inductance model on rectangular conductors with various dimensions. FIG. 47A provides parametric evaluation on error of the partial inductance model on rectangular conductors with a thickness of 0.5 mm, which gives an error of less than 10%. FIG. 47B provides parametric evaluation on error of the partial inductance model on rectangular conductors with a thickness of 1 mm, which gives an error of less than 11%. FIG. 47C provides parametric evaluation on error of the partial inductance model on rectangular conductors with a thickness of 1.5 mm, which gives an error of less than 10%. FIG. 47D provides parametric evaluation on error of the partial inductance model on rectangular conductors with a thickness of 2 mm, which gives an error of less than 10%. From the results shown in FIGS. 47A-D, it can be estimated that the maximum error of the partial-inductance model is less than 11%.

To evaluate the model's accuracy when applied in half-bridge SSM power modules, numerical simulations were conducted on five example cases, as shown in Table 7.

TABLE 7

Dimension of cases for Stray Inductance Model Evaluation.

| Dimensions | Case A | Case B | Case C | Case D | Case E |
|---|---|---|---|---|---|
| A1 (mm) | 10 | 15 | 15 | 20 | 20 |
| A2 (mm) | 10 | 15 | 15 | 20 | 20 |
| B1 (mm) | 10 | 10 | 10 | 10 | 10 |
| B2 (mm) | 10 | 10 | 5 | 10 | 5 |

In this simulation, dsubstrate is 2 mm, dlead is 0.1 mm. D is 5 mm. C1 equals B1. C2 equals B2. These five cases can cover half-bridge SSM modules with different footprints and conditions of symmetry. Results from the analytical model and numerical simulations are compared in Table 8. It can be seen that the maximum error of simulated cases is 12.1%, which indicates that the proposed model has a good accuracy.

TABLE 8

Comparison between the analytical stray inductance model and numerical simulations, given in nanohenries:

| Results | Case A | Case B | Case C | Case D | Case E |
|---|---|---|---|---|---|
| Ls-FEA (nH) | 28.3 | 25.2 | 18.8 | 23.2 | 17.2 |
| Ls-Model (nH) | 26.2 | 24.9 | 16.6 | 24.2 | 15.8 |
| Error | 7.4% | 1.2% | 12.1% | 4.3% | 8.1% |

Optimization

A half-bridge module 3100 based on the SSM packaging scheme is proposed herein. Dimensional variables of the half-bridge module 3100 should be optimized to ensure that the module meets certain thermal and stray inductance expectations.

In this problem, there can be some constraints to consider: The Junction Temperature (Tj) of the plurality of dies should be lower than about 200° C., under 41 W power loss per die, 5000 W/m$^{2.°}$ C. convection cooling, and about 105° C. coolant temperature. Furthermore, the ΔTj between the plurality of dies should be less than 5° C. under the same thermal boundary conditions.

As such, it is preferable to minimize $L_s$ and minimize the volume ($V_e$) of the half-bridge module. In one embodiment, to simplify the problem into a single objective problem, the two constraints can be combined using artificially defined weight factors (po1 and po2). Furthermore, to scale those two, reference values based on a survey of similar power modules are used. Specifically, $L_{s-ref}$ equals 10 nH, Ve-ref equals 1.9×10$^{-5}$ m$^3$. Constraints and the cost function are shown in Equations (34) to (36) of FIG. 48. In this problem, F defines the cost function and is preferably minimized. po1 and po2 define the artificially-defined weight factors and in this embodiment, are set to be 0.3 and 0.7, respectively.

Any optimization algorithm can be used to solve the optimization problem. In one embodiment, the Partial Swarm Optimization (PSO) algorithm can be applied in seeking the global optimal of multi-variable problems, such as the thermal design of power electronics. In the PSO algorithm, a swarm of particles search for the optimal position in the defined search space. The update of particle velocity considers the particle's self-inertia, the influence from the historical best position of the particle, and the influence from the current global best position, as shown in Equation (37). In this equation, $v_i$(it) describes the velocity of the $i_{th}$ particle at the $i_{th}$ iteration; $X_{ibsest}$ (it) represents the historical best position of this particle; $x_{global}$(it) represents the global best position; we is the inertia weight factor; $c_1$ is the self-learning factor; $c_2$ is the global-learning factor; and the updated position is obtained in Equation (38) of FIG. 48. Selection of the parameters described in Equation 37 can be critical for ensuring stabilized results and a proper convergence. An example set of the selected parameters can be in Table 9. $v_{i-max}$ is the max allowed velocity of particles; $x_{max}$ and $x_{min}$ are the boundaries of the searching space; and N is the swarm population.

TABLE 9

Parameters for Partial Swarm Optimization:

| we | C1 | C2 | $v_{i-max}$ | N |
|---|---|---|---|---|
| 0.7298 | 1.4962 | 1.4962 | 0.02 X ($x_{max}$ − $x_{min}$) | 30 |

The analytical models can be combined with the PSO algorithm to form a design methodology. A half-bridge module with the SSM packaging scheme can be designed using this method.

Figure 49:
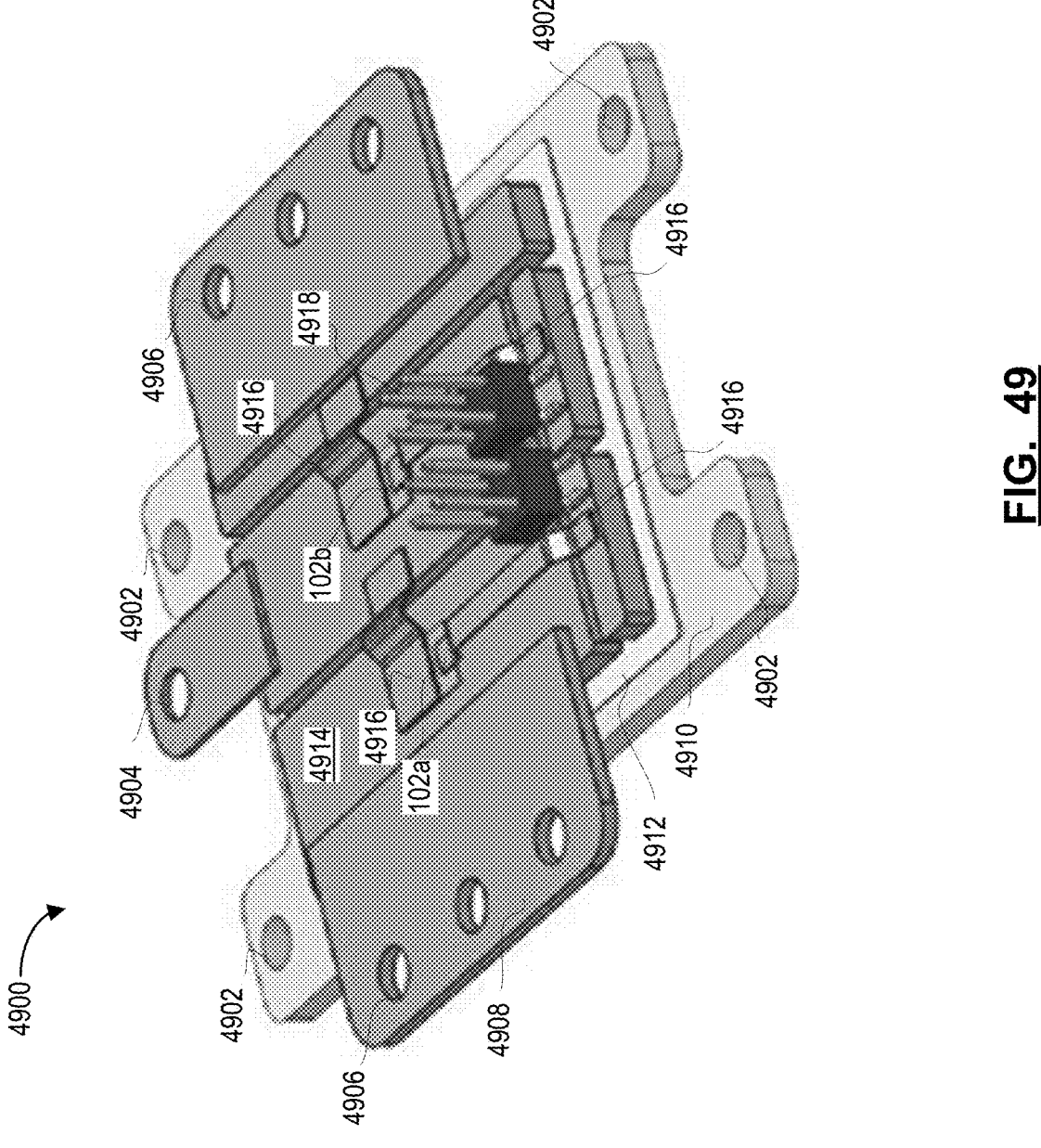
FIG. 49 is a schematic diagram of a half-bridge module.

FIG. 49 is a schematic diagram of an example of a half-bridge module. In one embodiment, the half bridge module 4900 can comprise: a substrate layer 4914; at least one DC positive terminal 4906, DC negative terminal 4908, leads 4916 and signal connectors 4918. The leads 4916 can be the same as leads 110 as shown and described in FIG. 1. In another embodiment, the half bridge module 4900 can include mounting holes 4902, an output terminal 4904, heatsink layer 4910, and resin insulator layer 4912. The substrate layer 4914, the heatsink layer 4910, and resin insulator layer 4912 can be the same as substrate layer 108, the heatsink layer 104, and resin insulator layer 106 as shown and described in FIG. 1 and FIG. 32. In one embodiment, a half-bridge module 4900 comprises at least one MOSFET die 102. In another embodiment, the half-bridge module can comprise at least two MOSFET dies 102a and 102b in the module, forming the half-bridge circuit. The MOSFET dies 102 may be of any type, for example SiC dies. The MOSFET dies may be bonded to the substrate 4914 by means of silver sintering bonding layers beneath each die 102, however, it should be noted that the silver sintering layer is too thin to be seen in this figure. The overall layout of the half bridge module 3100 is shown in FIGS. 31 and 32. In this embodiment, the layout is shown as symmetric for simplification, where A1=A2, B1=C1, and B2=C2. In addition, several dimensions are fixed due to fabrication considerations. However, it can be appreciated that the values of A1, B1, C1, A2, B2, C2 and D can be determined based on the requirements of a given half-bridge module design. It was determined that A1 and A2 can range between about 15 mm to about 20 mm; B1 and C1 can range between about 7 mm to about 10 mm; B2 and C2 can range between about 5 mm to about 10 mm; and $d_{substrate}$ can range between about 0.2 mm to about 2 mm.

In one embodiment, D can be any size, for example between 1 mm to 10 mm. In the simulation D was used as 5 mm. $d_{lead}$ represents the thickness of the lead layer 110, and can be between 0.05 mm to 0.5 mm. $d_{resin}$ represents the thickness of the resin layer 106, and can be between 0.05 mm to 0.5 mm. $d_{heatsink}$ represents the thickness of the heatsink layer 104, and can be between 1 mm to 5 mm. In the simulation dead was used as 0.1 mm, $d_{resin}$ was 0.2 mm, and $d_{heatsink}$ was 2 mm; the length of DC terminals were 15 mm. The width of the DC terminals can equal the width of the contacted substrate with a margin of 2 mm from both sides, which can be represented as (A1+A2–4) mm. These variables can be optimized using the PSO algorithm introduced above.

The results of the analytical model outputs a Tj of around 183° C., for both dies and a $L_s$ of 17.3 nH for the optimized design. It is worth noting that off-the-shelf devices could have a lower inductance due to die paralleling.

Figure 50:
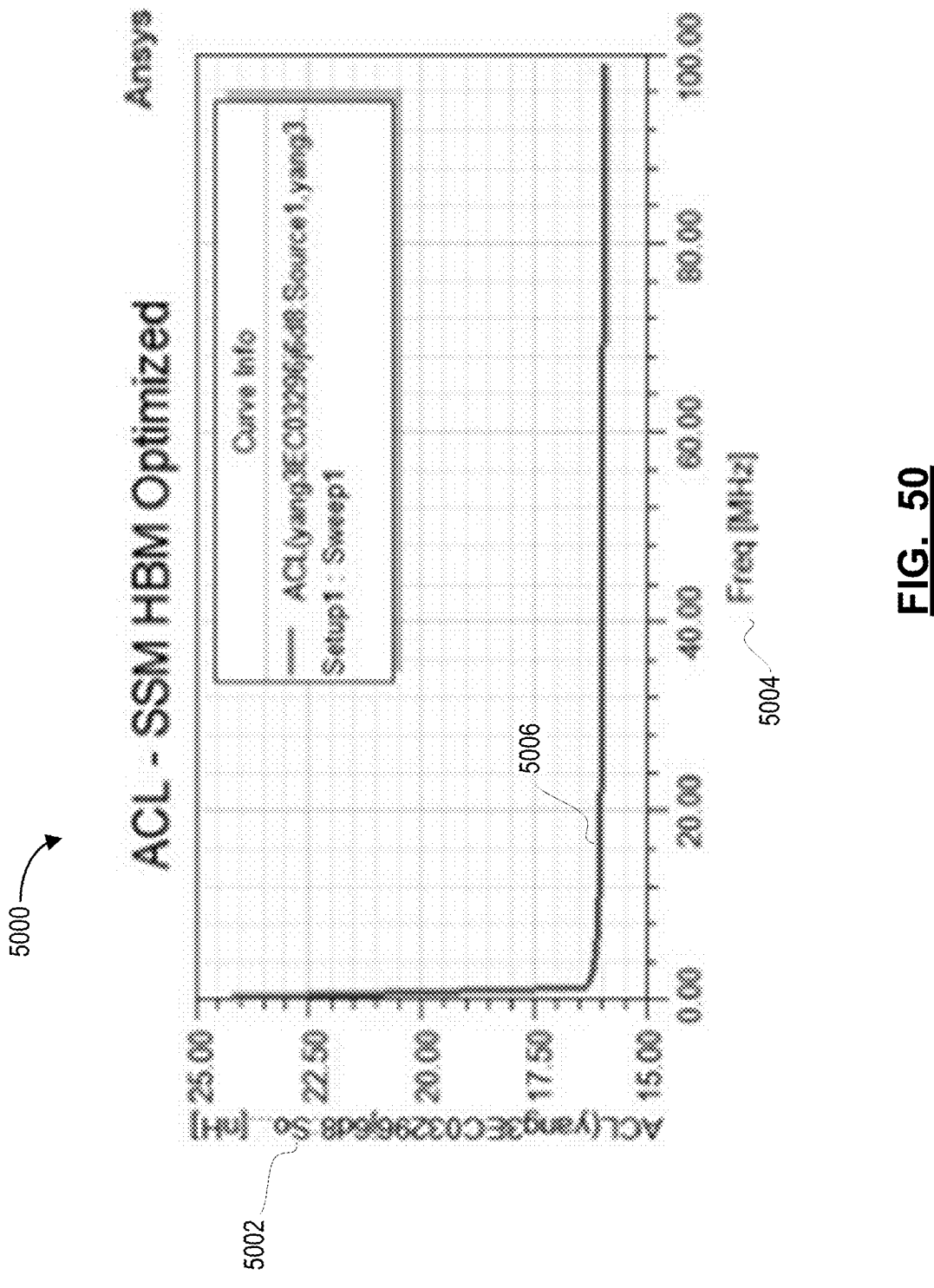
FIG. 50 is a graph showing the Ls values of an optimized half-bridge module.

Numerical simulations can be conducted to evaluate performances of the optimized module. In the stray inductance simulation using ANSYS Q3D, the designed module results in a $L_s$ of 16.0 nH at 60 MHz, as shown in FIG. 50. FIG. 50 provides a graph 5000 showing the $L_s$ values 5002 of an optimized half-bridge module. The inductance value can decrease with the frequency 5004 due to the skin effect. However, it is stabilized after reaching the mega-hertz range.

Figures 51A, 51B:
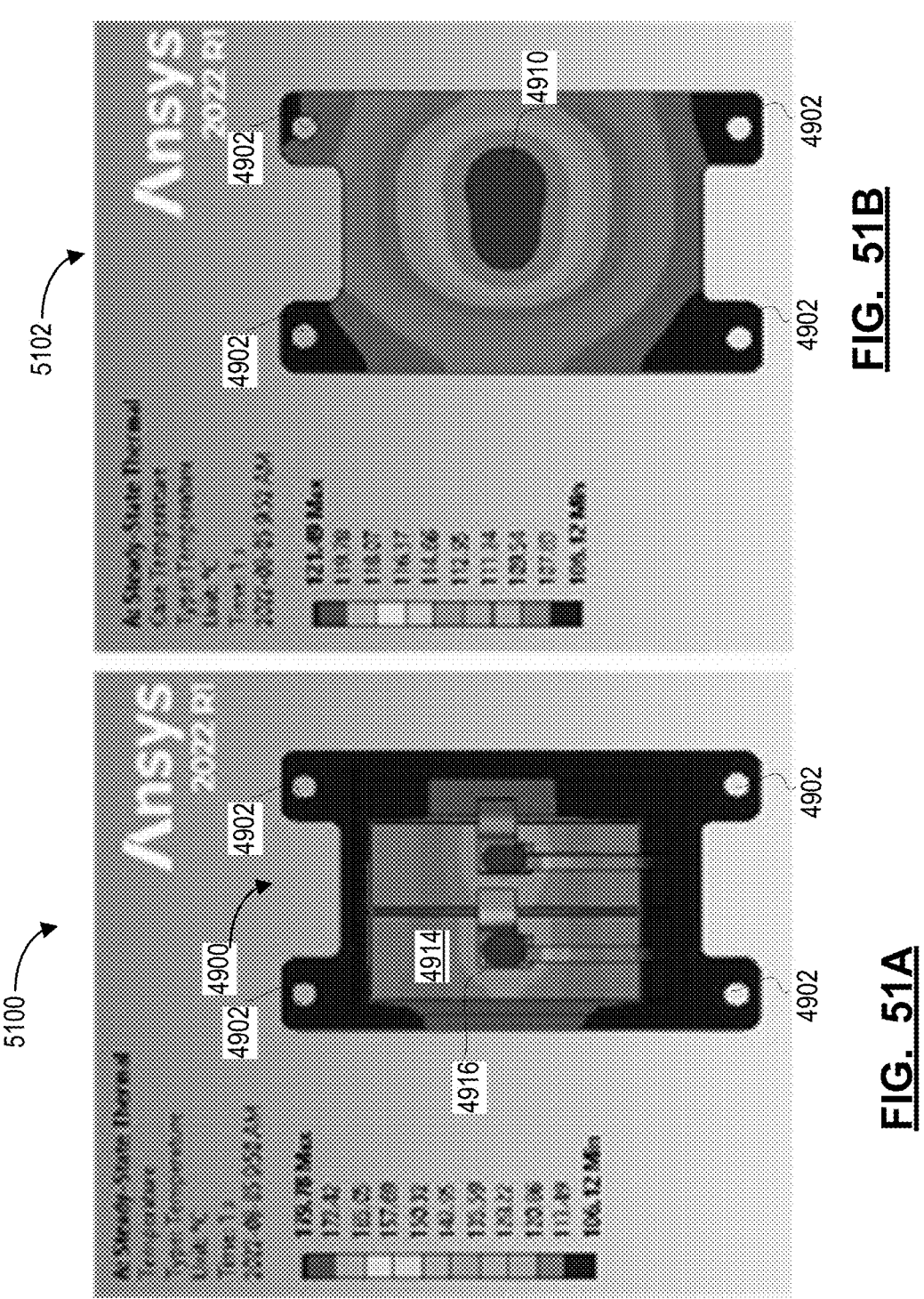
FIG. 51A provides a steady-state temperature profile of the half-bridge module.
FIG. 51B provides a steady-state temperature profile of the heatsink.

The steady-state temperature profile obtained in ANSYS Mechanical is shown in FIGS. 51A and B. FIG. 51A provides a steady-state temperature profile of a half-bridge module 4900. In one embodiment, a half bridge module 4900 is shown, comprising a substrate layer 4914; leads 4916, and mounting holes 4902. The leads 4916 and dies hold a majority of the heat, as can be seen in FIG. 51A. The heat can dissipate radially outwards, towards the mounting holes 4902. FIG. 51B provides a steady-state temperature profile of a heatsink layer 4910. The mounting holes 4902 may be provided on the heatsink layer 4910 The heat is at a maximum near the center of the heatsink, or directly under the dies and can dissipate radially outwards, towards the mounting holes 4902 The influence of terminals and leads on heat transfer is considered negligible since they are not in the main heat transfer path. The definition of Tj remains the same in these simulations, which is the temperature at the center of dies' top surface.

Figure 52:
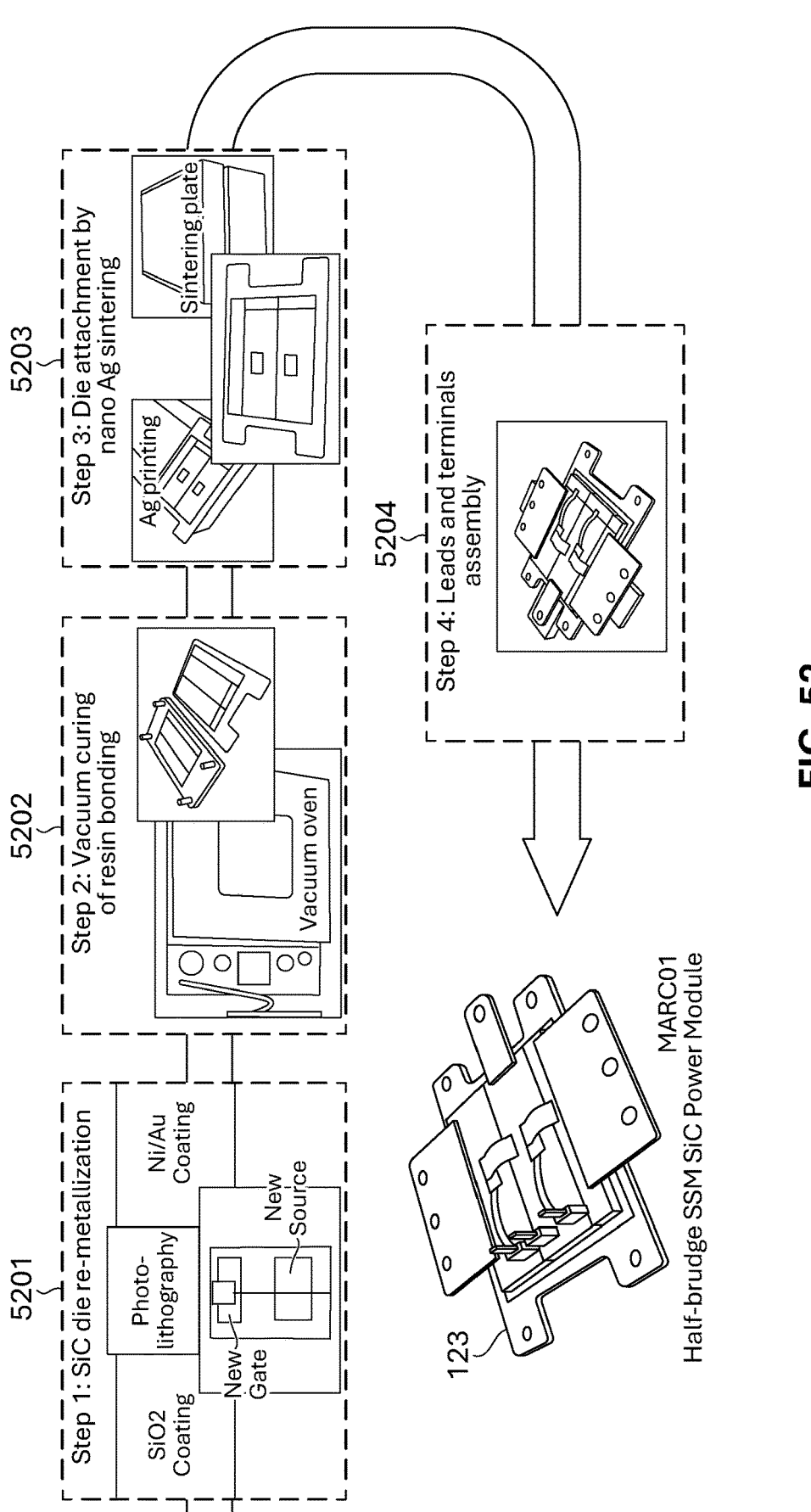
FIG. 52 provides a fabrication process of the optimized prototype module.

FIG. 52 provides a fabrication process of the optimized prototype module. In step 1, at 5201, SiC dies are remetalized to be compatible with double-side sintering. The original metallization of the gate and source pads on the top of the SiC die can be Aluminum (Al), which is designed for Al wire bonding. In the SSM packaging, top interconnections are Mo leads, which can be sintered on dies. Thus, top pads need to be coated with metal layers suitable for nano-silver sintering, where Ni (0.05 µm)/Au (0.1 µm) can be selected. Meanwhile, the insulation distance between the gate and source pads is preferably enlarged. First, a SiO2 layer is deposited uniformly on the top of the original dies. The thickness of the SiO2 layer can be about 0.25 µm. In one embodiment, the SiO2 layer can be deposited by suitable techniques such as CVD, or Plasma Enhanced Chemical Vapor Deposition (PECVD) to form a new insulation layer between gate and source. Then, small windows are opened on areas above the original gate and source pads. The windows may be fabricated by means of photolithography and chemical etching. Finally, new Ni/Au pads can be metalized on the windows. In one embodiment, the Ni/Au pads can be metalized on the windows by means of UHV Electron-Beam Evaporation. In one embodiment, there can be larger areas and a wider gap distance between gate and source.

In step 2, at 5202, substrate segments can be bonded to the heatsink through vacuum curing of the BT resin layer. Alignment jigs can be applied to ensure the accuracy of assembly. A sample curing profile is shown in FIG. 53A.

In step 3, at 5203, the dies 102 can be bonded to the substrate by nano-silver sintering. The paste can be applied by screen printing. In one embodiment, a pressureless sintering process is used, as shown in FIG. 53A. In step 4, at 5204, leads and terminals are assembled by sintering the lead terminals to the dies 102. In one embodiment, the Mo parts can be coated with Ni (0.8 µm)/Au (0.1 µm).

Figure 53A:
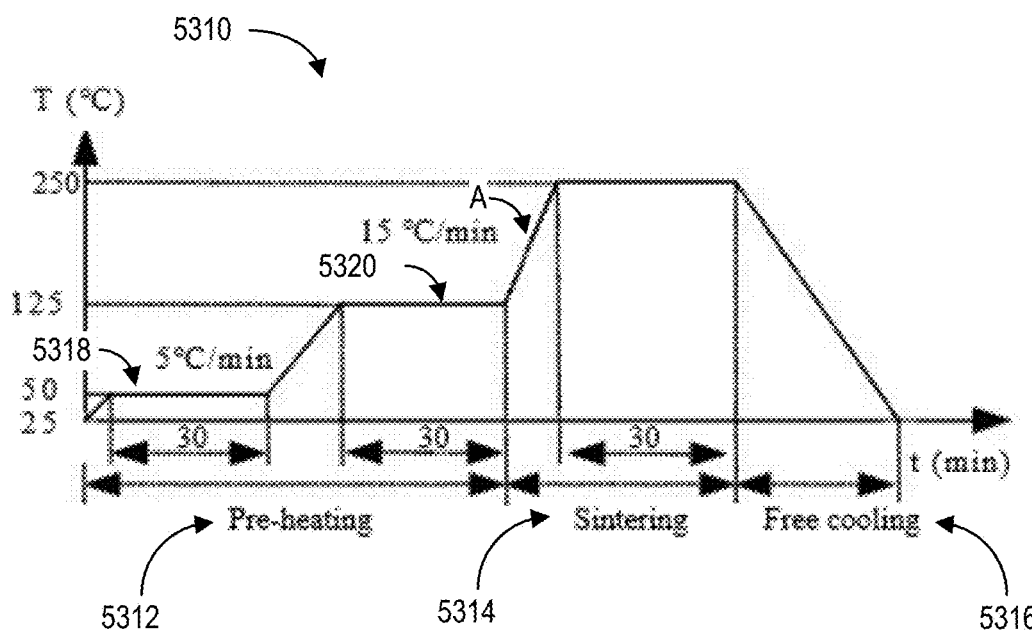
FIG. 53A provides a sample curing profile for the BT resin layer.

FIG. 53A shows a plot 5310 illustrating an example method for sintering nano silver paste onto a sample forming the disclosed packaging (also known as the sintering profile). The method described in plot 5310 can be iteratively applied for each new layer of nano silver paste applied to a sample.

As shown, at 5312, in the pre-heating stage, the nano silver paste is applied to a surface of a sample and the sample along with the applied paste is initially pre-heated to completely evaporate the organic constituents in the nano silver paste. In some example cases, the sample is pre-heated at 50° C. (5318), and then at 125° C. (5320).

At 5314, at the sintering stage, the temperature, which the sample is subject to, is quickly increased to perform sintering and achieve densification. For example, the temperature can be increased to 250° C., and over a time span of approximately 7.5 minutes (time period "A"). In other cases, the temperature is increased in a range of 250° C.-280° C., and over a time span of 7-15 minutes. These values are empirically determined to result in the necessary sintering and densification.

Finally, at 5316, in the free cooling stage—the sample is free cooled to room temperature (e.g., 25° C.).

Figure 53B:
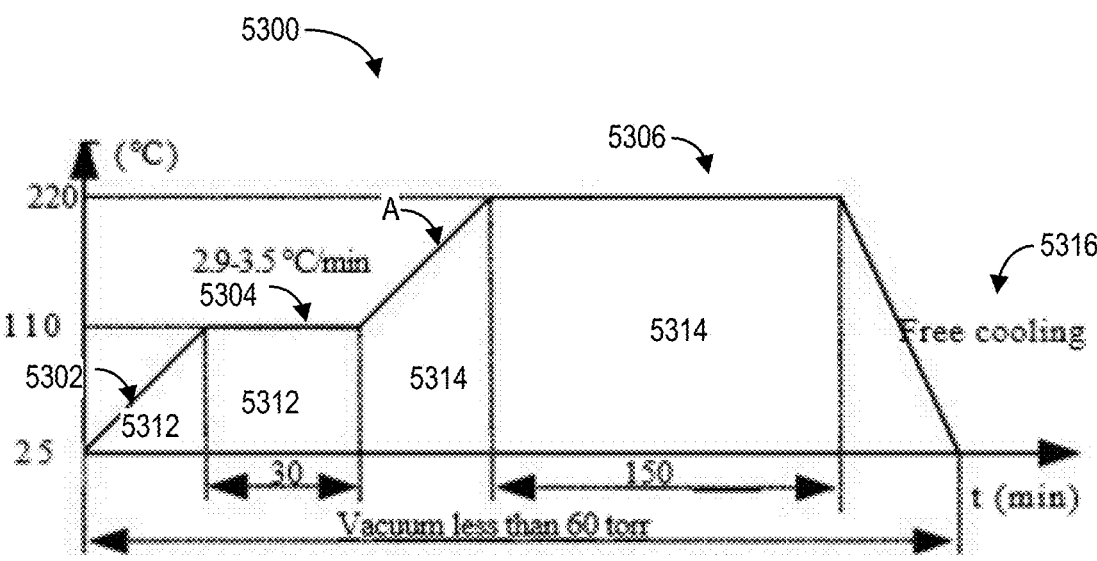
FIG. 53B provides a proposed temperature profile of the sintering process.

FIG. 53B shows a sintering profile 5300 for a pressured application. In some example cases, the applied pressure is in a range of 5-20 Mpa. In other cases, the applied pressure is approximately 10 Mpa. The pressure can be applied, for example, along the z-axis. The pre-heating stage 5312 is provided at 5302 to 5304. The sintering stage is provided at 5314. The temperature, which the sample is subject to, is quickly increased to perform sintering and achieve densification. For example, the temperature can be increased to 220° C., and over a time span defined by "A". Finally, at 5316, in the free cooling stage—the sample is free cooled to room temperature (e.g., 25° C.).

Characterization

Figure 54:
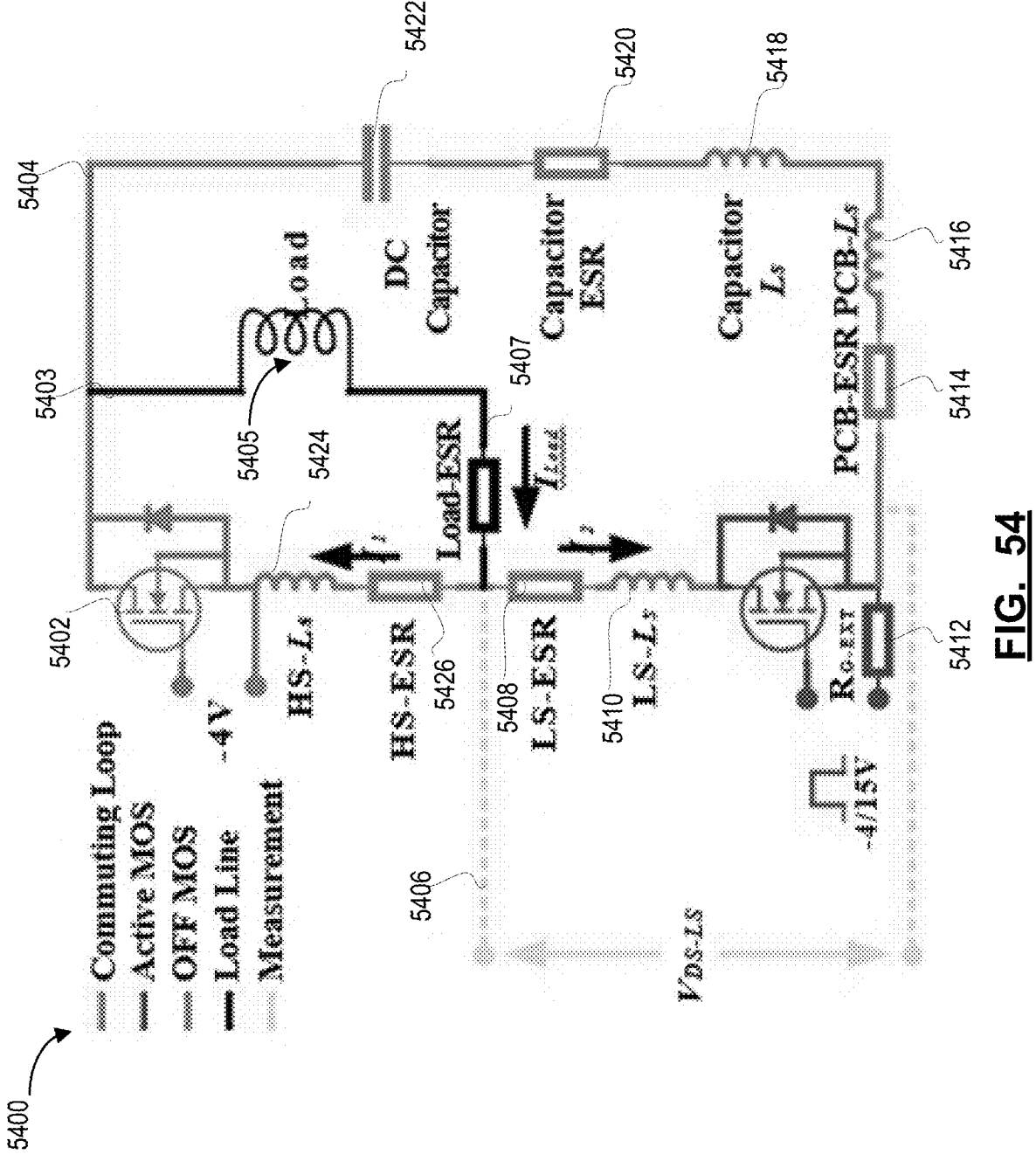
FIG. 54 is a schematic diagram of the double pulse test with the low side MOSFET switching.

The double pulse test can be used to characterize the switching behavior of a device, which can reflect the loop parasitic parameters, including $L_s$. The schematic of the double pulse test with the low side MOSFET switching is shown in FIG. 54. The circuit diagram 5400 provides a commuting loop 5404, a measurement line 5406, and a load line 5403. The commuting loop comprises a high-side MOSFET, 5402; and a low-side MOSFET 5412. The high-side MOSFET may further comprise a high-side series inductance 5424 and a high-side ESR (equivalent series resistance) 5426. The low-side MOSFET may further comprise a low-side series inductance 5410 and a low-side ESR (equivalent series resistance) 5408. The commuting loop can further comprises a DC capacitor 5433 having a capacitor ESR (equivalent series resistance) 5420 and a capacitor series inductance 5418. The commuting loop may further comprise a PCB having components of a PCB ESR 5414 and a PCB series inductance 5416. In this circuit, the high side MOSFET 5402 is kept off. When the low side MOSFET 5412 switches off, I2 decreases, and I1 increases to maintain ILoad. Therefore, a commuting loop is formed. VDS-LS can be measured by the measurement line 5406. The load line 5403 can further comprise a load 5405 and a load ESR 5407. It is worth mentioning that the measured voltage can include the back-EMF of the LS-Ls.

A validation method can be applied to evaluate the accuracy of the proposed inductance model. The turn-off transient of MOSFETs can indicate the stray inductance of the switching loop. Therefore, turn-off waveforms can be measured during the double pulse test. The double pulse test circuit is also simulated in the PSIM software. In these simulations, capacitor's ESR and ESL can be obtained by the capacitor datasheet. In this embodiment, the ESR is 0.85 mOhm and ESL is 2.5 nH. The PCB-Ls can be obtained in ANSYS Q3D simulations, which is 7.15 nH. HS-Ls and LS-Ls equal to half of the total Ls of the power modules which are calculated using the proposed analytical model. Meanwhile, the mutual-inductance (also obtained in Q3D) between conductors can be considered and subtracted from the self-inductance. Assuming inductance values obtained from Q3D simulations and the datasheet are trust-worthy, then the accuracy of the power module's inductance can be evaluated by comparing waveforms form both PSIM simulations and experiments, which could then prove the accuracy of the analytical inductance model.

Figure 55:
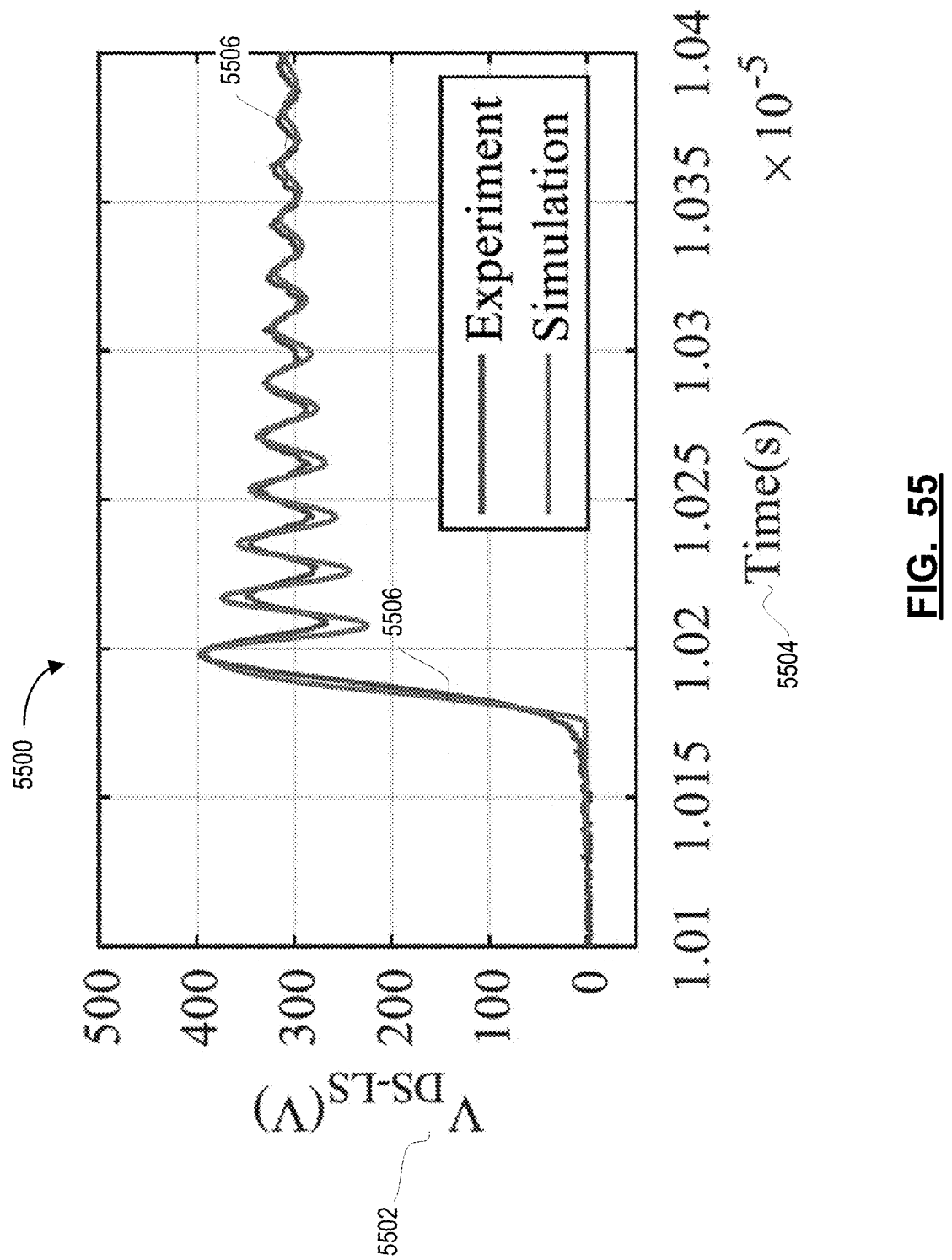
FIG. 55 provides the results of the double pulse test.

The experiment and simulation are conducted at a DC voltage of 300V and a ILoad of 60A. FIG. 55 provides the double pulse test result 5500: waveforms (5506 and 5507) of VDS-LS 5502 during low side turning-off at 300V/60 A. Time is provided on the X axis 5504. The oscillation frequency ($f_o$) is determined by the output capacitance of the low side MOSFET ($C_{oss}$) and the total stray inductance of the commuting loop (Ls-loop), as explained in Equation (39) of FIG. 56, which is commonly used to verify the estimation of Ls-loop. The $C_{oss}$ of the MOSFET can be obtained according to the datasheet, and is 383 pF at 300V in this example.

The results obtained, as shown in FIG. 55 confirm that the Q3D simulation matches with the experiment well. In previous sections, the analytical $L_s$ model has been proven as accurate compared with the Q3D simulation. Thus, it is credible to conclude that the analytical $L_s$ model is highly accurate.

Thermal Impedance Characterization may also be conducted. In one embodiment, junction-to-case thermal resistance ($R_{th(j-c)}$) can be an important parameter to evaluate the heat transfer performance of power modules, which is calculated using Equation (40) in FIG. 56. In the SSM packaging, the case temperature (Tb) refers to the temperature at the point that is located directly below the center of the die at the bottom surface of the heatsink. A SIEMENS Power T3ster (PWT-1500A) can be used to characterize the $R_{th(j-c)}$ of the prototype module, which can also validate the accuracy of the analytical thermal model. The characterization method can be conducted by structural function analysis. Since directly measuring the Tj may be difficult and may not be accurate, the structural function analysis method uses thermal sensitive parameters (TSP) to correlate the virtual Tj. The voltage drop across the body-diode (VD) during reverse conduction can be selected as the TSP. Its relationship with Tj is obtained by thermal-static calibrations, as shown in Equation (41) of FIG. 56.

The power module can be characterized under two conditions: 1) The module is mounted on the cold-plate without a thermal pad (TIM). 2) The module is mounted on the cold-plate with a thermal pad.

Figure 57:
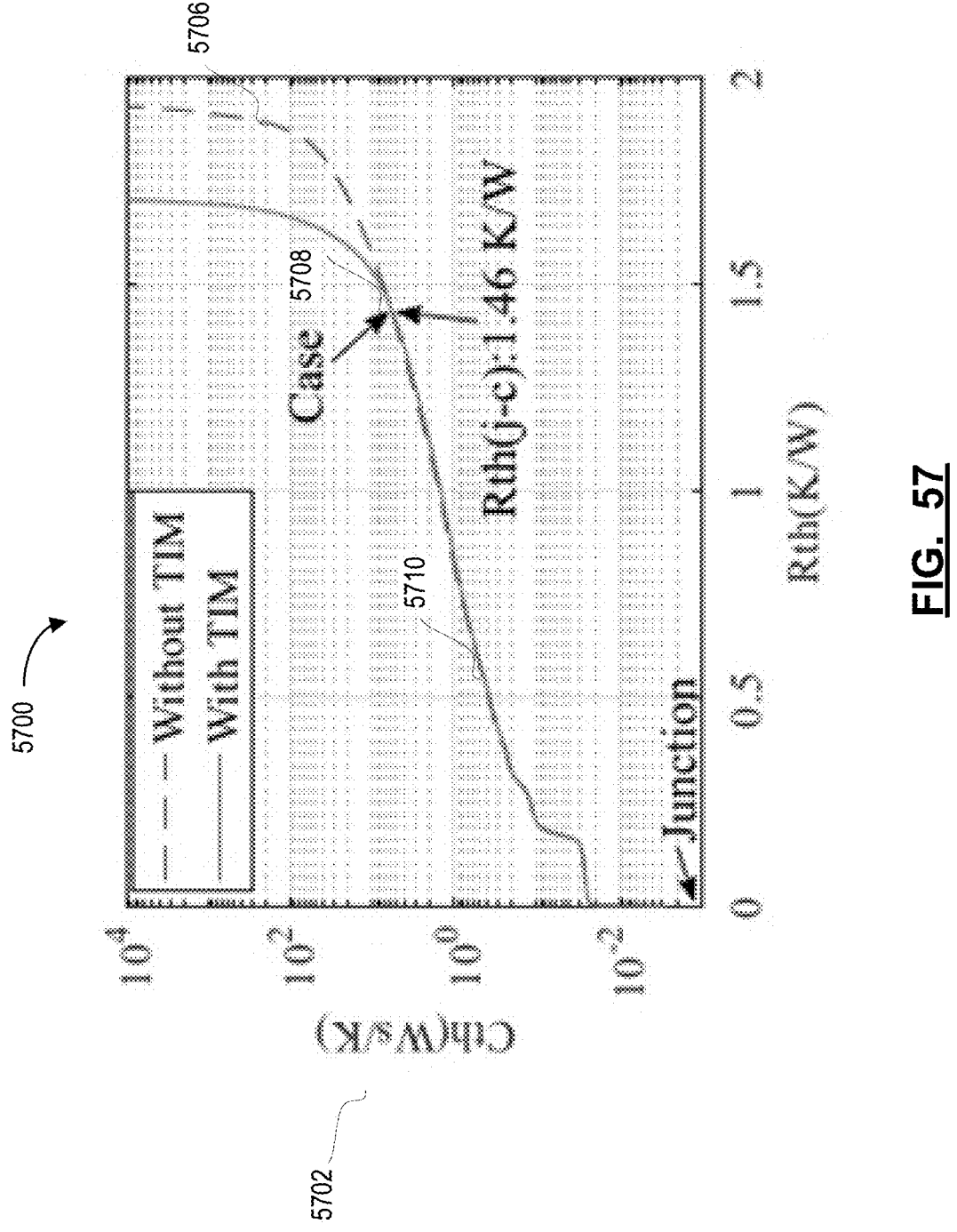
FIG. 57 is a graph showing the accumulation of thermal impedance from the die junction to the external environment.

Two structural function curves 5706 and 5710 are combined in FIG. 57, shown in graph 5700, which describes the accumulation of thermal impedance 5702 from the die junction to the external environment. The intersection point 5708 refers to the impedance values between the junction to case, in which $R_{th(j-c)}$=1.46 K/W. It is worth noting that off-the-shelf devices could have a lower $R_{th(j-c)}$ due to die paralleling.

While the above description provides examples of one or more processes or apparatuses or compositions, it will be appreciated that other processes or apparatuses or compositions may be within the scope of the accompanying claims.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

The invention claimed is:

1. A packaging module comprising:
   a substrate;
   a MOSFET die comprising a first side and a second side, wherein the first side is bonded to the substrate using nano silver sintering; and
   at least two leads connected, at a respective first end, to the substrate and, at a respective second end, to the second side of the MOSFET die, wherein nano silver sintering is used to bond the first and second ends of the at least two leads, and
   wherein each of the substrate and the at least two leads is formed of pure molybdenum.

2. The packaging module of claim 1, wherein the MOSFET die comprises a silicon carbide (SiC) die.

3. The packaging module of claim 1, further comprising a heat sink stacked below the substrate, and the heat sink is also formed of pure molybdenum.

4. The packaging module of claim 3, further comprising an insulator layer stacked between the heat sink and the substrate.

5. The packaging module of claim 4, wherein the insulator layer is formed of bismaleimide triazine resin.

6. The packaging of claim 1, wherein the substrate includes a first substrate side and a second substrate side, and the first substrate side is coated with ruthenium (Ru)/ silver (Ag).

\* \* \* \* \*